United States Patent [19]
Urano et al.

[11] Patent Number: 5,976,759
[45] Date of Patent: Nov. 2, 1999

[54] POLYMER COMPOSITION AND RESIST MATERIAL

[75] Inventors: Fumiyoshi Urano, Niiza; Hirotoshi Fujie, Kawagoe; Keiji Oono, Sakado, all of Japan

[73] Assignee: Wako Pure Chemical Industries, Ltd., Osaka, Japan

[21] Appl. No.: 08/769,533

[22] Filed: Dec. 19, 1996

[30] Foreign Application Priority Data

| Dec. 21, 1995 | [JP] | Japan | 7-349768 |
| May 31, 1996 | [JP] | Japan | 8-160840 |
| May 28, 1996 | [JP] | Japan | 8-156233 |

[51] Int. Cl.$^6$ ................................... G03F 7/004
[52] U.S. Cl. ................ 430/270.1; 430/905; 430/910; 525/210; 525/216; 525/219; 525/221; 525/238
[58] Field of Search ................ 430/270.1, 905, 430/910; 525/210, 216, 219, 221, 238

[56] References Cited

U.S. PATENT DOCUMENTS

| 5,468,589 | 11/1995 | Urano et al. | 430/270.1 |
| 5,658,706 | 8/1997 | NIki et al. | 430/270.1 |
| 5,736,296 | 4/1998 | Sato et al. | 430/270.1 |

FOREIGN PATENT DOCUMENTS

| 0 520 642 | 12/1992 | European Pat. Off. . |
| 0 588 544 | 3/1994 | European Pat. Off. . |
| 0 675 410 | 10/1995 | European Pat. Off. . |
| 0 679 951 | 11/1995 | European Pat. Off. . |

*Primary Examiner*—John S. Chu
*Attorney, Agent, or Firm*—Armstrong, Westerman, Hattori, McLeland & Naughton

[57] ABSTRACT

A polymer composition comprising (i) a polymer (a) having a monomer unit containing a functional group A which becomes alkali-soluble by heating in the presence of an acid, (ii) a polymer (b) having a monomer unit containing a functional group B which also becomes alkali-soluble, but less easily than the functional group A, by heating in the presence of an acid, and if necessary in addition to (i) and (ii) or in place of (ii), (iii) a phenolic compound having a weight-average molecular weight of 300 to 15,000 gives together with an photoacid generator a resist material suitable for forming a pattern excellent in sensitivity, resolution, mask linearity and other properties.

31 Claims, 2 Drawing Sheets

POLYMER COMPOSITION AND RESIST MATERIAL

BACKGROUND OF THE INVENTION

The present invention relates to a resist material used in the manufacture of semiconductor devices and a polymer composition used for such a resist material. More particularly the invention pertains to a resist material used for forming a positive pattern by applying ultraviolet light, especially deep ultraviolet light with a wavelength not greater than 300 nm, KrF eximer laser beams or the like as exposure energy source, and a polymer composition used for such a resist material.

With a recent trend toward higher-density integration of semiconductor devices, necessity has been intensified for shortening of the wavelength of the energy source of exposure means used for fine working, particularly in the art of photolithography, and now use of deep ultraviolet light (300 nm or less in wavelength), KrF excimer laser beams (248.4 nm) and the like is seriously considered. However, there not has yet been available a resist material applicable to practical use with such short-wavelength exposure light.

As a resist material usable for pattern formation with KrF excimer laser beams or deep ultraviolet light as light source, there have been known the dissolution-inhibiting type resist materials composed of a polymer having high transmittance of light near 248.4 nm and a photosensitive compound having a diazodiketo group (JP-A 1-80944; JP-A 1-154048; JP-A 1-155338; JP-A 1-155339; JP-A 1-188852; Y.Tani et al: Proc. SPIE, 1086, 22 (1989), etc.). These dissolution-inhibiting type resist materials, however, are low in sensitivity and unapplicable to use with deep ultraviolet light or KrF excimer laser beams wherein use of a high-sensitivity resist material is required. Also, as means for reducing the energy required for exposure (high-sensitization), the chemically amplified type resist materials making use of an acid generated on exposure as medium have been proposed (Ito et al: Polym. Eng. Sci., 23, 1012 (1983)), and many reports have been published on this type of resist materials (U.S. Pat. No. 4,491,628 (1985) to H. Ito el al (=JP-A 2-27660); U.S. Pat. No. 4,603,101 (1986) to J. C. Crivello et al (=JP-A 62-115440) W. R. Brunsvolt et al: Proc. SPIE, 1086, 357 (1989); T. X. Neenan et al: Proc. SPIE, 1086, 2 (1989); R. G. Tarascon et al: SPE Regional Conference Technical Papers, Ellenville, N.Y., 1988, p. 11; JP-A 2-25850; Y. Jian et al: Polym. Mater. Sci. & Eng., 66, 41 (1992), etc.). These conventional chemically amplified type resist materials, however, had disadvantages in that they were liable to cause peeling of the film during development due to poor adhesion to the substrate especially when the polymer used for the resist material is a phenol ether type polymer such as poly(p-tert-butoxycarbonyloxystyrene), poly(p-tert-butoxystyrene), poly(p-tert-butoxy-carbonyloxy-α-methylstyrene), poly(p-tert-butoxy-α-methylstyrene), poly(p-tert-butylisopropenylphenoxyacetate), poly(p-tert-butoxycarbonyloxystyrene/sulfone), poly(p-tetrahydropyranyloxystyrene), poly{p-(1-methoxyethoxy)styrene}, poly{p-(1-phenoxyethoxy)styrene} or the like. They were also poor in heat resistance, and thus were unable to form a good pattern. Other problems of these resist materials included poor resolution due to poor light transmittance near 248.4 nm owing to the presence of benzoyl groups in the case of carboxylic acid-ester type polymers such as poly(p-tert-butylvinylbenzoate) and poly(p-tetrahydropyranylvinylbenzoate) and poor heat resistance and poor dry etch resistance in the case of polymers such as poly(tert-butyl methacrylate).

The resist materials comprising silicon-containing polymers have also been disclosed (JP-B-3-44290, etc.), but they involve difficulties in realizing their practical use because of problems such as low sensitivity and incapability of perfect removal by ashing due to inclusion of silicon in case of using, for instance, poly(p-trimethylsilyloxystyrene) or poly (p-tert-butyldimethylsilyloxystyrene).

Lately, as the chemically amplified type resist materials improved in these defects, there have been disclosed the resist materials using poly(p-tert-butoxycarbonyloxystyrene/p-hydroxystyrene) (JP-A 2-209977 and JP-A 3-206458), the resist materials using poly(p-tetrahydropyranyloxystyrene/p-hydroxystyrene) (JP-A 2-19847, JP-A 2-161436 and JP-A 3-83063), and the resist materials using poly(p-tert-butoxystyrene/p-hydroxystyrene) [JP-A 2-62544 and JP-A 4-211258 (U.S. Pat. No. 5,350,660)]. The resist materials comprising these polymers, however, are incapable of offering a high resolution which is strongly required in this art in recent years, and also have their own problems in delay time (a problem of variation of pattern size with the lapse of time during the period from application of the resist to exposure to light, or from exposure to light to heat treatment (PEB), deterioration of pattern shape) which comes into question in practical use and a problem of substrate dependency (the problem that the pattern is formed or not formed depending on the kind of the material used as semiconductor substrate such as $SiO_2$, $Si_3N_4$, $Ti_3N_4$, BPSG, polysilicon or the like).

Resist materials comprising a polymer (such as poly(p-1-methoxyethoxystyrene/p-hydroxystyrene) into which an acetal group or a ketal group has been introduced as protective group) and a photoacid generator such as a triphenylsulfonium salt derivative or a diphenyliodonium salt (JP-A 2-161436, JP-A 4-219757, JP-A 5-281745, JP-A 3-282550, etc.) have also been disclosed. These resist materials, however, involve the problem of scum (a problem caused by generated scum which may be transferred to the substrate during etching) and/or the problems of substrate dependency and delay time. JP-A 5-249682 discloses a resist material comprising a combination of a polymer such as poly(p-1-ethoxyethoxystyrene/p-hydroxystyrene), poly(p-1-methoxy-1-methylethoxystyrene/p-hydroxystyrene), poly (p-1-ethoxyethoxystyrene/p-hydroxystyrene/methyl methacrylate) or poly(p-1-ethoxyethoxystyrene/p-hydroxystyrene/fumaronitrile) and a photoacid generator such as a diazodisulfone compound. These materials have many excellent qualities such as high resolution and minimized delay time, but they still have the problems of substrate dependency and generation of scums. JP-A 6-194842 discloses a resist material comprising a combination of a polymer such as poly(p-1-ethoxyethoxystyrene/p-hydroxystyrene/p-tert-butoxystyrene) and a photoacid generator such as a diazodisulfone compound. This material, although excellent in such matters as resolution, mask linearity, heat resistance and delay time, is not free of the problems of substrate dependency and scum. EP-A 679,951 reports a resist material characterized by mixed use of two different polymers: poly(p-1-ethoxyethoxystyrene/p-hydroxystyrene) and poly(p-tert-butoxycarbonyloxystyrene/p-hydroxystyrene). This resist material, however, still involves the problems relating to the resolution and the delay time.

As described above, the chemically amplified type resist materials are remarkably improved in sensitivity as compared with the conventional resist materials, but they still involve the problems such as poor heat resistance of the polymer used therefor, insufficient adhesiveness to the substrate, unsatisfactory transmittance of light with a wavelength of around 248.4 nm, unsatisfactory resolution, pattern size variation or deterioration of pattern shape with the lapse of time, low storage stability, insufficient focus margin, poor mask linearity, footing (broader bottom shape of the pattern), generation of scum and high substrate dependency, resulting in preventing these materials from practical use. Thus, the development of a practical high-sensitivity resist material free of the problems mentioned above has been keenly desired.

SUMMARY OF THE INVENTION

In view of the above circumstances, the present invention is designed to provide a practically usable resist material having high transmittance of ultraviolet light, particularly deep ultraviolet light having a wavelength of 300 nm or less, KrF excimer laser beams and such, also having high sensitivity to exposure by such light sources or electron beams or soft X-ray irradiation, excellent in heat resistance and adhesion to the substrate, having high resolution, capable of forming a pattern with high precision without causing pattern size variation with the lapse of time, excellent in storage stability, having a wide focus margin, good mask linearity and no substrate dependency, and also capable of producing a rectangular pattern form without causing broader bottom shape of the pattern or generation of scum, and a polymer composition used for such a resist material.

The present invention provides a polymer composition comprising:

(i) a polymer (a) containing as its structural constituent a monomer unit having a functional group (hereinafter referred to as functional group A) which becomes alkali-soluble by heating in the presence of an acid; and (ii) a polymer (b) containing as its structural constituent a monomer unit having a functional group (hereinafter referred to as functional group B) which becomes alkali-soluble, but less easily than the functional group A, by heating in the presence of an acid.

The present invention also provides a polymer composition comprising:

(i) a polymer (a) containing as its structural constituent a monomer unit having a functional group A which becomes alkali-soluble by heating in the presence of an acid;

(ii) a polymer (b) containing as its structural constituent a monomer unit having a functional group B which becomes alkali-soluble, but less easily than the functional group A, by heating in the presence of an acid; and (iii) a phenolic compound having a weight-average molecular weight in the range from 300 to 15,000.

The present invention further provides a polymer composition comprising a polymer (a) mentioned in (i) above, and a phenolic compound having a weight-average molecular weight of from 300 to 15,000 mentioned in (iii) above.

The present invention also provides a resist material comprising said polymer composition and a photoacid generator.

The present invention still further provides a pattern forming process which comprises applying said resist material on a semiconductor substrate, heating the resist material on the substrate, exposing it to actinic radiation through a mask, and if necessary with heating, and conducting development.

DESCRIPTION OF THE PREFERRED EMBODIMENTS

Figure 1A:
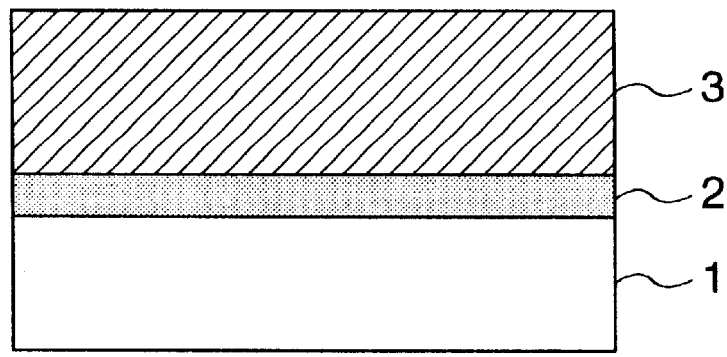
FIGS. 1A to 1C are sectional illustrations of the steps in the process of forming a positive pattern using a resist material according to the present invention.

Exemplary embodiments of the present invention are set forth below.

(1) A polymer composition comprising (i) a polymer (a) containing as its structural constituent a monomer unit having a functional group A which becomes alkali-soluble by heating in the presence of an acid; and (ii) a polymer (b) containing as its structural constituent a monomer unit having a functional group B which becomes alkali-soluble, but less easily than the functional group A, by heating in the presence of an acid.

(2) A polymer composition set out in (1), wherein each of the polymer (a) and the polymer (b) contains as its structural constituent another monomer unit which can provide the polymer with heat resistance and adhesiveness to the substrate.

(3) A polymer composition set out in (2), wherein at least one of the polymer (a) and the polymer (b) contains as its structural constituent a third monomer unit.

(4) A polymer composition set out in any of (1) to (3), which further comprises (iii) a phenolic compound having a weight-average molecular weight from 300 to 15,000.

(5) A polymer composition set out in any of (1) to (4), which further comprises a substance which generates an acid on exposure to actinic radiation.

(6) A polymer composition set out in (5), which further comprises an ultraviolet absorber (or absorbent).

(7) A polymer composition comprising (i) a polymer (a) and (iii) a phenolic compound having a weight-average molecular weight of 300 to 15,000.

(8) A polymer composition set out in (7), which further comprises a substance which generates an acid on exposure to actinic radiation.

(9) A polymer composition set out in (8), which further comprises an ultraviolet absorber.

(10) A resist material comprising a polymer composition set out in any of (5) to (9).

(11) A pattern forming process which comprises applying a resist material set out in (10) on a semi-conductor substrate, heating the resist material on the substrate, exposing it to actinic radiation through a mask, further heating if necessary, and conducting development.

In the present invention, the monomer unit having the functional group A in the polymer (a) includes those represented by the formula [4]:

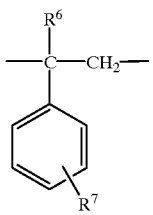

[4]

wherein R is a hydrogen atom or a lower alkyl group; $R^2$ and $R^3$ are independently a hydrogen atom, an alkyl group which may be substituted with one or more halogen atoms, or an allyl group, or $R^2$ and $R^3$ can form an alkylene ring together with the interposing carbon atom, provided that $R^2$ and $R^3$ can not be hydrogen atoms at the same time; $R^4$ is an alkyl or aralkyl group which may be substituted with one or more halogen atoms or an aralkyl group.

The monomer unit having the functional group B in the polymer (b) includes those represented by the formula [7]:

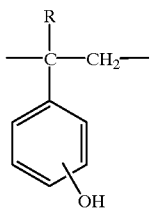

[7]

wherein $R^6$ is a hydrogen atom or a lower alkyl group; and $R^7$ is a hydrogen atom, a lower alkyl group, a lower alkoxyl group, an acyloxy group, a saturated heterocyclic oxy group or $R^8O$—CO—$(CH_2)_z$—O—; $R^8$ is an alkyl group and z is 0 or an integer of 1 or more.

In the present invention, the monomer unit that helps provide the polymer with heat resistance and adhesiveness to the substrate includes those represented by the formula [5]:

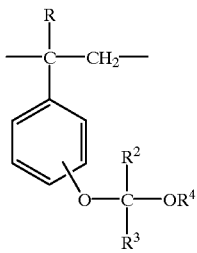

[5]

wherein R is a hydrogen atom or a lower alkyl group.

Polymer (a) in the present invention includes the polymers represented by the formula [1]:

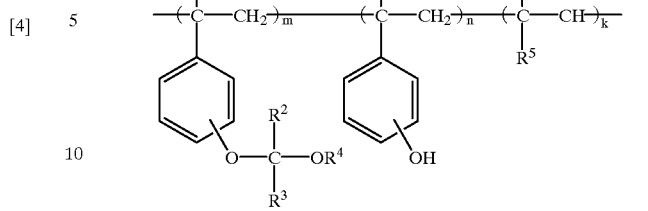

[1]

wherein R, $R^2$, $R^3$ and $R^4$ are as defined above; $R^1$ is a hydrogen atom or a lower alkyl group; $R^5$ is a cyano group, a carboxyl group which may have been esterified or a phenyl group which may have one or more substituents; m and n are independently an integer of 1 or more; and k is 0 or an integer of 1 or more (but m>k).

Polymer (b) in the present invention includes the polymers represented by the formula [2]:

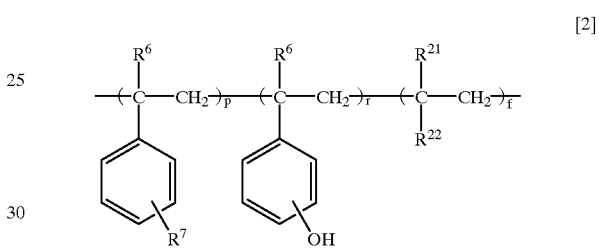

[2]

wherein $R^6$ and $R^7$ are as defined above; $R^{21}$ is a hydrogen atom or a lower alkyl group; $R^{22}$ is a cyano group, a carboxyl group which may be esterified or a phenyl group which may have one or more substituents; p and r are independently an integer of 1 or more; and f is 0 or a natural number (but p>f).

The lower alkyl group represented by R in the formulae [1], [4] and [5], the lower alkyl group represented by $R^1$ in the formula [1], the lower alkyl group represented by $R^6$ in the formulae [2] and [7] and the lower alkyl group represented by $R^{21}$ in the formula [2] include respectively a straight or branched alkyl group preferably having 1 to 6 carbon atoms, for example, methyl, ethyl, propyl, butyl, pentyl and hexyl.

The alkyl group optionally substituted with a halogen, represented by $R^2$, $R^3$ and $R^4$ in the formulae [1] and [4], may be straight, branched or cyclic alkyl group having preferably 1 to 10 carbon atoms, for example, methyl, ethyl, n-propyl, isopropyl, cyclopropyl, n-butyl, isobutyl, tert-butyl, sec-butyl, n-pentyl, isopentyl, tert-pentyl, 1-methylpentyl, cyclopentyl, n-hexyl, isohexyl, cyclohexyl, heptyl, octyl, nonyl and decyl.

The halogen atoms in the alkyl group which may be substituted with one or more halogen atoms and is represented by $R^2$, $R^3$ and $R^4$ include chlorine, bromine, fluorine and iodine atoms.

The aralkyl group represented by $R^4$ includes benzyl, phenetyl, phenylpropyl, methylbenzyl, methylphenetyl and ethylbenzyl.

The carboxyl group which may have been esterified, represented by $R^5$ in the formula [1], includes carboxyl and those of the carboxyl groups in which the hydrogen atom has been substituted with, for instance, an alkyl group having 1–6 carbon atoms, such as methoxycarbonyl, ethoxycarbonyl, propoxycarbonyl, butoxycarbonyl, pentyloxycarbonyl and hexyloxycarbonyl.

Examples of the substituent of the phenyl group which may have a substituent and is represented by $R^5$ include halogen atoms such as chlorine, bromine, fluorine and iodine atoms; straight, branched or cyclic alkyl groups having preferably 1–10 carbon atoms such as methyl, ethyl, n-propyl, isopropyl, cyclopropyl, n-butyl, isobutyl, tert-butyl, sec-butyl, n-pentyl, isopentyl, tert-pentyl, 1-methylpentyl, cyclopentyl, n-hexyl, isohexyl, cyclohexyl, heptyl, octyl, nonyl and decyl; straight or branched alkoxy groups having preferably 1–6 carbon atoms such as methoxy, ethoxy, n-propoxy, isopropoxy, n-butoxy, isobutoxy, tert-butoxy, sec-butoxy, n-pentyloxy, isopentyloxy, n-hexyloxy and isohexyloxy; straight, branched or cyclic acyl groups having 2–7 carbon atoms such as acetyl, propionyl, n-butyryl, isobutyryl, n-pentanoyl, pivaloyl, isovaleryl and cyclohexanecarbonyl; 5- to 6-membered saturated heterocyclicoxy groups such as tetrahydrofuranyloxy and tetrahydropyranyloxy; and the groups represented by $R^{25}O-CO-(CH_2)_jO-$ (wherein $R^{25}$ represents a lower alkyl group having 1–6 carbon atoms such as methyl, ethyl, propyl, butyl, pentyl and hexyl, which may be straight, branched or cyclic; and j is 0 or 1. Examples of the groups represented by $R^{25}O-CO-(CH_2)_jO-$ include methoxycarbonyloxy, ethoxycarbonyloxy, isopropoxycarbonyloxy, tert-butoxycarbonyloxy, isobutoxycarbonyloxy, tert-pentyloxycarbonyloxy, ethoxycarbonylmethoxy, tert-butoxycarbonylmethoxy, 1-methylcyclopentyloxycarbonylmethoxy and 1-methylcyclohexyloxycarbonylmethoxy.

The lower alkyl groups represented by $R^7$ in the formulae [2] and [7] are straight or branched alkyl groups having preferably 1–6 carbon atoms, such as isopropyl, isobutyl, tert-butyl, sec-butyl, isopentyl, tert-pentyl, 1-methylpentyl and isohexyl.

The lower alkoxy groups represented by $R^7$ are straight or branched alkoxy groups having preferably 1–6 carbon atoms, such as methoxy, ethoxy, n-propoxy, isopropoxy, n-butoxy, isobutoxy, tert-butoxy, sec-butoxy, n-pentyloxy, isopentyloxy, n-hexyloxy and isohexyloxy.

The acyloxy groups represented by $R^7$ are straight, branched or cyclic acyloxy groups having preferably 2–7 carbon atoms, such as acetyloxy, propionyloxy, n-butylyloxy, isobutylyloxy, n-pentanoyloxy, pivaroyloxy, isovaleryloxy and cyclohexanecarbonyloxy.

The saturated heterocyclic oxy groups represented by $R^7$ are preferably 5- to 6-membered ones which include, for example, tetrahydrofuranyloxy and tetrahydropyranyloxy.

$R^8$ in the formula $R^8O-CO-(CH_2)_z-O-$ represented by $R^7$ is straight, branched or cyclic alkyl groups having 1–10 carbon atoms, including methyl, ethyl, n-propyl, isopropyl, cyclopropyl, n-butyl, isobutyl, tert-butyl, sec-butyl, n-pentyl, isopentyl, 1-methylcyclohexyl, tert-pentyl, 1-methylpentyl, cyclopentyl, n-hexyl, isohexyl, cyclohexyl, heptyl, octyl, nonyl and decyl. Examples of the $R^8O-CO-(CH_2)_z-O-$ group are methoxycarbonyloxy, ethoxycarbonyloxy, isopropoxycarbonyloxy, isobutoxycarbonyloxy, tert-butoxycarbonyloxy, tert-pentyloxycarbonyloxy, 1-methylcyclohexyloxycarbonylmethyloxy, tert-butoxycarbonylmethyloxy and 1-methylcyclopentyloxycarbonylmethyloxy.

The carboxyl group which may be esterified, represented by $R^{22}$ in the formula [2], includes carboxyl and substituted carboxyl groups in which the hydrogen atom is substituted with a $C_{1-6}$ alkyl group, such as methoxycarbonyl, ethoxycarbonyl, propoxycarbonyl, butoxycarbonyl, pentyloxycarbonyl and hexyloxycarbonyl.

The substituent of the optionally substituted phenyl group, represented by $R^{22}$, includes halogen atoms such as chlorine, bromine, fluorine and iodine atoms; straight, branched or cyclic alkyl groups having preferably 1–10 carbon atoms, such as methyl, ethyl, n-propyl, isopropyl, cyclopropyl, n-butyl, isobutyl, tert-butyl, sec-butyl, n-pentyl, isopentyl, tert-pentyl, 1-methylpentyl, cyclopentyl, n-hexyl, isohexyl, cyclohexyl, heptyl, octyl, nonyl and decyl; straight or branched alkoxyl groups having preferably 1–6 carbon atoms such as methoxy, ethoxy, n-propoxy, isopropoxy, n-butoxy, isobutoxy,tert-butoxy, sec-butoxy, n-pentyloxy, isopentyloxy, n-hexyloxy, and isohexyloxy; linear, branched or cyclic acyl groups having 2–7 carbon atoms such as acetyl, propionyl, n-butyryl, isoburlyl, n-pentanoyl, pivaroyl, isovaleryl and cyclohexanecarbonyl; 5- to 6-membered saturated heterocyclicoxy groups such as tetrahydrofuranyloxy and tetrahydropyranyloxy; and the groups represented by $R^{25}O-CO-(CH_2)_jO-$ (wherein $R^{25}$ represents a lower alkyl group having 1–4 carbon atoms such as methyl, ethyl, propyl and butyl; and j is 0 or 1). Examples of the group represented by $R^{25}-CO-(CH_2)_jO-$ include methoxycarbonyloxy, ethoxycarbonyloxy, isopropoxycarbonyloxy, tert-butoxycarbonyloxy, isobutoxycarbonyloxy, tert-pentyloxycarbonyloxy, ethoxycarbonylmethoxy, tert-butoxycarbonylmethoxy, 1-methylcyclopentyloxycarbonylmethoxy and 1-methylcyclohexyloxycarbonylmethoxy.

The resist material of the present invention comprising the polymer composition of the present invention containing polymer (a) and polymer (b) according to the present invention is characterized by combined use of:

polymer (a) has repeating units, for example, represented by the formula [1]:

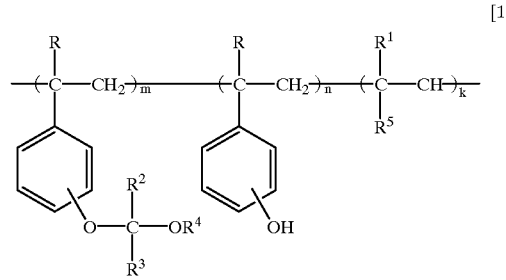

[1]

(wherein R, $R^1$, $R^2$, $R^3$, $R^4$, $R^5$, m, n and k are as defined above) which is composed of:

a monomer unit having the functional group A which can be easily eliminated with a little amount of an acid, for example, the one represented by the formula [3]:

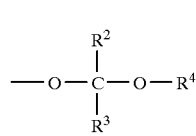

[3]

(wherein $R^2$, $R^3$ and $R^4$ are as defined above), that is, an alkoxyalkoxy group, a haloalkoxyalkoxy group, an aralkyloxyalkyloxy group, an alkoxy-1-allylalkoxy group, a haloalkoxy-1-allylalkoxy group, an aralkyloxy-1-allylalkoxy group, etc., namely a monomer unit represented by the formula [4]:

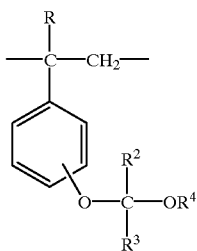

[4]

(wherein R, $R^2$, $R^3$ and $R^4$ are as defined above), a monomer unit which contributes to the improvement of adhesiveness to the substrate and heat resistance, for example, the one represented by the formula [5]:

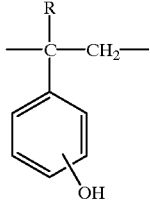

[5]

(wherein R is as defined above), and a monomer unit which is used optionally for the purpose of improving light transmittance of the portion to be exposed, controlling the developing speed of the exposed portion to better the side wall configuration or improving mask linearity, for example, the one represented by the formula [6]:

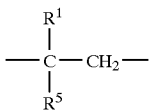

[6]

(wherein $R^1$ and $R^5$ are as defined above); and polymer (b) has repeating units, for example, represented by the formula [2]:

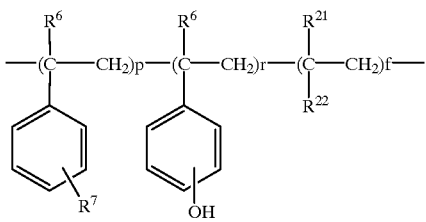

[2]

(wherein $R^6$, $R^7$, $R^{21}$, $R^{22}$, p, r and f are as defined above) which is composed of:

a monomer unit having an action to lower the rate of dissolution in the developer, for example, the one represented by the formula [7]:

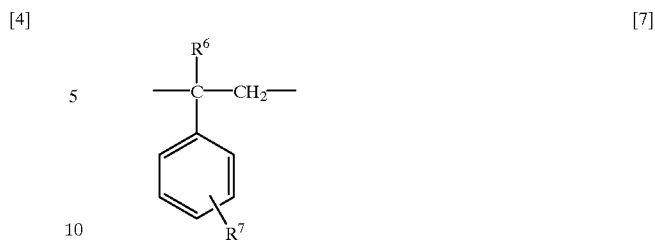

[7]

(wherein $R^6$ and $R^7$ are as defined above), a monomer unit which can improve substrate adhesion and heat resistance, for example, the one represented by the formula [8]:

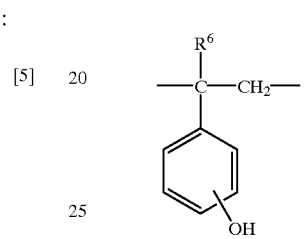

[8]

and a monomer unit which is added optionally for the purpose of controlling the rate of dissolution during development, for example, the one represented by the formula [9]:

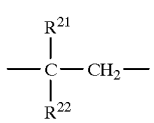

[9]

(wherein $R^{21}$ and $R^{22}$ are as defined above).

Also, the resist material of the present invention comprising the polymer composition of the present invention containing (i) said polymer (a), (ii) polymer (b) and if necessary (iii) a phenolic compound having a weight-average molecular weight of 300–15,000 is characterized in that a phenolic compound having a weight-average molecular weight of 300–15,000, which has a potency to control the rate of dissolution during development, is used in combination with a polymer of the formula [1] and a polymer of the formula [2]. The polymer (b) is preferably used in an amount of 10 to 90 parts by weight, more preferably 10 to 50 parts by weight, per 100 parts by weight of the polymer (a). In the three-component composition, the polymer (b) is preferably used in an amount of 10 to 65 parts by weight, more preferably 10 to 50 parts by weight, and the phenolic compound is used preferably in an amount of 1 to 30 parts by weight, more preferably 1 to 20 parts by weight, per 100 parts by weight of the polymer (a).

Further, the resist material comprising the polymer composition of the present invention containing (i) said polymer (a) and (iii) a phenolic compound having a weight-average molecular weight of 300–15,000 is characterized by combined use of a polymer such as represented by the formula [1] and a phenolic compound having a weight-average molecular weight of 300–15,000 which serves for controlling the developing speed. The phenolic compound is preferably used in an amount of 1 to 50 parts by weight, more preferably 1 to 30 parts by weight, per 100 parts by weight of the polymer (a).

When the polymer composition of the present invention is used as a basic component of the resist material, use of a polymer represented by the formula [1] is very advantageous for the improvement of resolution and maintenance of pattern size (cf. delay time) due to the fact that the functional group represented by the formula [3] is far easier to elimination by the action of an acid than the conventional functional groups such as tert-butoxycarbonyloxy group, tert-butoxy group, tetrahydropyranyloxy group and tert-butoxycarbonylmethoxy group.

The polymers of the formula [2] and the phenolic compounds having a weight-average molecular weight of 300–15,000 mentioned above are conducive to the improvement of focus margin, mask linearity and pattern side wall configuration, which is unachievable with the polymers of the formula [1], owing to their capability to control the rate of dissolution in the developer during development. They also contribute to the enhancement of heat resistance of the polymer composition. Combined use of at least one of the polymers of the formula [1], at least one of the polymers of the formula [2] and a phenolic compound having a weight-average molecular weight of 300–15,000 produces the effect of offsetting the defects of the respective polymers to enable attainment of the intended objects, that is, enhancement of resolution and substrate adhesion, maintenance of pattern size with the lapse of time, and improvements of mask linearity and focus margin. It is also notable that in case the polymer of the formula [2] used in the present invention is the one in which the number of the monomer units of the formula [9] is less than that of the monomer units of the formula [7] and its weight-average molecular weight is less than that of the polymer of the formula [1], or in case a phenolic compound having a molecular weight of 300–15,000 is used in combination with said polymers, the above-mentioned effects as well as solving the problem of substrate dependency can be attained most effectively.

The monomer unit represented by the formula [4] includes, for example, the units of the such monomers as p- or m-hydroxystyrene derivatives and p- or m-hydroxy-α-methylstyrene derivatives. More specifically, these monomers include p- or m-1-methoxy-1-methylethoxystyrene, p- or m-1-benzyloxy-1-methylethoxystyrene, p- or m-1-ethoxyethoxystyrene, p- or m-1-methoxyethoxystyrene, p- or m-1-n-butoxyethoxystyrene, p- or m-1-isobutoxyethoxystyrene, p- or m-1-(1,1-dimethylethoxy)-1-methylethoxystyrene, p- or m-1-(1,1-dimethylethoxy)ethoxystyrene, p- or m-1-(2-chloroethoxy)ethoxystyrene, p- or m-1-(2-ethylhexyloxy)ethoxystyrene, p- or m-1-ethoxy-1-methylethoxystyrene, p- or m-1-n-propoxyethoxystyrene, p- or m-1-methyl-1-n-propoxyethoxystyrene, p- or m-1-ethoxypropoxystyrene, p- or m-1-methoxybutoxystyrene, m- or p-1-methoxycyclohexyloxystyrene, m- or p-1-acetyloxy-1-methylethoxystyrene, and p- or m-hydroxy-α-methylstyrene derivatives having the same protective group as the above-mentioned p- or m-hydroxystyrene derivatives.

The monomer unit represented by the formula [7] includes the units of the such monomers as styrene, m- or p-methoxystyrene, m- or p-isopropoxystyrene, m- or p-tert-butoxystyrene, m- or p-cyclohexyloxystyrene, m- or p-1-methylcyclohexyloxystyrene, m- or p-1-methylcyclopentyloxystyrene, m- or p-tetrahydropyranyloxystyrene, m- or p-tetrahydrofuranyloxystyrene, m- or p-acetyloxystyrene, m- or p-isobutylyloxystyrene, m- or p-pivaroyloxystyrene, m- or p-cyclohexanecarbonyloxystyrene, m- or p-methoxycarbonyloxystyrene, m- or p-ethoxycarbonyoxystyrene, m- or p-isopropoxycarbonyloxystyrene, m- or p-isobutoxycarbonyloxystyrene, m- or p-sec-butoxycarbonyloxystyrene, m- or p-tert-butoxycarbonyloxystyrene, m- or p-isoamyloxycarbonyloxystyrene, m- or p-tert-amyloxycarbonyloxystyrene, 1-methylcyclopentyl m- or p-vinylphenoxyacetate, 1-methylcyclohexyl m- or p-vinylphenoxyacetate, and α-methylstyrene derivatives having the same substituent group as the above-mentioned styrene derivatives.

The monomer unit represented by the formula [6] includes the units of such monomers as styrene, α-methylstyrene, p-chlorostyrene, o-, m- or p-methylstyrene, o-, m- or p-methoxystyrene, p-n-butylstyrene, p-ethoxystyrene, m- or p-1-methylcyclohexyloxystyrene, m- or p-1-methylcyclopentyloxystyrene, m- or p-tert-butoxystyrene, m- or p-tetrahydropyranyloxystyrene, m- or p-tetrahydrofuranyloxystyrene, m- or p-methoxycarbonyloxystyrene, m- or p-ethoxycarbonyloxystyrene, m- or p-isopropoxycarbonyloxystyrene, m- or p-isobutoxycarbonyloxystyrene, m- or p-tert-butoxycarbonyloxystyrene, m- or p-isoamyloxycarbonyloxystyrene, m- or p-tert-amyloxycarbonyloxystyrene, tert-butyl m- or p-vinylphenoxyacetate, 1-methylcyclopentyl m- or p-vinylphenoxyacetate, 1-methylcyclohexyl m- or p-vinylphenoxyacetate, and α-methylstyrene derivatives having the same substituent group as the above-mentioned styrene derivatives, and the units of such monomers as acrylonitrile, methacrylic acid, acrylic acid, methyl methacrylate, tert-butyl methacrylate, cyclohexylmethacrylate and the like.

The monomer unit represented by the formula [9] includes the units of such monomers as p- or m-hydroxystyrene derivatives and p- or m-hydroxy-α-methylstyrene derivatives. More specifically, such monomers include p- or m-1-methoxy-1-methylethoxystyrene, p- or m-benzyloxy-1-methylethoxystyrene, p- or m-1-ethoxyethoxystyrene, p- or m-1-methoxyethoxystyrene, p- or m-1-n-butoxyethoxystyrene, p- or m-1-isobutoxyethoxystyrene, p- or m-1-(1,1-dimethylethoxy)-1-methylethoxystyrene, p- or m-1-(1,1-dimethylethoxy)ethoxystyrene, p- or m-1-ethoxy-1-methylethoxystyrene, p- or m-1-n-propoxyethoxystyrene, p- or m-1-methyl-1-n-propoxyethoxystyrene, p- or m-1-methoxybutoxystyrene, m- or p-1-methoxycyclohexyloxystyrene, m- or p-1-acetyloxy-1-methylethoxystyrene, and p- or m-hydroxy-α-methylstyrene-derivatives having the same protective group as the above-mentioned p- or m-hydroxystyrene derivatives.

The monomer unit of the formula [5] constituting the polymer of the formula [1] and the monomer unit of the formula [8] constituting the polymer of the formula [2] are the monomers having phenolic hydroxyl groups. Examples of such monomers are p- or m-vinylphenol and p- or m-hydroxy-α-methylstyrene.

The polymer of the formula [1] and the polymer of the formula [2] may, in some cases, be constituted by the same monomer units, but these polymers are actually different from each other since in the polymer (a) there are used a greater number of the monomer units [4] than the monomer units [6] for maximizing the difference in rate of dissolution in the developer between the exposed portion and the non-exposed portion to ensure a high resolution while in the polymer (b) the number of the monomer units [9] are less than the monomer units [7] for controlling the rate of development to improve side wall configuration and substrate dependency.

The constitutional ratio of the total of the monomer units [4] and the monomer units [6] in the polymer [1] is usually 10 to 90 mol %, and any ratio within this range is applicable to the resist material of the present invention, but a ratio of from 20 to 50 mol % is preferred in terms of heat resistance of the polymer, substrate adhesion and mask linearity.

The constitutional ratio of the monomer units [6] in the polymer [1] is usually 0 to 25%, but a ratio of from 0 to 15 mol % is preferred as the ratio in this range is conducive to the improvement of mask linearity without affecting resolution of the polymer. It is also desirable in terms of resolution, etc., that the monomer units [4] be contained in a greater number than the monomer units [6].

The constitutional ratio of the monomer units [7] in the polymer [2] is usually 10 to 50 mol %, and any ratio within this range is applicable to the resist material of the present invention, but a ratio of from 15 to 40 mol % is preferred in view of its effect in improving polymer heat resistance and substrate adhesion and preventing the surface insoluble layer formed by delay time.

The constitutional ratio of the monomer units [9] in the polymer [2] is usually 0 to 20 mol %, but a ratio of from 0 to 15 mol % is preferred for allowing improvement of side wall configuration while maintaining resolution. It is also desirable for the improvement of side wall configuration and substrate dependency that the monomer units [7] be contained in a greater number than the monomer units [9].

Among the polymers (a), preferable ones are those having repating units of the formula:

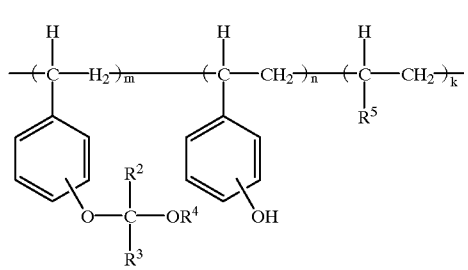

[1']

wherein $R^2$ and $R^3$ are independently a hydrogen atom, a straight or branched alkyl group having 1 to 4 carbon atoms, provided that $R^2$ and $R^3$ cannot be hydrogen atoms at the same time; $R^4$ is a straight or branched alkyl group having 1 to 4 carbon atoms; $R^5$ is a unsubstituted or substituted phenyl group; m, n and k are independently an integer of 1 or more; and m>k.

Among the polymers (b), preferable ones are those having repeating units of the formula:

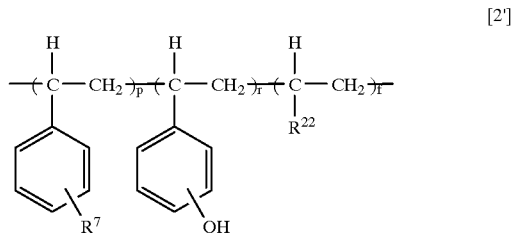

[2']

wherein $R^7$ is a hydrogen atom, a straight or branched alkyl group having 1 to 4 carbon atoms or a group of the formula: $R^8$—OCO$(CH_2)_z$O—; $R^8$ is a straight or branched alkyl group having 1 to 4 carbon atoms; z is zero or an integer of 1; $R^{22}$ is an unsubstituted or substituted phenyl group; p, r and f are independently an integer of 1 or more; and p>f.

Listed below are the examples of the polymers represented by the formula [1]:
poly[p-(1-methoxy-1-methylethoxy)styrene/p-hydroxystyrene], poly[p-(1-benzyloxy-1-methylethoxy)-styrene/p-hydroxystyrene], poly[p-(1-ethoxyethoxy)-styrene/p-hydroxystyrene], poly[p-(1-methoxyethoxystyrene)/p-hydroxystyrene], poly[p-1-n-butoxyethoxystyrene/p-hydroxystyrene], poly[p-(1,1-dimethylethoxy)-1-methylethoxystyrene/p-hydroxystyrene], poly[p-(1-methoxy-1-methylethoxy)styrene/p-hydroxystyrene/styrene], poly[p-(1-methoxy-1-methylethoxy)-styrene/p-hydroxystyrene/p-chlorostyrene], poly[p-(1-methoxy-1-methylethoxy)styrene/p-hydroxystyrene/p-methylstyrene], poly[p-(1-methoxy-1-methylethoxy)-styrene/p-hydroxystyrene/p-methoxystyrene], poly[p-(1-methoxy-1-methylethoxy)styrene/p-hydroxystyrene/p-tert-butoxystyrene], poly[p-(1-methoxy-1-methylethoxy)styrene/p-hydroxystyrene/p-1-methylcyclohexyloxystyrene], poly[p-(1-methoxy-1-methylethoxy)styrene/p-hydroxystyrene/methyl methacrylate], poly[p-(1-methoxy-1-methylethoxy)styrene/p-hydroxystyrene/tert-butyl methacrylate], poly[p-(1-methoxy-1-methylethoxy)styrene/p-hydroxystyrene/acrylonitrile], poly[p-(1-benzyloxy-1-methylethoxy)styrene/p-hydroxystyrene/styrene], poly[p-(1-benzyloxy-1-methylethoxy)styrene/p-hydroxystyrene/p-chlorostyrene], poly[p-(1-benzyloxy-1-methylethoxy)styrene/p-hydroxystyrene/p-methylstyrene], poly[p-(1-benzyloxy-1-methylethoxy)styrene/p-hydroxystyrene/p-ethoxystyrene], poly[p-(1-benzyloxy-1-methylethoxy)styrene/p-hydroxystyrene/p-tert-butoxystyrene], poly(poly-1-ethoxyethoxystyrene/p-hydroxystyrene/styrene), poly(p-1-ethoxyethoxystyrene/p-hydroxystyrene/p-chlorostyrene), poly(p-1-ethoxyethoxystyrene/p-hydroxystyrene/p-methylstyrene), poly(p-1-ethoxyethoxystyrene/p-hydroxystyrene/m-methylstyrene), poly(p-1-ethoxyethoxystyrene/p-hydroxystyrene/methyl methacrylate), poly(p-1-ethoxyethoxystyrene/p-hydroxystyrene/cyclohexylmethacrylate), poly(p-1-ethoxyethoxystyrene/p-hydroxystyrene/tert-butyl methacrylate), poly(p-1-ethoxyethoxystyrene/p-hydroxystyrene/acrylonitrile), poly(p-1-ethoxyethoxystyrene/p-hydroxystyrene/p-methoxystyrene), poly(p-1-ethoxyethoxystyrene/p- hydroxystyrene/p-ethoxystyrene), poly(p-1-ethoxyethoxystyrene/p-hydroxystyrene/p-tert-butoxystyrene), poly(p-1-ethoxyethoxystyrene/p-hydroxystyrene/acrylic acid), poly(p-1-ethoxyethoxystyrene/p-hydroxystyrene/p-methoxycarbonyloxystyrene), poly(p-1-ethoxyethoxystyrene/p-hydroxystyrene/p-ethoxycarbonyloxystyrene), poly(p-1-ethoxyethoxystyrene/p-hydroxystyrene/p-isopropoxycarbonyloxystyrene), poly(p-1-methoxyethoxystyrene/p-hydroxystyrene/p-isobutyloxycarbonyloxystyrene), poly(p-1-ethoxyethoxystyrene/p-hydroxystyrene/p-isobutoxycarbonyloxystyrene), poly(p-1-ethoxyethoxystyrene/p-hydroxystyrene/p-isoamyloxycarbonyloxystyrene), poly(p-1-ethoxyethoxystyrene/p-hydroxystyrene/p-1-methylcyclohexyloxy styrene), poly(p-1-methoxyethoxystyrene/p-hydroxystyrene/styrene), poly(p-1-methoxyethoxystyrene/p-hydroxystyrene/p-methylstyrene), poly(p-1-methoxyethoxystyrene/p-hydroxystyrene/m-methylstyrene), poly(p-1-methoxyethoxystyrene/p-hydroxystyrene/p-chlorostyrene), poly(p-1-methoxyethoxystyrene/p-hydroxystyrene/p-methoxystyrene), poly(p-1-methoxyethoxystyrene/p-hydroxystyrene/p-ethoxystyrene), poly(p-1-methoxyethoxystyrene/p-hydroxystyrene/p-tert-butoxystyrene), poly(p-1-methoxyethoxystyrene/p-hydroxystyrene/p-1-methylcyclohexyloxystyrene), poly(p-1-methoxyethoxystyrene/p-hydroxystyrene/methylmethacrylate), poly(p-1-methoxyethoxystyrene/p-hydroxystyrene/tert-butylmethacrylate), poly(p-1-methoxyethoxystyrene/p-hydroxystyrene/acrylonitrile), poly(p-1-n-butoxyethoxystyrene/p-hydroxystyrene/p-n-butylstyrene), poly(p-1-isobutoxyethoxystyrene/p-hydroxystyrene/o-methoxystyrene), poly{p-[(1,1-dimethylethoxy)-1-methylethoxy]styrene/p-hydroxystyrene/m-methoxystyrene}, poly[p-(1,1-dimethylethoxy)-1-methylethoxystyrene/p-hydroxystyrene/o-methylstyrene), poly(p-1-ethoxyethoxystyrene/p-hydroxystyrene/p-acetoxystyrene), poly(p-1-ethoxyethoxystyrene/p-hydroxystyrene/p-pivarolyloxystyrene), poly(p-1-ethoxyethoxystyrene/p-hydroxystyrene/p-cyclohexanecarbonyloxystyrene), poly[m-1-(2-chloroethoxy)ethoxystyrene/m-hydroxystyrene/styrene], poly[m-1-(2-ethylhexyloxy)ethoxystyrene/m-hydroxystyrene/m-methylstyrene], poly[p-(i-methoxy-1-methylethoxy)-α-methylstyrene/p-hydroxy-α-methylstyrene/styrene], poly[p-(1-ethoxy-1-methylethoxy)-styrene/p-hydroxystyrene/p-methylstyrene], poly(p-1-n-propoxyethoxystyrene/p-hydroxystyrene/p-methoxystyrene), poly[p-(1-methyl-1-n-propoxyethoxy)-styrene/p-hydroxystyrene/p-methylstyrene], poly(m-1-ethoxypropoxystyrene/m-hydroxystyrene/m-tert-butoxystyrene), poly(m-1-ethoxypropoxystyrene/m-hydroxystyrene/p-methylstyrene), poly[m-(1-methoxy-1-methylethoxy) styrene/m-hydroxystyrene/m-tert-butoxystyrene], poly[p-1-ethoxyethoxystyrene/p-hydroxystyrene/p-tetrahydrofuranyloxystyrene], poly[p-1-ethoxyethoxystyrene/p-hydroxystyrene/p-tetrahydropyranyloxystyrene], poly[p-1-methoxyethoxystyrene/p-hydroxystyrene/p-tetrahydropyranyloxystyrene], poly[p-1-ethoxyethoxystyrene/p-hydroxystyrene/p-tert-butoxycarbonyloxystyrene], poly[p-1-methoxyethoxystyrene/p-hydroxystyrene/p-tert-butoxycarbonyloxystyrene], poly[p-(1-methoxy-1-methylethoxy)styrene/p-hydroxystyrene/p-tert-butoxycarbonyloxystyrene], poly(p-1-ethoxyethoxystyrene/p-hydroxystyrene/tert-butyl p-vinylphenoxyacetate), poly(p-1-methoxyethoxystyrene/p-hydroxystyrene/tert-butyl p-vinylphenoxyacetate), poly(p-1-methoxyethoxystyrene/p-hydroxystyrene/1-methylcyclohexyl p-vinylphenoxyacetate), poly[m-1-ethoxyethoxystyrene/m-hydroxystyrene/m-tert-butoxycarbonyloxystyrene], poly(m-1-ethoxyethoxystyrene/m-hydroxystyrene/m-tert-butoxystyrene), poly(m-1-ethoxyethoxystyrene/m-hydroxystyrene/m-tert-butoxystyrene), poly(p-1-ethoxyethoxystyrene/m-1-ethoxyethoxystyrene/p-hydroxystyrene/m-hydroxystyrene/p-tert-butoxystyrene/m-tert-butoxystyrene), and poly(p-1-methoxybutoxystyrene/p-hydroxystyrene/styrene). Of course, the polymers represented by the formula [1] are not limited to those shown above.

The following are the examples of the polymers represented by the formula [2]:
poly(p-hydroxystyrene/styrene),
poly(p-methylstyrene/p-hydroxystyrene),
poly(p-methoxystyrene/p-hydroxystyrene),
poly(p-ethylstyrene/p-hydroxystyrene),
poly(p-ethoxystyrene/p-hydroxystyrene),
poly(p-isopropoxystyrene/p-hydroxystyrene),
poly(p-tert-butylstyrene/p-hydroxystyrene),
poly(p-tert-butoxystyrene/p-hydroxystyrene),
poly(1-methylcyclohexyloxystyrene/p-hydroxystyrene),
poly(m-tert-butoxystyrene/m-hydroxystyrene),
poly(p-methoxycarbonyloxystyrene/p-hydroxystyrene),
poly(p-ethoxycarbonyloxystyrene/p-hydroxystyrene),
poly(p-isopropoxycarbonyloxystyrene/p-hydroxystyrene),
poly(p-isobutoxycarbonyloxystyrene/p-hydroxystyrene),
poly(m-isobutoxycarbonyloxystyrene/m-hydroxystyrene),
poly(p-tert-butoxycarbonyloxystyrene/p-hydroxystyrene),
poly(m-tert-butoxycarbonyloxystyrene/p-hydroxystyrene),
poly(p-isoamyloxycarbonyloxystyrene/p-hydroxystyrene),
poly(m-isoamyloxycarbonyloxystyrene/m-hydroxystyrene),
poly(p-tert-amyloxycarbonyloxystyrene/p-hydroxystyrene),
poly(p-acetyloxystyrene/p-hydroxystyrene),
poly(p-isobutyroyloxystyrene/p-hydroxystyrene),
poly(p-pivaroyloxystyrene/p-hydroxystyrene),
poly(p-cyclohexanecarbonyloxystyrene/p-hydroxystyrene),
poly(p-sec-butoxycarbonyloxystyrene/p-hydroxystyrene),
poly(p-tetrahydrofuranyloxystyrene/p-hydroxystyrene),
poly(p-tetrahydropyranyloxystyrene/p-hydroxystyrene),
poly(m-tetrahydropyranyloxystyrene/m-hydroxystyrene),
poly(p-tert-butylvinylphenoxyacetate/p-hydroxystyrene),
poly(p-1-methylcyclohexylvinylphenoxyacetate/p-hydroxystyrene), poly(styrene/p-hydroxystyrene/p-1-methoxyethoxystyrene), poly(p-methylstyrene/p-hydroxystyrene/p-1-methoxyethoxystyrene),
poly(p-methoxystyrene/p-hydroxystyrene/p-1-methoxyethoxystyrene), poly(p-tert-butylstyrene/p-hydroxystyrene/p-1-methoxyethoxystyrene),
poly(styrene/p-hydroxystyrene/p-1-ethoxyethoxystyrene),
poly(p-methylstyrene/p-hydroxystyrene/p-1-ethoxyethoxystyrene),
poly(m-methylstyrene/p-hydroxystyrene/p-1-ethoxyethoxystyrene),
poly(p-methoxystyrene/p-hydroxystyrene/p-1-ethoxyethoxystyrene),
poly(p-tert-butylstyrene/p-hydroxystyrene/p-1-ethoxyethoxystyrene),
poly(p-tert-butoxystyrene/p-hydroxystyrene/p-1-ethoxyethoxystyrene),
poly(styrene/p-hydroxystyrene/p-1-methoxy-1-methylethoxystyrene),
poly(p-methylstyrene/p-hydroxystyrene/p-1-methoxy-1-methylethoxystyrene),
poly(p-methoxystyrene/p-hydroxystyrene/p-methoxy-1-methylethoxystyrene),
poly(p-tert-butylstyrene/p-hydroxystyrene/p-methoxy-1-methylethoxystyrene),
poly(p-tert-butoxystyrene/p-hydroxystyrene/p-1-methoxy-1-methylethoxystyrene),
poly(styrene/p-hydroxystyrene/p-1-benzyloxyethoxystyrene),
poly(p-methylstyrene/p-hydroxystyrene/p-1-benzyloxyethoxystyrene),
poly(p-methoxystyrene/p-hydroxystyrene/p-1-benzyloxyethoxystyrene),
poly(p-tert-butylstyrene/p-hydroxystyrene/p-1-benzyloxyethoxystyrene),
poly(p-tert-butoxystyrene/p-hydroxystyrene/p-1-benzyloxyethoxystyrene),
poly(p-ethoxycarbonyloxystyrene/p-hydroxystyrene/p-1-methoxyethoxystyrene),
poly(p-ethoxycarbonyloxystyerne/p-hydroxystyrene/p-1-ethoxyethoxystyrene),
poly(p-ethoxycarbonyloxystyrene/p-hydroxystyrene/p-1-methoxy-1-methylethoxystyrene),
poly(p-tert-butoxycarbonyloxystyrene/p-hydroxystyrene/p-1-methoxyethoxystyrene),
poly(p-tert-butoxycarbonyloxystyrene/p-hydroxystyrene/p-1-ethoxyethoxystyrene),
poly(p-tert-butoxycarbonyloxystyrene/p-hydroxystyrene/p-1-methoxy-1-methylethoxystyrene,
poly(p-tert-butoxycarbonyloxystyrene/p-hydroxystyrene/p-1-benzyloxyethoxystyrene),
poly(p-acetyloxystyrene/p-hydroxystyrene/p-1-ethoxyethoxystyrene),
poly(p-tetrahydropyranyloxystyrene/p-hydroxystyrene/p-1-methoxyethoxystyrene),
poly(p-tetrahydropyranyloxystyrene/p-hydroxystyrene/p-1-ethoxyethoxystyrene),
poly(p-tetrahydropyranyloxystyrene/p-hydroxystyrene/p-1-methoxy-1-methylethoxystyrene),
poly(p-1-methylcyclohexylvinylphenoxyacetate/p-hydroxystyrene/p-1-methoxyethoxystyrene),
poly(p-1-methylcyclohexylvinylphenoxyacetate/p-hydroxystyrene/p-1-ethoxyethoxystyrene), and
poly(p-1-methylcyclohexylvinylphenoxyacetate/p-hydroxystyrene/p-1-methoxy-1-methylethoxystyrene).
Of course, the polymers represented by the formula [2] are not limited to those shown above.

The polymers represented by the formula [1] or the formula [2] can be easily obtained according to any of the following processes (a)–(d).

(a) Process 1

A monomer represented by the formula [10]:

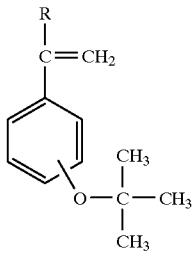

[10]

(wherein R is as defined above) and if necessary a monomer represented by the formula [11]:

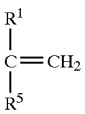

[11]

(wherein $R^1$ and $R^5$ are as defined above) are polymerized according to a conventional polymer preparation method in an organic solvent such as toluene, 1,4-dioxane, 1,2-dimethoxyethane, tetrahydrofuran, iso-propanol, 2-methoxypropanol, 1,3-dioxolane, ethyl acetate, methyl ethyl ketone or the like in the presence of a radical polymerization initiator [for example, an azo type polymerization initiator such as 2,2'-azobisisobutyronitrile, 2,2'-azobis(2-methylbutyronitrile), 2,2'-azobis(2,4-dimethylvaleonitrile), 2,2'-azobis(methyl 2-methylpropionate), 2,2'-azobis(ethyl 2-methylpropionate), 2,2'-azobis(methyl 2-methylbutyrate) or the like, or a peroxide type polymerization initiator such as benzoyl peroxide, lauroyl peroxide, bis(4-tert-butylcyclohexyl) peroxydicarbonate, di-tert-butylperoxide, tert-butylperoxy 2-ethylhexanoate, tert-butylperoxybenzoate, 1,1-bis(tert-butylperoxy)-3,3,5-trimethylcyclohexane or the like] in a nitrogen or argon gas stream at 50–120° for 1–10 hours. As polymerization initiator, preferably a non-nitrile type such as 2,2'-azobis(methyl 2-methylpropionate), 2,2'-azobis(ethyl 2-methylpropionate), 2,2'-azobis(methyl 2-methylbutyrate) or the like is used as this type of polymerization initiator is suited for producing low-molecular weight polymers because of high solubility in organic solvents and also advantageous in terms of safety in treatment and toxicity. For obtaining a polymer with low dispersibility, it is recommended to conduct anionic living polymerization in a dehydrated organic solvent such as ethyl ether, 1,2-dimethoxyethane, tetrahydrofuran, methyl ethyl ketone, 1,3-dioxolane, ethyl acetate, toluene or the like in the presence of a catalyst such as n-butyl lithium, naphthalene potassium or the like n a nitrogen or argon gas stream at a low temperature below −50° for 1–20 hours. The reaction product is subjected to after-treatments according to a conventional method to isolate a polymer represented by the formula [12]:

[12]

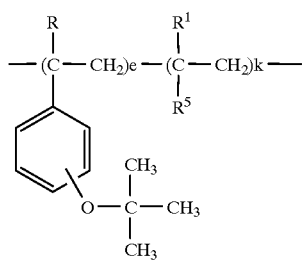

[wherein R, $R^1$, $R^5$ and k are as defined above; e represents a natural number (but $0.75 \leq e/(k+e) \leq 0.99$)]. This polymer is then reacted with a suitable acid [preferably inorganic acids such as sulfuric acid, phosphoric acid, hydrochloric acid, hydrobromic acid, etc., other Lewis acids, or organic acids such as p-toluenesulfonic acid, malonic acid, oxalic acid, etc.] in an organic acid such as tetrahydrofuran, acetone, methanol, ethanol, iso-propanol, n-propanol, n-butanol, sec-butanol, tert-butanol, 1,4-dioxane, 1,3-dioxolane, etc., at 30–110° for 1–20 hours to perfectly eliminate the functional tert-butyl groups. The reaction product is further subjected to after-treatments according to a conventional method to isolate a hydroxystyrene polymer represented by the formula [13]:

[13]

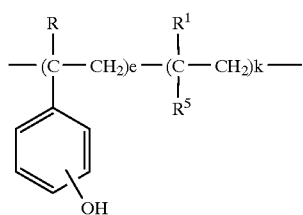

(wherein R, $R^1$, $R^5$, e and k are as defined above). This polymer is further reacted with a vinyl ether or isoprope-nylether compound represented by the formula [14]:

[14]

$$R^4 - O - \overset{R^3}{\underset{|}{C}} = CH_2$$

(wherein $R^3$ and $R^1$ are as defined above) in an organic solvent such as tetrahydrofuran, acetone, methyl ethyl ketone, 1,4-dioxane, 1,3-dioxolane, methylene chloride, 1,2-dimethoxyethane, ethyl ether, ethyl acetate, propylene glycol monomethyl ether or the like in the presence of a suitable catalyst [such as sulfuric acid, hydrochloric acid, phosphorus oxychloride, p-toluenesulfonic acid, camphorsulfonic acid, pyridine salt of chlorosulfonic acid, pyridine salt of sulfuric acid, pyridine salt of p-toluenesulfonic acid or the like] to chemically introduce the functional group of the formula [3] at a suitable rate, and the resulting product is subjected to after-treatments according to a conventional method to isolate a polymer represented by the formula [1] or the formula [2].

(b) Process 2

A monomer [10] is polymerized in the same way as in the process 1 and subjected to after-treatments according to a conventional method to isolate a homopolymer represented by the formula [15]:

[15]

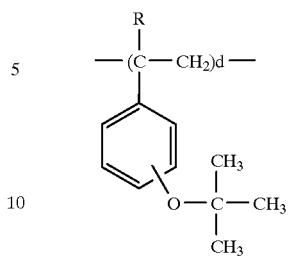

(wherein R is as defined above and d is a natural number). This homopolymer is reacted with a suitable acid [for example, inorganic acids such as sulfuric acid, phosphoric acid, hydrochloric acid, hydrobromic acid, etc., and other Lewis acids, or organic acids such as p-toluenesulfonic acid, malonic acid, oxalic acid, etc.) in an organic solvent such as tetrahydrofuran, acetone, 1,4-dioxane, 1,3-dioxolane, methanol, ethanol, n-propanol, iso-propanol, n-butanol, sec-butanol, tert-butanol or the like at 30–100° C. for 1–10 hours to eliminate tert-butyl groups at an appropriate rate. The reaction product is subjected to after-treatments according to a conventional method to isolate a hydroxystyrene copolymer represented by the formula [16]:

[16]

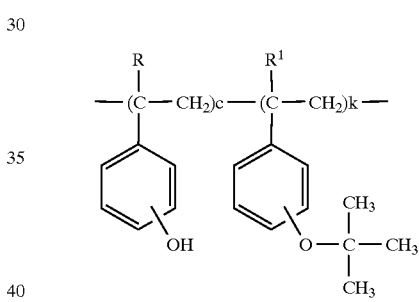

(wherein R, $R^1$ and k are as defined above, and c=m+n). This copolymer corresponds to the polymer of the formula [2] wherein f=0. Into this copolymer is introduced a functional group of the formula [3] in the same way as in the process 1, followed by after-treatments according to a conventional method to isolate a polymer of the formula [1] ($k \neq 0$) or the formula [2] ($f \neq 0$).

(c) Process 3

A monomer of the formula [10] or the formula [17]:

[17]

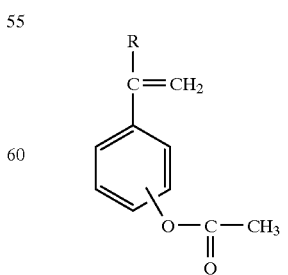

(wherein R is as defined above) is polymerized in the same way as in the process 1 and subjected to after-treatments according to a conventional method to isolate a homopolymer represented by the above-shown formula [15] or the formula [18]:

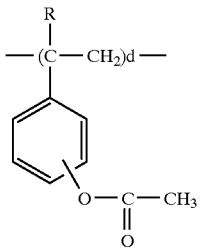

[18]

(wherein R and d are as defined above). This homopolymer is reacted in an organic solvent such as tetrahydrofuran, 1,4-dioxane, 1,3-dioxolane, ethyl acetate, methanol, ethanol, n-propanol, iso-propanol, n-butanol, sec-butanol, tert-butanol, water or the like, if necessary in a nitrogen stream, in the presence of a suitable base [preferably sodium hydroxide, potassium hydroxide, ammonia water, hydroxyamine, various tetraalkylammonium hydroxide solutions, various trialkylamines, various triaralkylamines or the like] or a suitble acid [preferably inorganic acids such as sulfuric acid, hydrochloric acid, phosphoric acid, hydrobromic acid, etc., Lewis acids, p-toluenesulfonic acid, malonic acid, oxalic acid or the like] at 10–70° for 0.5–10 hours to perfectly eliminate tert-butyl groups or acetyl groups which are the functional groups. The reaction product is subjected to after-treatments according to a conventional polymer preparation method to isolate a hydroxystyrene polymer represented by the formula [19]:

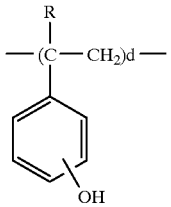

[19]

(wherein R and d are as defined above). Into this homopolymer is introduced a functional group of the formula [3], and after-treatments are conducted thereon according to a conventional method to isolate a polymer represented by the formula [1] (k=0).

(d) Process 4

The homopolymer of the formula [19] obtained according to the process 3 is reacted with a pertinent amount of a hydroxyl-protecting reagent, for example, dialkyl dicarbonates such as di-tert-butyl dicarbonate, alkyl chlorocarbonates such as methyl chlorocarbonate, 2,3-dihydrofuran, 2,3-dihydropyran, tert-butyl monochloroacetate, 1-methylcyclohexyl monochloroacetate, isobutene, dimethylsulfuric acid, methyl iodide, 1-methylcyclohexyl chloride or the like in an organic solvent such as tetrahydrofuran, 1,4-dioxane, ethyl acetate, methyl ethyl ketone, acetone, methylene chloride, 1,3-dioxolane, methanol, ethanol, n-propanol, iso-propanol, n-butanol, sec-butanol, tert-butanol, methylene chloride or the like in the presence of a suitable base [preferably potassium hydroxide, sodium hydroxide, sodium carbonate, potassium carbonate, triethylamine, N-methyl-2-pyrrolidone, piperidine, various tetraalkylammonium hydroxide solutions, various trialkylamines, various triaralkylamines or the like] at 10–100° for 0.5–30 hours, and the reaction product is subjected to after-treatments according to a conventional method to obtain a copolymer of the formula [13].

Into this copolymer is introduced a functional group of the formula [3] in the same way as in the process 1, followed by after-treatments according to a conventional method to give a polymer represented by the formula [1] (k≠0) or the formula [2] (f≠0).

In case the polymer composition of the present invention is used as a resist material, preferred examples of the polymers of the formula [1] for use in this invention are those of the formula [1] wherein R and $R^1$ are independently a hydrogen atom or a lower alkyl group, one of $R^2$ and $R^3$ is a hydrogen atom or a lower alkyl group and the other is a lower alkyl group, $R^4$ is a lower alkyl group, $R^5$ is a phenyl group substituted with a lower alkyl group, a lower alkoxyl group, an acyloxy group, a saturated heterocyclic oxy group or a group of the formula $R^{25}O$—CO—$(CH_2)_jO$— (wherein $R^{25}$ represents a lower alkyl group and j is 0 or 1), m and n are each a natural number, and k is 0 or a natural number (but $0.1 \leq (m+k)/(m+n+k) \leq 0.9$, $0 \leq k/(m+n+k) \leq 0.25$, and m>k).

Preferred examples of the polymers represented by the formula [2] are those of the formula [2] wherein $R^6$ and $R^{21}$ are independently a hydrogen atom, $R^7$ is a hydrogen atom, a lower alkyl group, a lower alkoxyl group, an acyloxy group, a saturated heterocyclic oxy group or a group of the formula $R^8O$—CO—$(CH_2)_z$—O— (wherein $R^8$ represents a lower alkyl group and z is 0 or 1), one of $R^{22}$ and $R^{23}$ is a hydrogen atom or a lower alkyl group, $R^{24}$ is a lower alkyl group, and p, r and f are each a natural number (but $0.1 \leq p/(p+r+f) \leq 0.5$, $0 \leq f/(p+r+f) \leq 0.2$, and f<p).

The weight-average molecular weight of the polymers represented by the formula [1] or the formula [2] is not limited as far as the polymers are utilizable as components of a resist material, but generally the weight-average molecular weight [Mw] of these polymers as determined by GPC with polystyrene calibration usually falls in the range of about 5,000 to 50,000, preferably about 7,000 to 30,000 in the case of the polymers of the formula [1], and about 1,000 to 25,000, preferably about 2,000 to 15,000 in the case of the polymers of the formula [2]. It is important from the standpoints of resolution, dimensional change due to delay time and improvement of pattern side wall and substrate dependency that the weight-average molecular weight of the polymers of the formula [1] be greater than that of the polymers of the formula [2]. There is no specific limitation on such difference of molecular weight so far as the above effect can be achieved if the molecular weight of the polymer [1] is greater, even if only slightly, than that of the polymer [2], but it is usually desirable that the weight-average molecular weight of the polymer [1] is about 10% or more greater than that of the polymer [2]. The degree of dispersion [Mw/Mn] of both polymers of the formula [1] and the formula [2] is preferably in the range from 1.0 to 2.0 since this degree of dispersion is most suited for equalizing the polymer elution rate in the developer at the exposed region, resulting in improved pattern side wall configuration.

The weight ratio of the polymer (a) to the polymer (b) is usually 10:9 to 10:1, preferably 3:2 to 4:1, in view of heat resistance, mask linearity, proximity effect, delay time and resolution.

The phenolic compound used in the present invention can be obtained by reacting a phenol represented by the formula [20]:

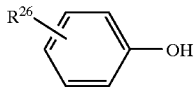

[20]

(wherein $R^{26}$ is a hydrogen atom, a methyl group or an ethyl group) with a proper amount of an aldehyde represented by the formula [21]:

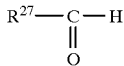

[21]

(wherein $R^{27}$ is a hydrogen atom, a lower alkyl group or an optionally substituted phenyl group) or a proper amount of a dimethylol compound represented by the formula [22]:

[22]

(wherein $R^{28}$ is a hydrogen atom, a methyl group or an ethyl group) in a solvent such as water, diethylene glycol, glycerin or the like, or a mixture of such solvents, or without solvent, in the presence of an acid (such as oxalic acid, sulfuric acid, phosphoric acid, p-toluenesulfonic acid or the like) at 50–180° for 0.5–20 hours with stirring. The reaction product is isolated by suitable means such as concentration to dryness, pouring into water, separation and purification, etc.

The lower alkyl group represented by $R^{27}$ in the formula [21] is preferably a linear or branched alkyl group having 1–3 carbon atoms, such as methyl, ethyl, n-propyl or isopropyl. The substituent of the optionally substituted phenyl group in the definition of $R^{27}$ in the formula [21] may be, for instance, a halogen atom such as chlorine atom, bromine atom, iodine atom or fluorine atom, an alkyl group such as methyl, ethyl, tert-butyl, etc., or an alkoxy group such as methoxy, ethoxy, etc.

As the phenolic compound in the present invention, there can be used, for instance, phenolic resins and polycondensates of phenols and methylol compounds. Specifically they include p-cresol/formaldehyde polycondensate, m-cresol/formaldehyde polycondensate, p-cresol/m-cresol/formaldehyde polycondensate, phenol/formaldehyde polycondensate, p-cresol/acetaldehyde polycondensate, p-cresol/acetaldehyde polycondensate, m-cresol/acetaldehyde polycondensate, p-cresol/m-cresol/acetaldehyde polycondensate, phenol/acetaldehyde polycondensate, p-cresol/propionaldehyde polycondensate, m-cresol/propionaldehyde polycondensate, phenol/propionaldehyde polycondensate, p-cresol/benzaldehyde polycondensate, m-cresol/benzaldehyde polycondensate, p-cresol/m-cresol/benzaldehyde polycondensate, phenol/benzaldehyde polycondensate, p-cresol/p-methylbenzaldehyde polycondensate, m-cresol/p-methylbenzaldehyde polycondensate, p-cresol/m-cresol/p-methylbenzaldehyde polycondensate, phenol/p-methylbenzaldehyde polycondensate, p-cresol/1,4-benzenedimethanol polycondensate, m-cresol/1,4-benzenedimethanol polycondensate, and p-cresol/m-cresol/1,4-benzenedimethanol polycondensate.

The phenolic compounds usable in the present invention, besides the resins mentioned above, also include 1,1,1-tris(4-hydroxyphenyl)ethane, α',α',α'-tris(4-hydroxyphenyl)-1-ethyl-4-isopropylbenzene, and 3,4-dihydroxy-4-(2,4-dihydroxyphenyl)-7-hydroxy-2,2,4-trimethyl-2H-1-benzopyran.

The weight-average molecular weight of the phenolic compound used in the present invention is not limited as far as the compound is utilizable as a component of a resist material, but usually the weight-average molecular weight [Mw] of the compound as determined by GPC with polystyrene calibration is around 300 to 15,000, preferably around 300 to 10,000, more preferably around 300 to 8,000 which provides improvement of side wall configuration or substrate dependency while maintaining high resolution and heat resistance.

The ratio of the phenolic compound of the present invention to the polymer of the formula [1] or the sum of the polymer of the formula [1] and the polymer of the formula [2] is usually 3:7 to 1:99, preferably 2:8 to 1:49 as the latter is more advantageous for improving side wall configuration, substrate dependency and resolution.

For producing a resist material with the polymer composition of the present invention, there is additionally used a substance which generates an acid on exposure to actinic radiation (this substance being hereinafter referred to as "photoacid generator"). These components are usually used in the form of a solution using preferably an organic solvent.

As the photoacid generator in the present invention, there can be used any substance which is capable of generating an acid on exposure to actinic radiation and gives no adverse effect to resist pattern formation, but it is preferred to use a substance having high transmittance of light with a wavelength of near 248.4 nm and capable of maintaining high transparency of the resist material, or a substance capable of being enhanced in transmittance of light near 248.4 nm by exposure and maintaining high transparency of the resist material. As the especially preferred examples of such photoacid generator used in the present invention, the compounds of the following formulae [23], [24], [26], [27], [28] and [30] can be exemplified:

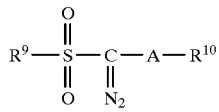

[23]

[wherein $R^9$ and $R^{10}$ are independently an alkyl group or a haloalkyl group, and A is a sulfonyl group or a carbonyl group];

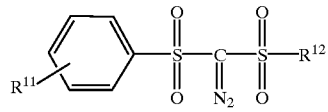

[24]

[wherein $R^{11}$ is a hydrogen atom, a halogen atom, an alkyl group, an alkoxyl group or a haloalkyl group, and $R^{12}$ is an alkyl group, a haloalkyl group or a group of the formula [25]:

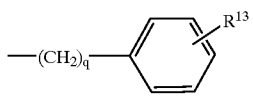

{wherein R$^{13}$ is a hydrogen atom, a halogen atom, an alkyl group, an alkoxyl group or a haloalkyl group, and q is 0 or an integer of 1 to 3}];

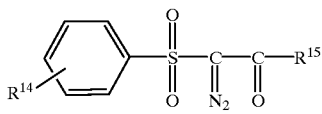

[wherein R$^{14}$ is a hydrogen atom, a halogen atom, an alkyl group or a trifluoromethyl group, and R$^{15}$ is an alkyl group, an aralkyl group, an alkoxyl group, a phenyl group or a tolyl group];

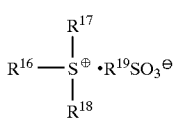

[wherein R$^{16}$ is an alkyl group, a phenyl group, a substituted phenyl group or an aralkyl group, R$^{17}$ and R$^{18}$ are independently a hydrogen atom, an alkyl group, a phenyl group, a substituted phenyl group or an aralkyl group, and R$^{19}$ is a fluoroalkyl group, a trifluoromethylphenyl group, a methyl group or a tolyl group];

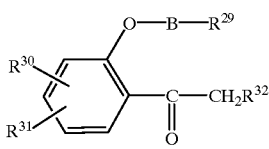

[wherein R$^{29}$ is an alkyl group, a fluoroalkyl group, a phenyl group, a substituted phenyl group or an aralkyl group, R$^{30}$ and R$^{31}$ are independently a hydrogen atom, a methyl group, a methoxy group, a nitro group, a cyano group, a hydroxyl group or a group of the formula [29]:

(wherein R$^{33}$ is an alkyl group, a fluoroalkyl group, a phenyl group, a substituted phenyl group or an aralkyl group, and B is a sulfonyl group or a carbonyl group), and R$^{32}$ is a hydrogen atom, a methyl group or an ethyl group];

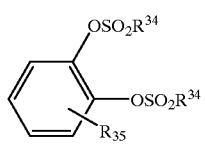

[wherein R$^{34}$ is an alkyl group, a fluoroalkyl group, a phenyl group, a substituted phenyl group or an aralkyl group, and R$^{35}$ is a hydrogen atom, a methyl group, a fluoroalkyl group, a methoxy group, a nitro group, a cyano group, a hydroxyl group or a group of the formula [29]].

The alkyl groups represented by R$^9$ and R$^{10}$ in the formula [23] and the alkyl groups in the haloalkyl groups also represented by R$^9$ and R$^{10}$ may be straight, branched or cyclic and preferably have 1 to 10 carbon atoms. Examples of such alkyl groups include methyl, ethyl, n-propyl, isopropyl, cyclopropyl, n-butyl, isobutyl, tert-butyl, sec-butyl, n-pentyl, isopentyl, tert-pentyl, 1-methylpentyl, cyclopentyl, n-hexyl, isohexyl, cyclohexyl, heptyl, octyl, nonyl and decyl.

The halogen of the haloalkyl groups may be, for instance, chlorine, bromine, fluorine or iodine.

The alkyl groups represented by R$^{11}$ in the formula [24] and the alkyl groups in the haloalkyl groups also represented by R$^{11}$ may be either straight or branched and preferably have 1 to 5 carbon atoms. Examples of these alkyl groups include methyl, ethyl, n-propyl, isopropyl, n-butyl, isobutyl, tert-butyl, sec-butyl, n-pentyl, isopentyl, tert-pentyl and 1-methylpentyl. The halogen of the haloalkyl groups in the definition of R$^{11}$ and the halogen may be, for instance, chlorine, bromine, fluorine or iodine. The alkoxyl groups represented by R$^{11}$, which may be straight or branched and preferably have 1 to 5 carbon atoms, include methoxy, ethoxy, n-propoxy, isopropoxy, n-butoxy, isobutoxy, tert-butoxy, sec-butoxy, n-pentyloxy and isopentyloxy. The alkyl groups represented by R$^{12}$ and the alkyl groups in the haloalkyl groups represented by R$^{12}$, which may be straight, branched or cyclic and preferably have 1 to 10 carbon atoms, include methyl, ethyl, n-propyl, isopropyl, cyclopropyl, n-butyl, isobutyl, tert-butyl, sec-butyl, n-pentyl, isopentyl, tert-pentyl, 1-methylpentyl, cyclopentyl, n-hexyl, isohexyl, cyclohexyl, heptyl, octyl, nonyl and decyl. The halogen of the haloalkyl groups may be, for instance, chlorine, bromine, fluorine or iodine.

The alkyl groups represented by R$^{13}$ in the formula [25] and the alkyl groups in the haloalkyl groups also represented by R$^{13}$ may be straight or branched and preferably have 1 to 6 carbon atoms, examples thereof including methyl, ethyl, n-propyl, isopropyl, n-butyl, isobutyl, tert-butyl, sec-butyl, n-pentyl, isopentyl, tert-pentyl, 1-methylpentyl, n-hexyl and isohexyl. The alkoxyl groups represented by R$^{13}$, which may be either straight or branched and preferably have 1 to 5 carbon atoms, include methoxy, ethoxy, n-propoxy, isopropoxy, n-butoxy, isobutoxy, tert-butoxy, sec-butoxy, n-pentyloxy, isopentyloxy, n-hexyloxy and isohexyloxy. The halogen of the haloalkyl groups in the definition of R$^{13}$ may be, for instance, chlorine, bromine, fluorine or iodine.

The alkyl groups represented by R$^{14}$ in the formula [26] may be straight or branched and preferably have 1 to 5 carbon atoms, such alkyl groups including methyl, ethyl, n-propyl, isopropyl, n-butyl, isobutyl, tert-butyl, sec-butyl, n-pentyl, isopentyl, tert-pentyl and 1-methylpentyl. The alkyl groups represented by R$^{15}$ may be straight, branched or cyclic, preferably have 1 to 10 carbon atoms, and include, for instance, methyl, ethyl, n-propyl, isopropyl, cyclopropyl, n-butyl, isobutyl, tert-butyl, sec-butyl, n-pentyl, isopentyl, tert-pentyl, 1-methylpentyl, cyclopentyl, n-hexyl, isohexyl, cyclohexyl, heptyl, octyl, nonyl and decyl. The halogen in the definition of R$^{14}$ may be, e.g. chlorine, bromine, fluorine or iodine.

Examples of the aralkyl groups represented by R$^{15}$ include benzyl, phenetyl, phenylpropyl, methylbenzyl, methylphenetyl and ethylbenzyl. The alkoxyl groups of 1 to 6 carbon atoms represented by R$^{15}$ may be straight or branched and include, for instance, methoxy, ethoxy, n-propoxy, isopropoxy, n-butoxy, isobutoxy, tert-butoxy, sec-butoxy, n-pentyloxy, isopentyloxy, n-hexyloxy and isohexyloxy.

The alkyl groups represented by $R^{16}$, $R^{17}$ and $R^{18}$ in the formula [27] may be straight, branched or cyclic and preferably have 1 to 8 carbon atoms, examples thereof including methyl, ethyl, n-propyl, isopropyl, cyclopropyl, n-butyl, isobutyl, tert-butyl, sec-butyl, n-pentyl, isopentyl, tert-pentyl, 1-methylpentyl, cyclopentyl, n-hexyl, isohexyl, cyclohexyl, heptyl and octyl. Examples of the substituted phenyl groups represented by these R's include tolyl, ethylphenyl, tert-butylphenyl and chlorophenyl, and examples of the aralkyl groups represented by these R's include benzyl, phenetyl, phenylpropyl, methylbenzyl, methylphenetyl and ethylbenzyl. The alkyl groups in the fluoroalkyl groups represented by $R^{19}$ may be straight or branched and preferably have 1 to 8 carbon atoms, which include, for instance, methyl, ethyl, n-propyl, isopropyl, n-butyl, isobutyl, tert-butyl, sec-butyl, n-pentyl, isopentyl, tert-pentyl, 1-methylpentyl, n-hexyl, isohexyl, butyl and octyl. The total number of the substituted fluorine atoms in these groups is preferably 1 to 17.

The alkyl groups represented by $R^{29}$ in the formula [28] may be straight, branched or cyclic, preferably have 1 to 6 carbon atoms, and include, for instance, methyl, ethyl, n-propyl, isopropyl, n-butyl, isobutyl, tert-butyl, sec-butyl, n-pentyl, isopentyl, cyclopentyl, n-hexyl and cyclohexyl. The substituted phenyl groups represented by $R^{29}$ include tolyl, ethylphenyl, tert-butylphenyl and chlorophenyl, and the aralkyl groups represented by $R^{29}$ include benzyl, phenetyl, phenylpropyl, methylbenzyl, methylphenetyl and ethylbenzyl. The alkyl groups in the fluoroalkyl groups represented by $R^{29}$ may be straight or branched and preferably have 1 to 8 carbon atoms, examples thereof including methyl, ethyl, n-propyl, isopropyl, n-butyl, isobutyl, tert-butyl, sec-butyl, n-pentyl, isopentyl, n-hexyl, heptyl and octyl, in which the total number of the substituted fluorine atoms is preferably 1 to 17.

The alkyl groups represented by $R^{33}$ in the formula [29] may be straight, branched or cyclic, preferably have 1 to 6 carbon atoms, and include, for instance, methyl, ethyl, n-propyl, isopropyl, n-butyl, isobutyl, tert-butyl, sec-butyl, n-pentyl, isopentyl, cyclopentyl, n-hexyl and cyclohexyl. The substituted phenyl groups represented by $R^{33}$ include tolyl, ethylphenyl, tert-butylphenyl and chlorophenyl, and the aralkyl groups represented by $R^{33}$ include benzyl, phenetyl, phenylpropyl, methylbenzyl, methylphenetyl and ethylbenzyl. The alkyl groups in the fluoroalkyl groups represented by $R^{33}$ may be straight or branched, preferably have 1 to 8 carbon atoms, and include, for instance, ethyl, n-propyl, isopropyl, n-butyl, isobutyl, tert-butyl, sec-butyl, n-pentyl, isopentyl, n-hexyl, heptyl and octyl, in which the total number of the substituted fluorine atoms is preferably 1 to 17.

The alkyl groups represented by $R^{34}$ in the formula [30] may be straight, branched or cyclic and preferably have 1 to 6 carbon atoms, examples thereof including methyl, ethyl, n-propyl, isopropyl, n-butyl, isobutyl, tert-butyl, sec-butyl, n-pentyl, isopentyl, cyclopentyl, n-hexyl and cyclohexyl. Examples of the substituted phenyl groups represented by $R^{34}$ include tolyl, ethylphenyl, tert-butylphenyl and chlorophenyl, and examples of the aralkyl groups represented by $R^{34}$ include benzyl, phenetyl, phenylpropyl, methylbenzyl, methylphenetyl and ethylbenzyl. The alkyl groups of the fluoroalkyl groups represented by $R^{34}$ and $R^{35}$ may be straight or branched, preferably have 1 to 8 carbon atoms, and include, for instance, methyl, ethyl, n-propyl, isopropyl, n-butyl, isobutyl, tert-butyl, sec-butyl, n-pentyl, isopentyl, n-hexyl, heptyl and octyl, in which the total number of the substituted fluorine atoms is preferably 1 to 17.

The photoacid generators which can be favorably used in the present invention are listed below.

The photoacid generators represented by the formula [23]: 1-cyclohexylsulfonyl-1-(1,1-dimethylethylsulfonyl) diazomethane, bis(1,1-dimethylethylsulfonyl) diazomethane, bis(1-methylethylsulfonyl)-diazomethane, bis(cyclohexylsulfonyl)diazomethane, 1-cyclohexylsulfonyl-1-cyclohexylcarbonyldiazomethane, 1-diazo-1-cyclohexylsulfonyl-3,3-dimethylbutane-2-one, 1-diazo-1-methylsulfonyl-4-phenylbutane-2-one, 1-diazo-1-(1,1-dimethylethylsulfonyl)-3,3-dimethyl-2-butanone, 1-acetyl-1-(1-methylethylsulfonyl)-diazomethane, etc.

The photoacid generators represented by the formula [24]: bis(p-toluenesulfonyl)diazomethane, bis(2,4-dimethylbenzenesulfonyl)diazomethane, methylsulfonyl-p-toluenesulfonyldiazomethane, bis(p-tert-butylphenylsulfonyl)diazomethane, bis(p-chlorobenzenesulfonyl)diazomethane, cyclohexylsulfonyl-p-toluenesulfonyldiazomethane, etc.

The photoacid generators represented by the formula [26]: 1-p-toluenesulfonyl-1-cyclohexylcarbonyldiazomethane, 1-diazo-1-(p-toluenesulfonyl)-3,3-dimethylbutane-2-one, 1-diazo-1-benzenesulfonyl-3,3-dimethylbutane-2-one, 1-diazo-1-(p-toluenesulfonyl)-3-methylbutane-2-one, etc.

The photoacid generators represented by the formula [27]: triphenylsulfonium trifluoromethanesulfonate, triphenylsulfonium perfluorooctanesulfonate, diphenyl-p-tolylsulfonium perfluorooctanesulfonate, tris(p-tolyl)sulfonium perfluorooctanesulfonate, tris(p-chlorobenzene)sulfonium trifluoromethanesulfonate, tris(p-tolyl)sulfonium trifluoromethanesulfonate, trimethylsulfonium trifluoromethanesulfonate, dimethylphenylsulfonium trifluoromethanesulfonate, dimethyl-p-tolylsulfonium trifluoromethanesulfonate, dimethyl-p-tolylsulfonium perfluorooctanesulfonate, etc.

The photoacid generators represented by the formula [28]: 2,6-di-trifluoromethanesulfonyloxyacetophenone, 2,6-di-trifluoromethanesulfonyloxypropiophenone, 2,3,4-tris-trifluoromethanesulfonyloxyacetophenone, 2,6-di-methanesulfonyloxyacetophenone, 2,6-di-methanesulfonyloxypropiophenone, 2,3,4-tris-methanesulfonyloxyacetophenone, 2-trifluoromethanesulfonyloxyacetophenone, 2-methanesulfonyloxyacetophenone, 2-n-butanesulfonyloxyacetophenone, 2,6-di-n-butanesulfonyloxyacetophenone, 2,3,4-tris-n-butanesulfonyloxyacetophenone, 2,6-di-perfluoropropanecarboxyacetophenone, 2 2,3,4-tris-perfluoropropanecarboxyacetophenone, 2,6-di-p-toluenesulfonylacetophenone, 2,6-di-p-toluenesulfonylpropiophenone, 2,6-di-trifluoroacetyloxyacetophenone, 2-trifluoroacetyloxy-6-methoxyacetophenone, 6-hydroxy-2-perfluorobutanesulfonyloxyacetophenone, 2-trifluoroacetyloxy-6-nitroacetophenone, 2,3,4-tris-trifluoroacetyloxyacetophenone, 2,6-di-perfluoropropanoyloxyacetophenone, etc.

The photoacid generators represented by the formula [30]: 1,2,3-tris-methanesulfonyloxybenzene, 1,2,3-tris-p-toluenesulfonyloxybenzene, 1,2,3-tris-trifluoroacetyloxybenzene, 1,2,3-tris-perfluorobutanesulfonyloxybenzene, 1,2,3-tris-cyclohexylsulfonyloxybenzene, 1,2-dimethanesulfonyloxy-3-nitrobenzene, 2,3-di-methanesulfonyloxyphenol, 1,2,4-tris-p-toluenesulfonyloxybenzene, 1,2,4-tris-methanesulfonyloxybenzene, 1,2,4-tris-trifluoroacetyloxybenzene, 1,2,4-tris-cyclohexylsulfonyloxybenzene, 1,2-di-n-butanesulfonyloxy-3-nitrobenzene, 1,2,3-tris-perfluorooctanesulfonyloxybenzene, 1,2-di-perfluorobutanesulfonyloxyphenol, etc.

The resist material of the present invention preferably comprises a combination of (i) at least one polymer of the formula [1] and (ii) at least one polymer of the formula [2], or a combination of (i) at least one polymer of the formula [1], (ii) at least one polymer of the formula [2] and (iii) a phenolic compound having a molecular weight (Mw) of 300–15,000, or a combination of (i) at least one polymer of the formula [1], and (iii) a phenolic compound having a molecular weight (Mw) of 300–15,000, and at least one photoacid generator selected from those of the formulae [23], [24], [26], [27], [28] and [30]. In case two or more photoacid generators are used, a preferred example of the combination is an photoacid generator of the formula [23], which has a good transmittance to light with a wavelength of around 248.4 nm and is capable of maintaining high transparency of the resist material, low in temperature dependency in heat treatment (PEB) after exposure and also capable of generating an acid on exposure. Another example is a photoacid generator of the formula [24], [26], [27], [28] or [30] which is high in acid generating efficiency at a given exposure dose or capable of generating a strong acid on exposure, as this combination is best suited for improving configuration of the pattern skirt portion and removing scum.

Thus, in case two or more photoacid generators are used in the resist material of the present invention, there can be obtained the effect of eliminating tailing of the skirt portion of the resist pattern and scum. This phenomenon maybe accounted for by the fact that an photoacid generator capable of generating a stronger acid or causing greater acid diffusion has a greater possibility of eliminating functional groups of the polymer evenly down to the bottom portion of the resist. In view of this, it is particularly recommended in this invention to use a combination of a photoacid generator of the formula [23] and a photoacid generator of the formula [24], [26], [27], [28] or [30].

As for the proportions of the photoacid generators in case two or more photoacid generators are used, the ratio of the photoacid generator of the formula [24], [26], [27], [28] or [30] to the photoacid generator of the formula [23] is 1–70 to 100, preferably 10–50 to 100 in parts by weight.

When using alone an photoacid generator of the formula [27] which is very effective against footing of the pattern or generation of scum, there could arise the problem of improper pattern formation or dimensional variation due to delay time, but such problem can be overcome by applying an overcoat.

The photoacid generators other than those particularly preferred in the present invention are also usable. For example, various triphenylsulfonium salts and diphenyliodonium salts (anions of these onium salts including $PF_6^-$, $AsF_6^-$ and BF4—), tris(trichloromethyl)-s-triazine/triethanolamine, tris(trichloromethyl)-s-triazine/acetamide and such are unusable singly as they are very susceptible to delay time, but they become effective when used in combination with an photoacid generator of the formula [23].

As for the solvent used in preparation of the resist material of the present invention, it is possible to use any type of solvent as far as it is capable of dissolving the polymer composition of the present invention, the photoacid generators and the optionally used additives such as ultraviolet absorber, acidic compound, surfactant, etc., but usually a solvent having good film forming properties and not showing absorption at around 220–400 nm is preferably used. Examples of such solvents include, but not limited thereto, methyl Cellosolve acetate, ethyl Cellosolve acetate, propylene glycol monomethyl ether acetate, propylene glycol monoethyl ether acetate, methyl lactate, ethyl lactate, 2-ethoxyethyl acetate, methyl pulvinate, methyl 3-methoxypropionate, ethyl 3-methoxypropionate, N-methyl-2-pyrrolidone, N,N-dimethylformamide, N,N-dimethylacetamide, cyclohexanone, methyl ethyl ketone, 2-heptanone, 1,4-dioxane, diethylene glycol monomethyl ether, diethylene glycol dimethyl ether, and ethylene glycol monoisopropyl ether.

The ratio of the photoacid generator to the polymer composition in the resist material according to the present invention is 1–30 to 100, preferably 1–20 to 100 in parts by weight. The amount of the solvent in the resist material is not limited as far as it gives no impediment when a positive resist material obtained by dissolving the polymers of this invention, a photoacid generator(s) and other additives is coated on a substrate, but usually the solvent is used in an amount of 1–20 parts by weight, preferably 1.5–10 parts by weight to one part by weight of the polymers.

The resist material of the present invention basically comprises said three components (polymer composition of this invention, photoacid generator and solvent), but it may contain other substances such as ultraviolet absorber and acidic compound for the specific purposes such as improvement of side wall configuration or eliminating footing of the pattern or scumming between the substrate and the interface. Also, a surfactant may be contained for the purpose of improving film forming properties or improving wettability and striation resistance.

Ultraviolet absorbers (or absorbents) usable in the resist material of the present invention include 9-diazofluorene and its derivatives, 1-diazo-2-tetralone, 2-diazo-1-tetralone, 9-diazo-10-phenanthrone, 2,2',4,4'-tetrakis(o-naphthoquinonediazido-4-sulfonyloxy)-benzophenone, 2,2', 4,4'-tetrahydroxybenzophenone, 1,2,3-tris(o-naphthoquinonediazido-4-sulfonyloxy)propan e, 9-(2-methoxyethoxy)methylanthracene, 9-(2-ethoxyethoxy) methylanthracene, 9-(4-methoxybutoxy)methylanthracene, 9-anthracenemethyl acetate, dihydroxyflavanone, quercetin, trihydroxyflavanone, tetrahydroxyflavanone, 4,6-dihydroxy-2-naphthobenzophenone, 4,4'-dihydroxybenzophenone, 2,2',4,4'-tetrahydroxybenzophenone and the like, but it is preferred to use 9-diazo-10-phenanthrone represented by the formula [31]:

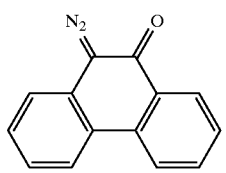

[31]

which has strong absorption at around 248.4 nm, or an anthracene derivative represented by the formula [32]:

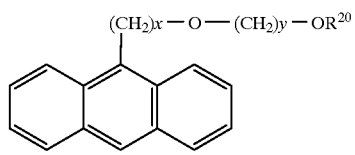

[32]

[wherein $R^{20}$ is an alkyl group, and x and y are independently a natural number of 1 to 4].

The alkyl groups represented by $R^{20}$ in the formula [32] may be linear, branched or cyclic and preferably have 1 to 6 carbon atoms, examples of such alkyl groups including methyl, ethyl, n-propyl, isopropyl, cyclopropyl, n-butyl, isobutyl, tert-butyl, sec-butyl, n-pentyl, isopentyl, tert-pentyl, 1-methylpentyl, cyclopentyl, n-hexyl, isohexyl and cyclohexyl.

Examples of the acidic compound used optionally in the resist material of the present invention include organic acids such as phthalic acid, succinic acid, malonic acid, benzoic acid, salicylic acid, m-hydroxybenzoic acid, p-hydroxybenzoic acid, o-acetylbenzoic acid, o-acetyloxybenzoic acid, o-nitrobenzoic acid, thiosalicylic acid and thionicotinic acid, salicylaldehyde, salicylhydroxamic acid, succinimide, phthalimide, saccharine, and ascorbic acid.

As surfactant, there can be used nonionic surfactant such as polyethylene glycol distearate, polyethylene glycol dilaurate, polyethylene glycol, polypropylene glycol, polyoxyethylene stearyl ether, polyoxyethylene lauryl ether, polyoxyethylene cetyl ether, polyoxyethylene nonyl ether and polyoxyethylene octyl phenyl ether as well as various other commercially available nonionic surfactant, fluorine-containing nonionic surfactants, fluorine-containing cationic surfactants, fluorine-containing anionic surfactants, cationic surfactant and anionic surfactant. Of these surfactant, the fluorine-containing nonionic surfactant having good resist film forming properties, such as Fluorad (a trade name, available from Sumitomo 3M, Ltd.), SURFLON (a trade name, available from Asahi Glass Co., Ltd.), UNIDYNE (a trade name, available from Daikin Industries, Ltd.), MEGA-FAC (a trade name, available from Dainippon Ink & Chemicals, Incorp.) and EFTOP (a trade name, available from Tohken Products Corp.), are preferably used in the present invention.

In the resist material of the present invention may further be contained a sensitivity adjustor commonly used in this field, such as polyvinylpyridine, poly(vinylpyridine/methyl methacrylate), pyridine, piperidine, tri-n-propylamine, tri-n-butylamine, trioctylamine, tribenzylamine, dicyclohexylamine, dicyclohexylmethylamine, tetramethylammonium hydroxide, tetraethylammonium hydroxide, tetra-n-propylammonium hydroxide, tetra-n-butylammonium hydroxide, triethylamine and N-methyl-2-pyrrolidone, and a plasticizer such as diethyl phthalate, dibutyl phthalate and dipropyl phthalate.

The resist material of the present invention may be applied on either a semiconductor substrate or a semiconductor substrate having a radiation absorptive coating, the latter being preferred for the reason of greater effect.

Various materials such as aluminum, polysilicon, aluminum-silicon, tungsten silicide, etc., can be used for the semiconductor substrate. A radiation absorptive coating can be formed on such a semiconductor substrate by known methods such as chemical vapor deposition (CVD) or sputtering using a radiation absorptive film forming material such as $Si_3N_4$ and $Ti_3N_4$, or an inorganic antireflection film forming material such as SiON, amorphous carbon, etc.

For forming a pattern by using a resist material comprising the novel polymer composition according to the present invention, the following process is suited.

A resist material comprising the novel polymer composition according to the present invention is coated on a semiconductor substrate such as silicone wafer or a semiconductor substrate having a radiation absorptive film on its surface to a coating thickness of approximately 0.5 to 2.0 $\mu$m (approximately 0.1 to 0.5 $\mu$m in case the coating is used as the top layer of a three-layer structure) and prebaked in an oven at 70–130° C. for 10–30 minutes or on a hot plate at 70–150° C. for 1–2 minutes. Then a mask designed to form the desired pattern is placed over the resist film, and actinic radiation such as deep ultraviolet light with a wavelength of not greater than 300 nm is applied thereto at an exposure dose of about 1–100 mJ/cm$^2$, followed by baking on a hot plate at 70–150° C. for 1–2 minutes. Then development is carried out by a conventional method such as dipping, paddling, spraying, etc., using a suitable developer such as a 0.1–5% aqueous solution of tetramethylammonium hydroxide (TMAH) for a period of about 0.5–3 minutes to form the desired pattern on the substrate.

As the developer, it is recommended to select an alkaline solution of a suitable concentration, usually in the range of 0.01–20%, which is capable of enlarging the difference in solubility between the exposed and unexposed portions, in consideration of the solubility of the resist material. As the alkaline solution, there can be used, for instance, an aqueous solution containing an organic amine such as TMAH, choline or triethanolamine, or an inorganic alkali such NaOH or KOH.

The polymer composition of the present invention, in use thereof for a resist material, is characterized in that it comprises a combination of a polymer of the formula [1] and a polymer of the formula [2] which is smaller in weight-average molecular weight than the polymer of the formula [1], or a combination of a polymer of the formula [1] and a phenolic compound having a molecular weight (Mw) of 300 to 15,000, or a combination of a polymer of the formula [1], a polymer of the formula [2] and a phenolic compound having a molecular weight (Mw) of 300 to 15,000. Regarding the polymers of the formula [1], it is remarkable that as they contain in their structure the monomer units of the formula [4] having a functional group of the formula [3] as mentioned above, these polymers have a tendency to become alkali-soluble by eliminating the functional group more easily in the presence of an acid than other polymers used for the same purpose, and this is instrumental in providing higher resolution and allowing maintenance of the stabilized pattern dimensions during the period from exposure till heat treatment (baking). Further, as these polymers also contain the hydroxy styrene units of the formula [5] as another structural constituent, they have high heat resistance, adaptability to dry etching and high adhesiveness to the substrate. As for the polymers of the formula [2], it is notable that as they comprise a combination of the monomer unit of the formula [7] and the monomer unit of the formula [9] in a properly adjusted molar ratio, these polymers serve for improving focus margin by controlling the developing speed at the exposed portion while improving mask linearity. They also have the effect of smoothening the pattern side wall.

Also, it is surprising that the combination of a polymer of the formula [1], a phenolic compound having a molecular weight (Mw) of 300–15,000 and/or a polymer of the formula

[2] has made it possible to solve the problem of substrate dependency in addition to achievement of the above-described effects.

Among the monomer units of the formula [7], there are those which can eliminate the functional groups relatively easily in the presence of an acid to convert into a hydroxystyrene unit soluble in the alkaline developer (for example, the monomer units of the formula [7] wherein $R^7$ is tert-butyloxy group, tetrahydrofuranyloxy group, tetrahydropyranyloxy group, tert-butoxycarbonyloxy group, tert-butoxycarbonylmethyloxy group, 1-methylcyclohexylcarbonylmethyloxy group or such), but in the present invention, since the monomer unit of the formula [4] having a functional group of the formula [3] can far more fastly and easily eliminate the functional groups under the action of an acid to become a hydroxystyrene unit, the monomer units of the formula [7] take absolutely or substantially no part in chemical amplification.

The remarkable effect of the present invention resides in the fact that by combining at least one polymer of the formula [1], at least one polymer of the formula [2] and/or at least one phenolic compound having a molecular weight (Mw) of 300 to 15,000, and further combining therewith a specific photoacid generator disclosed above, it was made possible to solve the various problems in conventional resist pattern formation using deep ultraviolet light, KrF excimer laser beams or such and to provide a resist material that can safely be worked with deep ultraviolet light or KrF excimer laser beams.

It has been confirmed that the resist material according to the present invention can be chemically amplified by generating an acid not only by exposure to deep ultraviolet light or KrF excimer laser beams but also by i-line light, electron beams or soft X-ray irradiation. Thus, the resist material of the present invention is capable of forming a desired pattern by deep ultraviolet light, KrF excimer laser beams, i-line light, electron beams or soft X-ray irradiation methods by making use of the chemically amplified nature of the material.

The present invention is further elucidated from its operational aspect. When the resist material of the present invention is exposed to actinic radiation such as KrF excimer laser beams or deep ultraviolet light, an acid is generated at the exposed region according to a light reaction scheme illustrated by the following formula 1, 2, 3, 4 or 5:

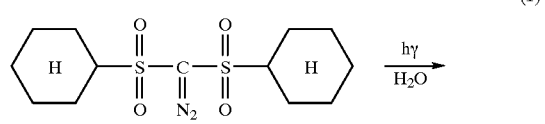

(1)

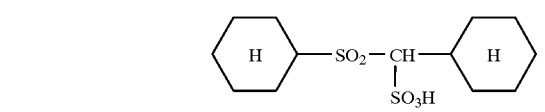

(2)

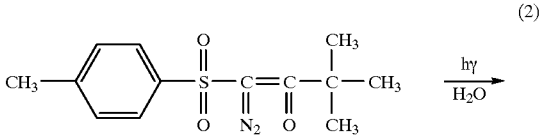

(3)

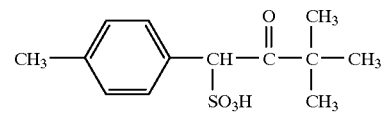

(4)

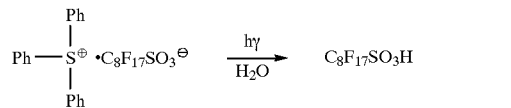

(5)

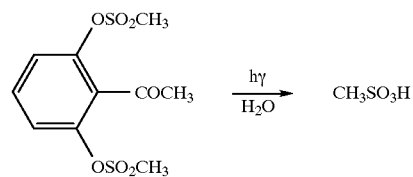

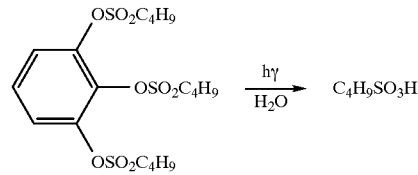

Heat treatment follows the above exposure step to cause a reaction of the following formula 6:

(6)

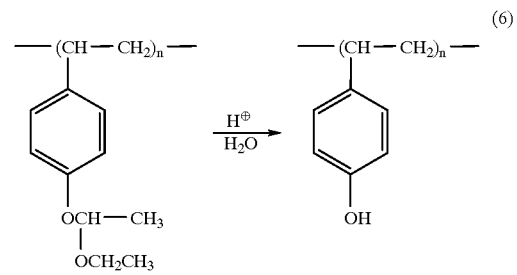

whereby the specific functional group (1-ethoxyethoxy group in the formula 6) of the polymer of this invention undergoes a chemical change under the action of an acid to become a hydroxyl group, with the result that this polymer becomes alkali-soluble and is eluted out in the developer in the developing step.

On the other hand, no chemical change takes place at the unexposed portion since no acid is generated in this area even when heat treatment is conducted. Further, the hydrophilic moiety of the polymer used for the purpose of enhancing substrate adhesiveness is rather protected by the photoacid generator from wetting by the alkaline developer. Thus, when pattern formation is carried out by using the resist material of the present invention, there is produced a large difference in alkaline developer solubility between the exposed and unexposed portions, and because of this coupled with the fact the polymer at the unexposed portion has strong adhesiveness to the substrate, there won't take place film peeling or delatimation during development and consequently a positive pattern having a good contrast can be obtained. Also, since the acid generated by exposure acts catalytically as illustrated in the formula 6, exposure dose can be limited to a degree only sufficient for generating a desired acid, allowing reduction of the amount of energy required for exposure.

The present invention will be described in further detail by showing Examples, Preparation Examples, and Comparative Examples.

Part of the polymers, photoacid generators and ultraviolet absorbers used in the Examples and Comparative Examples have been synthesized according to the methods disclosed in JP-A 4-210960 (U.S. Pat. No. 5,216,135); JP-A 4-211258 (U.S. Pat. No. 5,350,660; EP-A 0,440,374); JP-A 5-249682 (EP-A 0,520,642); JP-A 4-251259; Bull. Chim. Soc. France, Vol. 1974, p. 1956; C.D. Beard et al: J. Org. Chem., Vol. 38, p. 3673 (1973), etc., the disclosure of which is hereby incorporated by reference.

PREPARATION EXAMPLE 1

Synthesis of poly(p-1-ethoxyethoxystyrene/p-hydroxystyrene/p-methylstyrene)

(1) To a solution of 100 g (0.567 mol) of p-tert-butoxystyrene and 3.54 g (0.03 mol) of p-methylstyrene in 300 ml of 1,4-dioxane was added a catalytic amount of 2,2'-azobis(methyl 2-methylpropionate) to carry out reaction in a nitrogen stream at 80° for 6 hours. The reaction solution was cooled and poured into 5,000 ml of a methanol solution to cause crystallization. Precipitated crystals were filtered out, washed with methanol and dried in vacuo to give 92.3 g of poly-(p-tert-butoxystyrene/p-methylstyrene)as white powder. The polymer was found to have p-tert-butoxystyrene unit and p-methylstyrene unit in a molar ratio of ca. 95:5 based on $^1$H NMR. The weight-average molecular weight (Mw) was determined to be about 20,000 by GPC with polystyrene calibration.

(2) 70 g of poly(p-tert-butoxystyrene/p-methylstyrene) obtained according to (1) above was dissolved in 1,4-dioxane, then 100 ml of concentrated hydrochloric acid was added and the mixture was reacted with stirring at 70–80° C. for 4 hours. The reaction solution, after cooled, was poured into 5,000 ml of water to cause crystallization. Produced crystals were filtered out, washed with water and dried in vacuo to give 4.6 g of poly(p-hydroxystyrene/p-methylstyrene) as white powder. P-hydroxystyrene unit/p-methylstyrene unit molar ratio in the produced polymer≈95:5 ($^1$H NMR). Mw≈14,500 (GPC with polystyrene calibration).

(3) To a solution of 15.0 g of poly(p-hydroxystyrene/p-methylstyrene) obtained according to (2) and 3.5 g of ethylvinyl ether in 150 ml of 1,4-dioxane was added a catalytic amount of pyridinium salt of p-toluenesulfonic acid to carry out reaction with stirring at room temperature for 24 hours. The reaction solution was poured into 5,000 ml of water and crystallized. Precipitated crystals were filtered out, washed with water and dried in vacuo to give 11.5 g of poly(p-1-ethoxyethoxystyrene/p-hydroxystyrene/p-methylstyrene) as white powder. The p-1-ethoxyethoxystyrene unit/p-hydroxystyrene unit/p-methylstyrene unit molar ratio in the polymer was ca. 35:60:5 based on $^1$H NMR. Mw≈18,000; Mw/Mn≈1.86 (GPC with polystyrene calibration).

PREPARATION EXAMPLE 2

Synthesis of poly(p-1-ethoxyethoxystyrene/p-hydroxystyrene/styrene)

(1) Using 81.1 g (0.46 mol) of p-tert-butoxystyrene and 4.6 g (0.04 mol) of styrene as starting materials, polymerization reaction and after-treatments were carried out according to the procedure of (1) of Preparation Example 1 to give 77.1 g of poly(p-tert-butoxystyrene/styrene) as white powdery crystal. P-tert-butoxystyrene unit/styrene unit molar ratio in the polymer≈92:8 ($^1$H NMR). Mw≈20,000 (GPC with polystyrene calibration).

(2) Using 70 g of poly(p-tert-butoxystyrene/styrene) obtained according to (1) above, the procedure of (2) of Preparation Example 1 was carried out for reaction and after-treatments to obtain 44.0 g of poly(p-hydroxystyrene/styrene) as white powdery crystal. P-hydroxystyrene unit/styrene unit molar ratio in the polymer≈92:8 ($^1$H NMR). Mw≈15,00 (GPC with polystyrene calibration).

(3) Using 15.0 g of poly(p-hydroxystyrene/styrene) obtained according to (2) above and 3.2 g of vinylethyl ether, the procedure of (3) of Preparation Example 1 was carried out for reaction and after-treatments to give 14.1 g of poly(p-1-ethoxyethoxystyrene/p-hydroxystyrene/styrene) as white powdery crystals. P-1-ethoxyethoxystyrene unit/p-hydroxystyrene unit/styrene unit molar ratio in the polymer≈32:60:8 ($^1$H NMR). Mw≈18,000; Mw/Mn≈1.85 (GPC with polystyrene calibration).

PREPARATION EXAMPLE 3

Synthesis of poly(p-1-ethoxyethoxystyrene/p-hydroxystyrene/p-tert-butoxystyrene)

(1) To a solution of 17.6 g of p-tert-butoxystyrene in 50 ml of iso-propanol was added a catalytic amount of 2,2'-azobis(methyl 2-methylpropionate) to carry out reaction in a nitrogen stream at 80° C. for 6 hours. The reaction solution was cooled and poured into 1,000 ml of a methanol solution to cause crystallization. Produced crystals were filtered out, washed with methanol and dried in vacuo to give 16.7 g of poly(p-tert-butoxystyrene) as white powdery crystal. Mw≈20,000 (GPC with polystyrene calibration).

(2) 15.0 g of poly(p-tert-butoxystyrene) obtained according to (1) above was suspended in iso-propanol, then 15 ml of concentrated hydrochloric acid was added and the mixture wasreacted with stirring at 70–80° C. for 4 hours. The reaction solution was cooled and poured into 1,000 ml of water for crystallization. Precipitated crystals were filtered out, washed with water and dried in vacuo to give 9.4 g of poly(p-hydroxystyrene/p-tert-butoxystyrene) as white powdery crystal. P-hydroxystyrene unit/p-tert-butoxystyrene unit molar ratio in the polymer≈94:6 ($^1$H NMR). Mw≈15,000 (GPC with polystyrene calibration).

(3) 15.7 g of poly(p-hydroxystyrene/p-tert-butoxystyrene) obtained according to (2) above and 3.2 g of ethylvinyl ether were dissolved in 140 ml of 1,4-dioxane, to which a catalytic amount of pyridinium salt of p-toluenesulfonic acid was added to perform reaction with stirring at room temperature for 24 hours. The reaction solution was poured into 3,000 ml of water and crystallized. Precipitated crystals were filtered out, washed with water and dried in vacuo to give 15.5 g of poly(p-1-ethoxyethoxystyrene/p-hydroxystyrene/p-tert-butoxystyrene) as white powdery crystal. P-1-ethoxyethoxystyrene unit/p-hydroxystyrene unit/p-tert-butoxystyrene unit molar ratio in the polymer≈30:64:6 ($^1$H NMR). Mw≈18,000; Mw/Mn=1.9 (GPC with polystyrene calibration).

PREPARATION EXAMPLE 4

Synthesis of poly(p-1-methoxy-1-methylethoxystyrene/p-hydroxystyrene/p-tert-butoxystyrene)

To a solution of 15.7 g of poly(p-1-methoxy-1-methylethoxystyrene/p-hydroxystyrene/p-tertbutoxystyrene obtained according to (2) above and 3.2 g of 2-methoxy-1-propene in 120 ml of tetrahydrofuran was added a catalytic amount of phosphorus oxychloride to carry out reaction with stirring at room temperature for 16 hours. The reaction solution was poured into 5,000 ml of water and crystallized. Precipitated crystals were filtered out, washed with water and dried in vacuo to give 14.3 g of poly(p-1-methoxy-1-methylethoxystyrene/p-hydroxystyrene/p-tert-butoxystyrene) as white powdery crystal. P-1-methoxy-1-methylethoxystyrene unit/p-hydroxystyrene unit/p-tert-butoxystyrene unit molar ratio in the polymer≈34:60:6 ($^1$H NMR). Mw≈17,800; Mw/Mn=1.90 (GPC with polystyrene calibration).

PREPARATION EXAMPLE 5

Synthesis of poly(p-1-ethoxyethoxystyrene/p-hydroxystyrene/p-tetrahydropyranyloxystyrene)

(1) Using 32.4 g of p-acetyloxystyrene as starting material, polymerization reaction and after-treatments were carried out according to (1) of Preparation Example 3 to obtain 30.0 g of poly(p-acetyloxy)styrene as white powdery crystal. Mw≈15,000 (GPC with polystyrene calibration).

(2) To a 1,4-dioxane solution of 16.2 g of poly(p-acetyloxystyrene) obtained according to (1) above was added 25 ml of concentrated hydrochloric acid and the mixture was refluxed with stirring for 4 hours. The reaction solution was cooled and poured into 1,000 ml of water to cause crystallization. Precipitated crystals were filtered out, washed with water and dried in vacuo to give 11.4 g of poly(p-hydroxystyrene) as white powder. Mw≈12,000 (GPC with polystyrene calibration).

(3) To a solution of 10.8 g of poly(p-hydroxystyrene) obtained according to (2) in 72 ml of 1,4-dioxane were added 1.2 g of 2,3-dihydropyran and 0.05 g of pyridine salt of p-toluenesulfonic acid to carry out reaction at 25–30° C. for 15 hours. The reaction solution was poured into 1,000 ml of water and crystallized. Precipitated crystals were filtered out, washed with water and dried in vacuo to give 10.0 g of poly(p-hydroxystyrene/p-tetrahydropyranyloxystyrene) as white powdery crystal. P-hydroxystyrene unit/p-tetrahydropyranyloxystyrene unit molar ratio in the polymer≈95:5 ($^1$H NMR). Mw≈13,000 (GPC with polystyrene calibration).

(4) Using 9.5 g of poly(p-hydroxystyrene/p-tetrahydropyranyloxystyrene) obtained according to (3) above and 2.7 g of ethylvinyl ether, reaction and after-treatments were carried out according to (3) of Preparation Example 3, and the produced crystals were filtered out, washed with water and dried in vacuo to give 9.9 g of poly(p-1-ethoxyethoxystyrene/p-hydroxystyrene/p-tetrahydropyranyloxystyrene) as white powdery crystal. P-1-ethoxyethoxystyrene unit/p-hydroxystyrene unit/p-tetrahydropyranyloxystyrene unit molar ratio in the polymer≈35:60:5 ($^1$H NMR). Mw≈16,000; Mw/Mn=1.78 (GPC with polystyrene calibration).

PREPARATION EXAMPLE 6

Synthesis of poly(p-1-ethoxyethoxystyrene/p-hydroxystyrene/p-tert-butoxycarbonyloxystyrene)

(1) 35.3 g of poly(p-tert-butoxystyrene) obtained according to (1) of Preparation Example 3 was suspended in iso-propanol, then 50 ml of concentrated hydrochloric acid was added and the mixture was refluxed with stirring for 4 hours. The reaction solution was cooled and poured into 3,000 ml of water for crystallization. Precipitated crystals were filtered out, washed with water and dried in vacuo to give 22.1 g of poly(p-hydroxystyrene) as white powdery crystals. Mw≈14,500 (GPC with polystyrene calibration).

(2) To a solution of 16.2 g of poly(p-hydroxystyrene) obtained according to (1) above in 60 ml of ethyl acetate were added 3.0 g of di-tert-butyl dicarbonate and 2.7 g of triethylamine to carry out reaction at room temperature for 4 hours. After the end of the reaction, ethyl acetate was distilled away under reduced pressure and the residue was dissolved in 80 ml of acetone and poured into 1,000 ml of water to cause crystallization. Precipitated crystals were filtered out, washed with water and dried in vacuo to give 12.0 g of poly(p-hydroxystyrene/p-tert-butoxycarbonyloxystyrene) as white powdery crystal. P-hydroxystyrene unit/p-tert-butoxycarbonyloxystyrene unit molar ratio≈94:6 ($^1$H NMR). Mw≈16,500 (GPC with polystyrene calibration).

(3) Using 11.4 g of poly(p-hydroxystyrene/p-tert-butoxycarbonyloxystyrene) obtained according to (2) above and 2.5 g of ethylvinyl ether, the procedure of (3) of Preparation Example 1 was carried out for reaction and after-treatments to obtain 6.7 g of poly(p-1-ethoxyethoxystyrene/p-hydroxystyrene/p-tert-butoxycarbonyloxystyrene) as white powdery crystal. P-1-ethoxyethoxystyrene unit/p-hydroxystyrene unit/p-tert-butoxycarbonyloxystyrene unit molar ratio in the polymer≈30:64:6 ($^1$H NMR). Mw≈20,000; Mw/Mn=1.90 (GPC with polystyrene calibration).

PREPARATION EXAMPLE 7

Synthesis of poly(p-1-methoxyethoxystyrene/p-hydroxystyrene/p-tert-butyl vinylphenoxyacetate)

(1) 16.2 g of poly(p-hydroxystyrene) obtained according to (1) of Preparation Example 6, 2.7 g of tert-butyl monochloroacetate and 2.5 g of anhydrous potassium carbonate were suspended in 200 ml of acetone and refluxed with stirring for 2 hours. After cooling, the insolubles were filtered out and the filtrate was poured into 3,000 ml of water and crystallized. Produced crystals were filtered out, washed with water and dried in vacuo to give 15.8 g of poly(p-hydroxystyrene)/p-tert-butyl vinylphenoxyacetate) as white powdery crystal. P-hydroxystyrene unit/p-tert-butyl vinylphenoxyacetate unit molar ratio in the polymer≈93:7 ($^1$H NMR). Mw≈1 16,000 (GPC with polystyrene calibration).

(2) Using 13.2 g of poly(p-hydroxystyrene/p-tert-butyl vinylphenoxyacetate) obtained according to (1) above and 2.0 g of methylvinyl ether, the procedure of (3) of Preparation Example 1 was carried out to obtain 10.6 g of poly(p-1-methoxyethoxystyrene/p-hydroxystyrene/p-tert-butyl vinylphenoxyacetate) as white powdery crystal. P-1-methoxyethoxystyrene unit/p-hydroxystyrene unit/p-tert-butyl vinylphenoxyacetate unit molar ratio in the obtained polymer≈33:60:7 ($^1$H NMR). Mw≈19,500; Mw/Mn=1.88 (GPC with polystyrene calibration).

PREPARATION EXAMPLE 8

Synthesis of poly(p-1-ethoxyethoxystyrene/p-hydroxystyrene)

Using 8 g of poly(p-hydroxystyrene) obtained according to (1) of Preparation Example 6 and 2.4 g of ethylvinyl ether, reaction and after-treatments were carried out according to (3) of Preparation Example 1 to give 9.2 g of poly(p-1- ethoxyethoxystyrene/p-hydroxystyrene) as faintly brown-tinted powdery crystal. P-1-ethoxyethoxystyrene unit/p-hydroxystyrene unit molar ratio in the polymer≈38:62 ($^1$H NMR). Mw≈18,500; Mw/Mn=1.88 (GPC with polystyrene calibration).

PREPARATION EXAMPLE 9

Synthesis of poly(p-1-methoxyethoxystyrene/p-hydroxystyrene)

Using 8 g of poly(p-hydroxystyrene) obtained according to (1) of Preparation Example 6 and 2.2 g of methylvinyl ether, the procedure of (3) of Preparation Example 1 was carried out for reaction and after-treatments to give 8.6 g of poly(p-1-methoxyethoxystyrene/p-hydroxystyrene) as faintly brown-tinted powdery crystal. P-1-methoxyethoxystyrene unit/p-hydroxystyrene unit molar ratio in the polymer≈4:6 ($^1$H NMR). Mw≈18,000; Mw/Mn=1.89 (GPC with polystyrene calibration).

PREPARATION EXAMPLE 10

Synthesis of poly(p-tetrahydropyranyloxystyrene/p-hydroxystyrene)

(1) To a solution of 17.6 g of p-tert-butoxystyrene in toluene was added a catalytic amount of 2,2'-azobisisobutyronitrile to carry out polymerization reaction in a nitrogen stream at 80° C. for 6 hours. The reaction solution was cooled and poured into 1,000 ml of methanol to cause crystallization. Precipitated crystals were filtered out, washed with methanol and dried in vacuo to give 16.8 g of poly(p-tert-butoxystyrene) as white powdery crystal. Mw≈1,000 (GPC with polystyrene calibration).

(2) To a 1,4-dioxane solution of 15.0 g of poly(p-tert-butoxystyrene) obtained according to (1) above was added 10 ml of concentrated hydrochloric acid and the mixture was refluxed with stirring for 4 hours. The reaction solution was poured into 1,000 ml of water and crystallized. Precipitated crystals were filtered out, washed with water and dried in vacuo to give 9.7 g of poly(p-hydroxystyrene) as white powdery crystal. Mw≈7,500 (GPC with polystyrene calibration).

(3) To a solution of 9.0 g of poly(p-hydroxystyrene) obtained according to (2) above in 100 ml of 1,2-dimethoxyethane were added 12.6 g of 2,3-dihydropyran and 0.5 ml of sulfuric acid to carry out reaction with stirring at 30–40° C. for 15 hours. The reaction solution was concentrated under reduced pressure and the residue was neutralized with sodium carbonate and poured into 1,000 ml of water to cause crystallization. Precipitated crystals were filtered out, washed with water and dried in vacuo to give 11.0 g of poly(p-tetrahydropyranloxystyrene/p-hydroxystyrene) as white powdery crystal. P-tetrahydropyranyloxystyrene unit/p-hydroxystyrene unit molar ratio in the polymer≈3:7 ($^1$H NMR). Mw≈10,000; Mw/Mn=1.60 (PGC with polystyrene calibration).

PREPARATION EXAMPLE 11

Synthesis of poly(p-tert-butoxycarbonyloxystyrene/p-hydroxystyrene)

Using 18.0 g of poly(p-hydroxystyrene) obtained according to (2) of Preparation Example 10, 10.6 g of di-tert-butyl dicarbonate and 18.0 g of triethylamine, the procedure of (2) of Preparation Example 6 was followed to obtain 18.2 g of poly(p-tert-butoxycarbonyloxystyrene/p-hydroxystyrene) as white powdery crystal. P-tert-butoxycarbonyloxystyrene unit/p-hydroxystyrene unit molar ratio in the polymer≈3.7 ($^1$H NMR). Mw≈10,000; Mw/Mn=1.65 (GPC with polystyrene calibration).

PREPARATION EXAMPLE 12

Synthesis of poly(p-tert-butoxystyrene/p-hydroxystyrene)

To a 1,4-dioxane solution of 15.0 g of poly(p-tert-butoxystyrene) obtained according to (1) of Preparation Example 10 was added 10 ml of concentrated hydrochloric acid to carry out reaction with stirring at 80–85° C. for 3 hours. The reaction solution was cooled and poured into water to cause crystallization. Precipitated crystals were filtered out, washed with water and dried in vacuo to give 9.8 g of poly(p-tert-butoxystyrene/p-hydroxystyrene) as white powdery crystal. P-tert-butoxystyrene unit/p-hydroxystyrene unit molar ratio in the polymer≈3:7 ($^1$H NMR). Mw≈8,500; Mw/Mn=1.65 (GPC with polystyrene calibration).

PREPARATION EXAMPLE 13

Synthesis of poly(p-tert-butoxycarbonyloxystyrene/p-hydroxystyrene)

(1) Using 17.6 g of p-tert-butoxystyrene, polymerization was carried out and the reaction solution was treated according to (1) of Preparation Example 10 to obtain 12.5 g of poly(p-tert-butoxystyrene) as white powdery crystal. Mw≈3,500 (GPC with polystyrene calibration).

(2) Using 12.0 g of poly(p-tert-butoxystyrene) obtained according to (1) above, the procedure of (2) of Preparation Example 10 was followed to obtain 8.2 g of poly(p-hydroxystyrene) as white powdery crystal. Mw≈3,000 (GPC with polystyrene calibration).

(3) Using 8.0 g of poly(p-hydroxystyrene) obtained according to (2) above, the procedure of (2) of Preparation Example 6 was carried out for reaction and after-treatments to give 7.6 g of poly(p-tert-butoxycarbonyloxystyrene/p-hydroxystyrene) as faintly brown-tinted powdery crystals. P-tert-butoxycarbonyloxystyrene unit/p-hydroxystyrene unit molar ratio in the polymer≈3:7 ($^1$H NMR). Mw≈4,000; Mw/Mn=1.60 (GPC with polystyrene calibration).

PREPARATION EXAMPLE 14

Synthesis of poly(p-tert-butyl vinylphenoxyacetate/p-hydroxystyrene)

4.0 g of poly(p-hydroxystyrene) obtained according to (2) of Preparation Example 10, 2.5 g of tert-butyl monochloroacetate and 2.5 g of anhydrous potassium carbonate were suspended in 35 ml of acetone and refluxed with stirring for 2 hours. After cooling, the insolubles were filtered out and the filtrate was pouted into 1,000 ml of water to cause crystallization. Precipitated crystals were filtered out, washed with water and dried in vacuo to give 5.2 g of poly(p-tert-butyl vinylphenoxyacetate/p-hydroxystyrene) as white powdery crystal. P-tert-butyl phenoxyacetate unit/p-hydroxystyrene unit molar ratio in the polymer≈35:65 ($^1$H NMR). Mw≈11,000; Mw/Mn=1.65 (GPC with polystyrene calibration).

PREPARATION EXAMPLE 15

Synthesis of poly(p-1-ethoxyethoxystyrene/p-hydroxystyrene/fumaronitrile)

(1) 33.4 g (0.19 mol) of p-tert-butoxystyrene and 0.8 g (0.01 mol) of fumaronitrile were polymerized in toluene in the presence of a catalytic amount of 2,2'-azobis(methyl 2-methylpropionate) in a nitrogen stream at 90° C. for 2 hours. The reaction solution was poured into methanol to cause crystallization. Precipitated crystals were filtered out, washed and dried to give 23.5 g of poly(p-tert-butoxystyrene/fumaronitrile) as white powdery crystal. Mw≈24,500 (GPC with polystyrene calibration).

(2) Using 20.0 g of poly(p-tert-butoxystyrene/fumaronitrile) obtained according to (1) above, the procedure of (2) of Preparation Example 1 was carried out for reaction and after-treatments to obtain 10.9 g of poly(p-hydroxystyrene/fumaronitrile) as white powdery crystal. Mw≈16,500 (GPC with polystyrene calibration).

(3) Using 9.0 g of poly(p-hydroxystyrene/fumaronitrile) obtained according to (2) above and 2.8 g of ethylvinyl ether, the procedure of (3) of Preparation Example 1 was carried out for reaction and after-treatments to obtain 8.3 g of poly(p-1-ethoxyethoxystyrene/p-hydroxystyrene/fumaronitrile) as white powdery crystal. P-1-ethoxyethoxystyrene unit/p-hydroxystyrene unit molar ratio in the polymer≈3:7 ($^1$H NMR). Mw≈20,000; Mw/Mn=1.85 (GPC with polystyrene calibration).

PREPARATION EXAMPLE 16

Synthesis of poly(p-1-ethoxyethoxystyrene/p-hydroxystyrene)

(1) Using 15.9 g of poly(p-tert-butoxystyrene) [Mw≈20,000; Mw/Mn=1.2 (GPC with polystyrene calibration); produced by Nippon Soda Co., Ltd.], the procedure of (1) of Preparation Example 6 was carried out for reaction and after-treatments to obtain 10.5 g of white powdered crystals of poly(p-hydroxystyrene) with Mw≈14,000 (GPC method, polystyrene calibration).

(2) Using 8 g of the monodisperse poly(p-hydroxystyrene) obtained in above (1) and 2.4 g of ethyl vinyl ether, the reaction and after-treatment were carried out in the same manner as described in Preparation Exaple 1 (3) to obtain 9.0 g of poly(p-1-ethoxyethoxystyrene/p-hydroxystyrene) as white powdery crystals. P-1-ethoxyethoxystyrene unit/p-hydroxystyrene unit molar ratio in the polymer≈35:65. Mw≈17,500; Mw/Mn=1.15 (GPC with polystyrene calibration).

PREPARATION EXAMPLE 17

Synthesis of poly(p-isobutoxycarbonyloxystyrene/p-hydroxystyrene)

Using 18.0 g of poly(p-hydroxystyrene) [Mw≈10,000; Mw/Mn=1.1 (GPC with polystyrene calibration); produced by Nippon Soda Co., Ltd.], 10.6 g of diisobutyl dicarbonate synthesized from isobutyl chlorocarbonate and potassium carbonate, the procedure of (2) of Preparation Example 6 was carried out for reaction and after-treatments to give 16.5 g of poly(p-isobutoxycarbonyloxystyrene/p-hydroxystyrene) as faintly brown-tinted powdery crystals. P-isobutoxycarbonyloxystyrene unit/p-hydroxystyrene unit molar ratio in the polymer≈28:72 ($^1$H NMR). Mw≈13,000; Mw/Mn=1.05 (GPC with polystyrene calibration).

PREPARATION EXAMPLE 18

Synthesis of poly(p-ethoxycarbonyloxystyrene/p-hydroxystyrene)

(1) To a toluene solution of 17.6 g of p-tert-butoxystyrene was added a catalytic amount of 2,2'-azobis(2,4-dimethylvaleronitrile) to carry out polymerization reaction in a nitrogen stream at 70° for 6 hours. The reaction solution was treated according to (1) of Preparation Example 10 to obtain 16.5 g of poly(p-tert-butoxystyrene) as white powdery crystal. Mw≈9,500 (GPC with polystyrene calibration).

(2) Using 15.0 g of poly(p-tert-butoxystyrene) obtained according to (1) above, the procedure of (2) of Preparation Example 10 was carried out to obtain 9.0 g of poly(p-hydroxystyrene) as white powdery crystal. Mw≈7,000 (GPC with polystyrene calibration).

(3) Using 9.0 g of poly(p-hydroxystyrene) obtained according to (2) above and 4.0 g of diethyl pyrocarbonate, the procedure of (2) of Preparation Example 6 was followed to obtain 9.0 g of poly(p-ethoxycarbonyloxystyrene/p-hydroxystyrene) as white powdery crystal. P-ethoxycarbonyloxystyrene unit/p-hydroxystyrene unit molar ratio≈3:7 ($^1$H NMR). Mw≈9,000; Mw/Mn=1.60 (GPC with polystyrene calibration).

PREPARATION EXAMPLE 19

Synthesis of poly(p-isoproxycarbonyloxystyrene/p-hydroxystyrene)

Using 12.0 g of poly(p-hydroxystyrene) obtained according to (2) of Preparation Example 18 and 4.5 g of isopropyl chlorocarbonate, the procedure of (2) of Preparation Example 6 was carried out to obtain 11.7 g of poly(p-isopropoxycarbonyloxystyrene/p-hydroxystyrene) as white powdery crystals. P-isopropoxycarbonyloxystyrene unit/p-hydroxystyrene unit molar ratio in the polymer≈3:7 ($^1$H NMR). Mw≈9,000; Mw/Mn=1.64 (GPC with polystyrene calibration).

PREPARATION EXAMPLE 20

Synthesis of poly(p-tert-butoxycarbonyloxystyrene/p-hydroxystyrene)

Using 18.0 g of poly(p-hydroxystyrene) obtained according to (1) of Preparation Example 6 and 10.6 g of di-tert-butyl dicarbonate, the procedure of (2) of Preparation Example 6 was carried out to obtain 18.2 g of poly(p-tert-butoxycarbonyloxystyrene/p-hydroxystyrene) as white powdery crystals. P-tert-butoxycarbonyloxystyrene unit/p-hydroxystyrene unit molar ratio in the polymer≈28:72. Mw≈19,000; Mw/Mn=1.85 (GPC with polystyrene calibration).

PREPARATION EXAMPLE 21

Synthesis of poly(p-1-ethoxyethoxystyrene/p-hydroxystyrene)

Using 16.0 g of poly(p-hydroxystyrene) obtained according to (2) of Preparation Example 10 and 4.5 g of vinylethyl ether, the procedure of (3) of Preparation Example 1 was carried out to obtain 15.5 g of poly(p-1-ethoxyethoxystyrene/p-hydroxystyrene). P-1-ethoxyethoxystyrene unit/p-hydroxystyrene unit molar ratio in the polymer≈38:62. Mw≈9,500; Mw/Mn=1.65 (GPC with polystyrene calibration).

PREPARATION EXAMPLE 22

Synthesis of poly(p-1-ethoxyethoxystyrene/p-hydroxystyrene/p-tert-butoxystyrene)

(1) Using 48.6 g (0.3 mol) of p-acetyloxystyrene, 17.6 g (0.1 mol) of p-tert-butoxystyrene and a catalytic amount of 2,2'-azobis(2-methylisovaleronitrile), the procedure of (1) of Preparation Example 3 was carried out for reaction and after-treatments to obtain 59.7 g of poly(p-tert-butoxystyrene/p-acetyloxystyrene) as white powdery crystal. P-acetyoxystyrene unit/p-tert-butoxystyrene unit molar ratio in the polymer≈3:1 ($^1$NMR). Mw≈10,500; Mw/Mn=1.32 (GPC with polystyrene calibration).

(2) A mixture of 46.3 g of poly(p-acetyloxystyrene/p-tert-butoxystyrene) obtained according to (1) above and 100 ml of a 16% aqueous solution of tetramethylammonium hydroxide was refluxed with stirring in 300 ml of isopropanol for 4 hours. The reaction solution was neutralized with acetic acid and concentrated under reduced pressure, and the residue was dissolved in 150 ml of acetone and poured into 5,000 ml of water to cause crystallization. Precipitated crystals were filtered out, washed with water and dried in vacuo to give 33.8 g of poly(p-hydroxystyrene/p-tert-butoxystyrene). P-hydroxystyrene unit/p-tert-butoxystyrene unit molar ratio in the polymer≈3:1 (1HNMR). Mw≈8,540; Mw/Mn=1.30 (GPC with polystyrene calibration).

(3) Using 26.8 g of poly(p-hydroxystyrene/p-tert-butoxystyrene) obtained according to (2) above and 1.5 g of ethylvinyl ether, reaction and after-treatments were carried out according to (3) of Preparation Example 1 to obtain 25.0 g of poly(p-1-ethoxystyrene/p-hydroxystyrene/p-tert-butoxystyrene) as white powdery crystal. P-1-ethoxyethoxystyrene unit/p-hydroxystyrene unit/p-tert-butoxystyrene unit molar ratio in the polymer≈10:65:25. Mw≈19,200; Mw/Mn=1.30 (GPC with polystyrene calibration).

PREPARATION EXAMPLE 23

Synthesis of p-cresol/m-cresol/formaldehyde polycondensate (Mw=800)

To a mixed solution of 60.0 g (0.55 mol) of p-cresol, 60.0 g (0.55 mol) of m-cresol and 2.4 g of oxalic acid dihydrate was added dropwise 33.7 g (0.42 mol) of a 37% formaldehyde solution with stirring at 100° C., and the mixture was reacted with stirring at 100±50° C. for 4 hours. After the end of the reaction, 2,000 ml of water was poured into the reaction solution to cause precipitation. After removing the supernatant by decantation, the precipitate was dissolved in 120 ml of acetone and 1,200 ml of water was poured into the solution to cause precipitation. After the supernatant has been decanted, the solution was evaporated to dryness under reduced pressure to give 74.5 g of residual p-cresol/m-cresol/formaldehyde polycondensate as faintly yellow-tinted waxy crystals. Mw≈880; Mw/Mn=2.07 (GPC with polystyrene calibration).

PREPARATION EXAMPLE 24

Synthesis of p-cresol/m-cresol/formaldehyde polycondensate (Mw=1,500)

Using 60.0 g (0.55 mol) of p-cresol, 60.0 g (0.55 mol) of m-cresol and 45.0 g (0.55 mol) of a 37% formaldehyde solution, the procedure of Preparation Example 23 was carried out for reaction and after-treatments to obtain 90.4 g of p-cresol/m-cresol/formaldehyde polycondensate as faintly yellow-tinted waxy crystals. Mw≈1,580; Mw/Mn=2.49 (GPC with polystyrene calibration).

PREPARATION EXAMPLE 25

Synthesis of p-cresol/m-cresol/formaldehyde polycondensate (Mw=6,000)

Using 30.0 g (0.28 mol) of p-cresol, 30.0 g (0.28 mol) of m-cresol and 40.5 g (0.50 mol) of a 37% formaldehyde solution, the procedure of Preparation Example 23 was carried out for reaction and after-treatments to obtain 38.4 g of p-cresol/m-cresol/formaldehyde polycondensate as slightly white waxy crystals. Mw≈6,600; Mw/Mn=6.82 (GPC with polystyrene calibration).

PREPARATION EXAMPLE 26

Synthesis of poly(p-1-ethoxyethoxystyrene/p-hydroxystyrene/p-isopropoxycarbonyloxystyrene)

(1) To a toluene solution of 17.6 g of p-tert-butoxystyrene was added a catalytic amount of 2,2'-azobis(2,4-dimethylvaleronitrile)to carry out polymerization reaction in a nitrogen stream at 70° C. for 6 hours. The reaction product was treated according to (1) of Preparation Example 10 to give 16.5 g of poly(p-tert-butoxystyrene) as white powdery crystal. Mw≈9,500 (GPC with polystyrene calibration).

(2) Using 15.0 g of poly(p-tert-butoxystyrene) obtained according to (1) above, the procedure of (2) of Preparation Example 10 was carried out for reaction and after-treatments to obtain 9.0 g of poly(p-hydroxystyrene) as white powdery crystal. Mw≈7,000 (GPC with polystyrene calibration).

(3) Using 12.0 g of poly(p-hydroxystyrene) obtained according to (2) above and 3.0 g of isopropyl chlorocarbonate, reaction and after-treatments were carried out according to (2) of Preparation Example 6 to obtain 11.7 g of poly(p-isopropoxycarbonyloxystyrene/p-hydroxystyrene) as white powdery crystal. P-isopropoxycarbonyloxystyrene unit/p-hydorxystyrene unit molar ratio in the polymer≈2:8 ($^1$H NMR). Mw≈8,000; Mw/Mn=1.60 (GPC with polystyrene calibration).

(4) Using 10.0 g of poly(p-isopropoxycarbonyloxystyrene/p-hydroxystyrene) according to (3) above and 0.8 g of ethylvinyl ether, reaction and after-treatments were carried out according to (3) of Preparation Example 1 to obtain 8.9 g of poly(p-1-ethoxyethoxystyrene/p-hydroxystyrene/p-isopropoxycarbonyloxystyrene) as white powdery crystal. P-1-ethoxyethoxystyrene unit/p-hydroxystyrene unit/p-isopropoxycarbonyloxystyrene unit molar ratio in the polymer≈10:70:20 ($^1$H NMR). Mw≈8,300; Mw/Mn=1.60 (GPC with polystyrene calibration).

PREPARATION EXAMPLE 27

Synthesis of p-cresol/1,4-dihydroxymethylbenzene polycondensate 38.4 g (0.36 mol) of p-cresol and 35.0 g (0.25 mol) of xylene-α,α'-diol were dissolved under heating, then 0.15 g of methanesulfonic acid was added thereto at 90–100° C. and the mixture was stirred and reacted at the same temperature for 2 hours. After cooling, 100 ml of acetone was poured into and dissolved in the reaction solution and then the solution was poured into 2,000 ml of water, stirred and then allowed to stand, after which the supernatant was decanted and the residue was dissolved in 100 ml of acetone, poured into 2,000 ml of water and stirred. The solution was allowed to stand, the supernatant was decanted and the residue was evaporated to dryness under reduced pressure to give 65.0 g of p-cresol/1,4-dihydroxymethylbenzene polycondensate as faintly yellow-tinted powdery crystals. Mw≈6,700; Mw/Mn=3.50 (GPC with polystyrene calibration).

EXAMPLE 1

A photoresist material of the following composition was prepared:

| | |
|---|---|
| Poly(p-1-ethoxyethoxystyrene/p-hydroxystyrene/ p-tert-butoxystyrene) [Mw = 18,000; Mw/Mn = 1.90; polymer of Preparation Example 3] | 4.5 g |
| Poly(p-tert-butoxycarbonyloxystyrene/ p-hydroxystyrene) [MW = 10,000; Mw/Mn = 1.65; polymer of Preparation Example 11] | 1.5 g |
| Bis(1,1-dimethylethylsulfonyl)diazomethane | 0.2 g |
| Bis(p-toluenesulfonyl)diazomethane | 0.1 g |
| Propylene glycol monomethyl ether acetate | 22.7 g |

A pattern formation method using the above resist is explained with reference to FIG. 1.

Figure 1B:
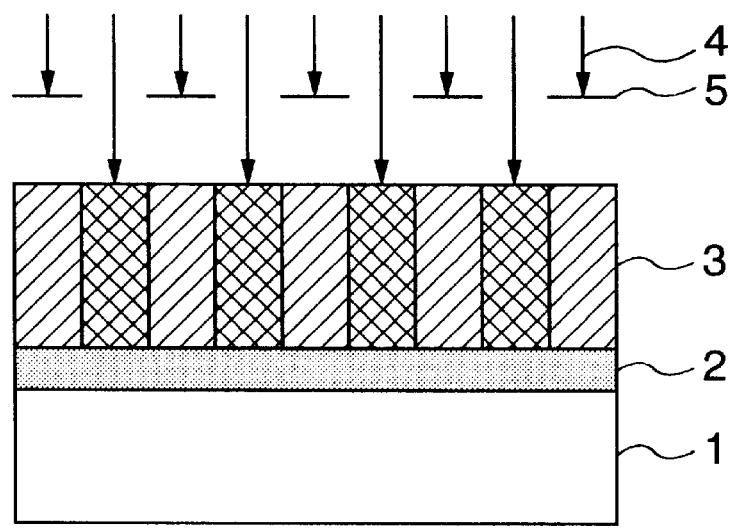
Figure 1C:
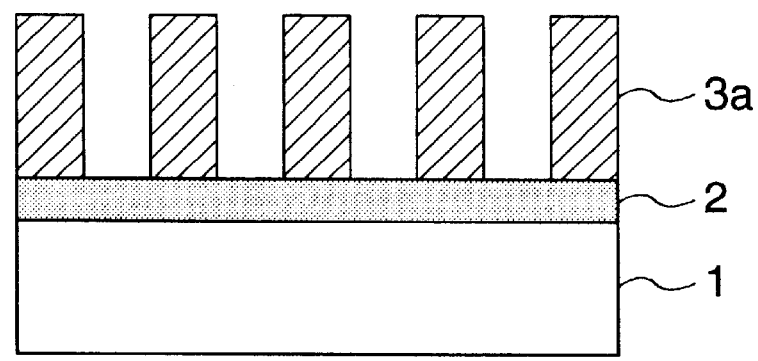

The above resist material 3 was spin coated on a TiN$_4$ substrate 2 obtained by conducting CVD or sputtering on an aluminum base 1, and was prebaked on a hot plate at 90° for 90 seconds to form a 1.0 μm thick resist film (FIG. 1A). This resist film was selectively exposed to KrF excimer laser (NA=0.55) beams 4 of 248.4 nm through mask 5 (FIG. 1B), postbaked on a 100° C. hot plate for 90 seconds and then developed with an alkaline developer (2.38% tetramethylammonium hydroxide solution) for 60 seconds, whereby the exposed portion alone of the resist material was dissolved away to form a positive pattern 3a (FIG. 1C). The obtained positive pattern was rectangular and had a 0.24 μm L/S resolution. Exposure dose was 28 mJ/cm$^2$.

In order to determine heat resistance of the resist material of the present invention, the obtained resist pattern, after exposure, postbaking and development, was baked on a 130° hot plate for 150 seconds. The obtained pattern was rectangular and capable of 0.24 μm L/S resolution, which indicates high heat resistance of the resist film.

Dimensional change with the lapse of time of the pattern formed by using the resist material of the present invention was measured during the period from exposure till heat treatment (postbaking). 0.24 μm L/S resolution was possible even after the lapse of 4 hours from exposure.

Figure 2:
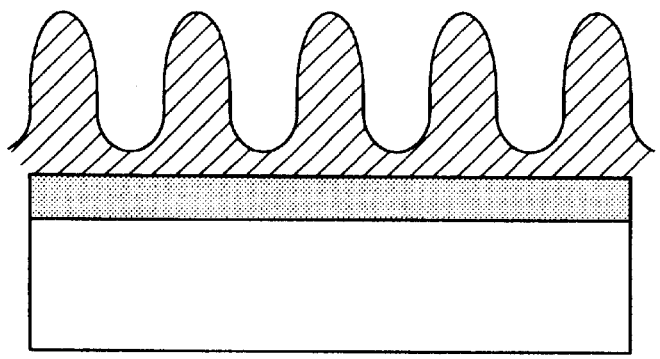
FIG. 2 is a sectional illustration of failure to form a 0.30 µm L/S pattern observed in Comparative Examples 1–3, 10 and 17.

Further, as shown in FIG. 2, when the resist material of the present invention was used, the mask linearity was good until 0.25 μm. In addition when exposed to light by defocus, no deterioration of shape was admitted by 0.7 μm against the line/space of 0.25 μm. This means that a sufficient focus margin was obtained. The pattern sidewalls were smooth and no scum was observed.

When a pattern was formed on a SiO2 substrate by using the resist material of the present invention in the manner described above, 0.20 μm L/S rectangular pattern could be resolved at an exposure dose of 18 mJ/cm$^2$. In addition when exposed to light by defocus, no deterioration of shape was admitted by 0.7 μm against the line/space of 0.25 μm. This means that a sufficient focus margin was obtained.

Also, when a pattern was formed in the same manner as described above by using the resist material of the present invention which had been kept in storage at 23° for one month after preparation, 0.24 μm L/S positive pattern could be resolved at the same exposure dose, which confirmed good storage stability of the resist material of the present invention.

EXAMPLES 2–33

Photo-resist materials of the compositions shown in the following Tables 1–16 were prepared.

TABLE 1

| | | |
|---|---|---|
| Example 2 | Poly(p-1-ethoxyethoxystyrene/p-hydroxystyrene/p-methylstyrene) [Mw = 18,000; Mw/Mn = 1.86; polymer of Preparation Example 1] | 4.8 g |
| | Poly(p-tetrahydropyranyloxystyrene/p-hydroxystyrene) [Mw = 10,000; Mw/Mn = 1.60; polymer of Preparation Example 10] | 1.2 g |
| | Bis(1-methylethylsulfonyl)diazomethane | 0.2 g |
| | Bisbenzenesulfonyldiazomethane | 0.1 g |
| | Propylene glycol monomethyl ether acetate | 22.7 g |
| Example 3 | Poly(p-1-methoxy-1-methylethoxystyrene/p-hydroxystyrene/p-tert-butoxystyrene) [Mw = 17,800; Mw/Mn = 1.90; polymer of Preparation Example 4] | 4.5 g |
| | Poly(p-tert-butoxycarbonyloxystyrene/p-hydroxystyrene) [Mw = 10,000; Mw/Mn = 1.65; polymer of Preparation Example 11] | 1.5 g |
| | Bis(1-methyethylsulfonyl)diazomethane | 0.2 g |
| | Benzoylbenzenesulfonyldiazomethane | 0.1 g |
| | Propylene glycol monomethyl ether acetate | 22.7 g |

TABLE 2

| | | |
|---|---|---|
| Example 4 | Poly(p-1-ethoxyethoxystyrene/p-hydroxystyrene) [Mw = 18,500; Mw/Mn = 1.88; polymer of Preparation Example 8] | 4.5 g |
| | Poly(p-tert-butoxystyrene/p hydroxystyrene) [Mw/Mn = 1.65; polymer of Preparation Example 12] | 1.5 g |
| | Bis(1,1-dimethylethylsulfonyl)diazomethane | 0.2 g |
| | Benzoylcyclohexylsulfonyldiazomethane | 0.1 g |
| | Propylene glycol monomethyl ether acetate | 22.7 g |
| Example 5 | Poly-(p-1-methoxyethoxystyrene/p-hydroxystyrene) [Mw = 18,000; Mw/Mn = 1.89; Polymer of Preparation Example 9] | 4.5 g |
| | Poly(p-tert-butoxycarbonyloxystyrene/p-hydroxystyrene) [Mw = 10,000; Mw/Mn = 1.65] | 1.5 g |
| | Biscyclohexylsulfonyldiazomethane | 0.2 g |
| | Bis(p-toluenesulfonyl)diazomethane | 0.1 g |
| | Propylene glycol monomethyl ether acetate | 22.7 g |
| Example 6 | Poly(p-1-ethoxyethoxystyrene/p-hydroxystyrene) [Mw = 18,500; Mw/Mn = 1.88] | 4.5 g |
| | Poly(p-tert-butoxycabonyloxystyrene/p-hydroxystyrene) [Mw = 10,000; Mw/Mn = 1.65] | 1.5 g |
| | Bis(cyclohexylsulfonyl)diazomethane | 0.2 g |
| | Triphenylsulfonium trifluoromethanesulfonate | 0.1 g |
| | 9-Diazo-10-phenanthrone | 0.1 g |
| | Propylene glycol monomethyl ether acetate | 22.6 g |

TABLE 3

| | | |
|---|---|---|
| Example 7 | Poly(p-1-ethoxyethoxystyrene/p-hydroxystyrene/styrene) [Mw = 18,000; Mw/Mn = 1.85; polymer of Preparation Example 2] | 4.8 g |
| | Poly(p-tetradhydropyranyloxystyrene/p-hydroxystyrene) [Mw = 10,000; Mw/Mn = 1.60] | 1.2 g |
| | 1-Diazo-1-cyclohexylsulfonyl-3,3-dimethyl-2-butanone | 0.2 g |
| | Bis(p-chlorobenzenesulfonyl)-diazomethane | 0.1 g |
| | Ethyl lactate | 24.7 g |

TABLE 3-continued

| Example 8 | Poly(p-1-ethoxyethoxystyrene/p-hydroxystyrene/p-tetrahydropyranyloxystyrene) [Mw = 16,000; Mw/Mn = 1.78; polymer of Preparation Example 5] | 4.5 g |
|---|---|---|
| | Poly(p-tert-butoxystyrene/p-hydroxystyrene) [Mw = 8,500; Mw/Mn – 1.65] | 1.5 g |
| | Bis(cyclohexylsulfonyl)diazomethane | 0.2 g |
| | Bis(1-methylethylsulfonyl)diazomethane | 0.1 g |
| | Methyl 3-methoxypropionate | 24.7 g |

TABLE 4

| Example 9 | Poly(p-1-methoxyethoxystyrene/p-hydroxystyrene/fumaronitrile) [Mw = 20,000; Mw/Mn = 1.85; polymer of Preparation Example 15] | 4.8 g |
|---|---|---|
| | Poly(p-tert-butoxycarbonyloxystyrene/p-hydroxystyrene) [Mw = 4,000; Mw/Mn = 1.60; polymer of Preparation Example 13] | 1.2 g |
| | Bis(1,1-dimethylethylsulfonyl)diazomethane | 0.2 g |
| | 1-Diazo-1-methylsulfonyl-4-phenylbutane-2-one | 0.1 g |
| | Propylene glycol monomethyl ether acetate | 22.7 g |
| Example 10 | Poly(p-1-ethoxyethoxystyrene/p-hydroxystyrene) [Mw = 18,500; Mw/Mn = 1.88] | 4.5 g |
| | Poly(p-tert-butoxycarbonyloxystyrene/p-hydroxystyrene) [Mw = 10,000; Mw/Mn = 1.65] | 1.5 g |
| | Bis(cyclohexylsulfonyl)diazomethane | 0.2 g |
| | Bis(2,4-dimethylbenzenesulfonyl)diazomethane | 0.1 g |
| | Propylene glycol monomethyl ether acetate | 24.7 g |

TABLE 5

| Example 11 | Poly(p-1-ethoxyethoxystyrene/p-hydroxystyrene/p-tert-butoxycarbonyloxystyrene [Mw = 20,000; Mw/Mn = 1.90; polymer of Preparation Example 6] | 4.8 g |
|---|---|---|
| | Poly(p-tert-butoxycarbonyloxystyrene/p-hydroxystyrene) [Mw = 10,000; Mw/Mn = 1.65] | 1.2 g |
| | Bis(cyclohexylsulfonyl)diazomethane | 0.2 g |
| | Bisbenzenesulfonyldiazomethane | 0.1 g |
| | 9-(2-Methoxyethoxy)methylanthracene | 0.1 g |
| | Propylene glycol monomethyl ether acetate | 14.2 g |
| Example 12 | Poly(p-1-ethoxyethoxystyrene/p-hydroxystyrene/p-tert-butyl vinylphenoxyacetate) [Mw = 19,500; Mw/Mn = 1.88; polymer of Preparation Example 7] | 4.5 g |
| | Poly(p-tert-butoxystyrene/p-hydroxystyrene) [Mw = 8,500; Mw/Mn = 1.65] | 1.5 g |
| | 1-Acetyl-1-(1-methylethylsulfonyl)diazomethane | 0.2 g |
| | Bis(p-toluenesulfonyl)diazomethane | 0.1 g |
| | 9-Diazo-10-phenanthrone | 0.1 g |
| | Ethyl lactate | 24.6 g |

TABLE 6

| Example 13 | Poly(p-1-ethoxyethoxystyrene/p-hydroxystyrne) [Mw = 18,500; Mw/Mn = 1.88] | 4.5 g |
|---|---|---|
| | Poly(p-tert-butyl vinylphenoxyacetate/p-hydroxystyrene) {Mw = 11,000; Mw/Mn = 1.65; polymer of Preparation Example 14] | 1.5 g |
| | Bis(1,1-dimethylethylsulfonyl)diazomethane | 0.2 g |
| | P-tolyldiphenylsulfonium trifluoromethanesulfonate | 0.1 g |
| | 9-(2-Methoxyethoxy)methylanthracene | 0.1 g |
| | Propylene glycol monomethyl ether acetate | 22.6 g |
| Example 14 | Poly(p-1-ethoxyethoxystyrene/p-hydroxystyrene) [Mw = 18,500; Mw/Mn = 1.88] | 4.5 g |
| | Poly(p-tert-butoxycarbonyloxystyrene/p-hydroxystyrene) [Mw = 10,000; Mw/Mn = 1.65; polymer of Preparation Example 11] | 1.2 g |
| | Poly(p-tert-butoxycarbonyloxystyrene/p-hydroxystyrene) [Mw = 4,000; Mw/Mn = 1.60; polymer of Preparation Example 13] | 0.3 g |
| | Bis(cyclohexylsulfonyl)diazomethane | 0.2 g |
| | Bis(2,4-dimethylbenzenesulfonyl)diazomethane | 0.1 g |
| | 9-(2-Methoxyethoxy)methylanthracene | 0.1 g |
| | Propylene glycol monomethyl ether acetate | 22.6 g |

TABLE 7

| Example 15 | Poly(p-1-methoxyethoxystyrene/p-hydroxystyrene) [Mw = 18,000; Mw/Mn = 1.89] | 4.5 g |
|---|---|---|
| | Poly(p-tert-butoxycarbonyloxystyrene/p-hydroxystyrene) [Mw = 10,000; Mw/Mn = 1.65] | 1.0 g |
| | Poly(p-tert-butoxycarbonyloxystyrene/p-hydroxystyrene) [Mw = 40,000; Mw/Mn = 1.60] | 0.5 g |
| | Bis(cyclohexylsulfonyl)diazomethane | 0.2 g |
| | Bis(p-toluenesulfonyl)diazomethane | 0.1 g |
| | 1,2,3-tris(o-naphthoquinonediazido-4-sulfonyloxypropane) | 0.5 g |
| | Salicylic acid | 0.2 g |
| | Propylene glycol monomethyl ether acetate | 24.5 g |
| Example 16 | Poly(p-1-ethoxyethoxystyrene/p-hydroxystyrene) [Mw = 17,500; Mw/Mn = 1.15; polymer of Preparation Example 16] | 4.5 g |
| | Poly(p-tert-butoxycarbonyloxystyrene/p-hydroxystyrene) [Mw = 10,000; Mw/Mn = 1.65] | 1.5 g |
| | Bis(cyclohexylsulfonyl)diazomethane | 0.3 g |
| | Bis(2,4-dimethylbenzenesulfonyl)diazomethane | 0.1 g |
| | Propylene glycol monomethyl ether acetate | 24.6 g |

TABLE 8

| Example 17 | Poly(p-1-methoxyethoxystyrene/p-hydroxystyrene) [Mw = 18,000; Mw/Mn = 1.89] | 4.5 g |
|---|---|---|
| | Poly(p-isobutoxycarbonyloxystyrene/p-hydroxystyrene) [Mw = 18,000; Mw/Mn = 1.05; polymer of Preparation Example 17] | 1.5 g |
| | Bis(1,1-dimethylethylsulfonyl)diazomethane | 0.3 g |
| | Bis(p-toluenesulfonyl)diazomethane | 0.1 g |
| | 9-Diazo-10-phethanthrone | 0.2 g |
| | Propylene glycol monomethyl ether acetate | 24.4 g |

TABLE 8-continued

| | | |
|---|---|---|
| Example 18 | Poly(p-1-ethoxyethoxystyrene/p-hydroxystyrene) [Mw = 18,500; Mn/Mn = 1.88] | 4.5 g |
| | Poly(p-isobutoxycarbonyloxystyrene/p-hydroxystyrene) [Mw = 13,000; Mw/Mn = 1.05] | 1.5 g |
| | Bis(cyclohexylsulfonyl)diazomethane | 0.3 g |
| | Bis(2,4-dimethylbenzenesulfonyl)-diazomethane | 0.1 g |
| | Propylene glycol monomethyl ether acetate | 24.6 g |

TABLE 9

| | | |
|---|---|---|
| Example 19 | Poly(p-1-ethoxyethoxystyrene/p-hydroxystyrene) [Mw = 18,500; Mw/Mn = 1.88] | 4.5 g |
| | Poly(p-ethoxycarbonyloxystyrene/p-hydroxystyrene) [Mw = 9,000; Mw/Mn = 1.60; polymer of Preparation Example 18] | 1.5 g |
| | P-cresol/in-cresol/formaldehyde polycondensate [Mw = 1,580; Mw/Mn = 2.49; Polycondensate of Preparation Example 24] | 0.6 g |
| | Bis(cyclohexylsulfonyl)diazomethane | 0.3 g |
| | Bis(p-toluenesulfonyl)diazomethane | 0.1 g |
| | O-acetylbenzoic acid | 0.1 g |
| | Fluorine-containing nonionic surfactant [commercial product] | 0.1 g |
| | Propylene glycol monomethyl ether acetate | 23.0 g |
| Example 20 | Poly(p-1-ethoxyethoxystyrene/p-hydroxystyrene) [Mw = 18,500; Mw/Mn = 1.88] | 4.5 g |
| | Poly(p-isopropoxycarbonyloxystyrene/p-hydroxystyrene) [Mw = 9,000; Mw/Mn = 1.64; polymer of Preparation Example 19] | 1.5 g |
| | Bis(1,1-dimethylethylsulfonyl)-diazomethane | 0.3 g |
| | Bis(2,4-dimethylbenzenesulfonyl)-diazomethane | 0.1 g |
| | Propylene glycol monomethyl ether acetate | 24.6 g |

TABLE 10

| | | |
|---|---|---|
| Example 21 | Poly(p-1-ethoxyethoxystyrene/p-hydroxystyrene/p-tert-butoxystyrene) [Mw = 18,000; Mw/Mn = 1.90] | 4.5 g |
| | Poly(p-ethoxycarbonyloxystyrene/p-hydroxystyrene) [Mw = 9,000; Mw/Mn = 1.60] | 1.5 g |
| | P-cresol/m-cresol/formaldehyde polycondensate [Mw = 880; Mw/Mn = 2.07; polycondensate of Preparation Example 23] | 0.6 g |
| | Bis(cyclohexylsulfonyl)diazomethane | 0.3 g |
| | Bis(p-toluenesulfonyl)diazomethane | 0.1 g |
| | 2,2',4,4'-tetra(o-naphthoquinone-diazidosulfonyloxy)benzophenone | 0.2 g |
| | Propylene glycol monomethyl ether acetate | 24.2 g |
| Example 22 | Poly(p-1-ethoxyethoxystyrene/p-hydroxystyrene/p-tert-butoxycarbonyloxystyrene) [Mw = 20,000; Mw/Mn = 1.90] | 4.5 g |
| | Poly(p-isopropoxycarbonyloxystyrene/p-hydroxystyrene) [Mw = 9,000; Mw/Mn = 1.64] | 1.5 g |
| | Bis(cyclohexylsulfonyl)diazomethane | 0.3 g |
| | Bis(p-toluenesulfonyl)diazomethane | 0.1 g |
| | 9-Diazofluorene | 0.4 g |
| | Propylene glycol monomethyl ether acetate | 24.2 g |

TABLE 11

| | | |
|---|---|---|
| Example 23 | Poly(p-1-ethoxyethoxystyrene/p-hydroxystyrene) [Mw = 18,000; Mw/Mn = 1.89] | 5.0 g |
| | P-cresol/m-cresol/formaldehyde polycondensate [Mw = 6,600; Mw/Mn = 6.82; polycondensate of Preparation Example 25] | 1.0 g |
| | Bis(1,1-dimethylethylsulfonyl)-diazomethane | 0.3 g |
| | Bis(2,4-dimethylbenzenesulfonyl)-diazomethane | 0.1 g |
| | Fluorine-containing nonionic surfactant [commercial product] | 0.1 g |
| | Propylene glycol monomethyl ether acetate | 24.6 g |
| Example 24 | Poly(p-1-ethoxyethoxystyrene/p-hydroxystyrene) [Mw = 17,500; Mw/Mn = 1.15] | 5.5 g |
| | P-cresol/m-cresol/formaldehyde polycondensate [Mw = 1.580; Mw/Mn = 2.49] | 0.5 g |
| | Bis(cyclohexylsulfonyl)diazomethane | 0.3 g |
| | Salicylic acid | 0.1 g |
| | Polyoxyethylene lauryl ether [commercial product] | 0.1 g |
| | Propylene glycol monomethyl ether acetate | 23.5 g |

TABLE 12

| | | |
|---|---|---|
| Example 25 | Poly(p-1-ethoxyethoxystyrene/p-hydroxystyrene) [Mw = 17,500; Mw/Mn = 1.15] | 5.5 g |
| | P-cresol/1,4-dihydroxymethylbenzene polycondensate [Mw = 6,700; Mw/Mn = 3.50; polycondensate of Preparation Example 27] | 0.5 g |
| | Bis(cyclohexylsulfonyl)diazomethane | 0.3 g |
| | Ascorbic acid | 0.1 g |
| | Fluorine-containing nonionic surfactant [commercial product] | 0.1 g |
| | Propylene glycol monomethyl ether acetate | 23.5 g |
| Example 26 | Poly(p-1-ethoxyethoxystyrene/p-hydroxystyrene/p-tert-butoxystyrene) [Mw = 18,000; Mw/Mn = 1.90] | 4.5 g |
| | Poly(p-1-ethoxyethoxystyrene/p-hydroxystyrene/p-tert-butoxystyrene) [Mw = 9,200; Mw/Mn = 1.30; polymer of Preparation Example 22] | 1.5 g |
| | Bis(cyclohexylsulfonyl)diazomethane | 0.3 g |
| | Triphenylsulfonium trifluoromethane-sulfonate | 0.1 g |
| | Propylene glycol monomethyl ether acetate | 24.6 g |

TABLE 13

| | | |
|---|---|---|
| Example 27 | Poly(p-1-ethoxyethoxystyrene/p-hydroxystyrene/styrene) [Mw = 18,000; Mw/Mn = 1.85; Polymer of; Preparation Example 2] | 4.8 g |
| | Poly(p-1-ethoxyethoxystyrene/p-hydroxystyrene/p-isopropoxycarbonyloxy-styrene) [Mw = 8,300; Mw/Mn = 1.60; polymer of Preparation Example 23] | 1.5 g |
| | Bis(cyclohexylsulfonyl)diazomethane | 0.3 g |

TABLE 13-continued

| | | |
|---|---|---|
| | Triphenylsulfonium trifluoromethane-sulfonate | 0.1 g |
| | Salicylic acid | 0.1 g |
| | Fluorine-containing nonionic surfactant [commercial product] | 0.1 g |
| | Propylene glycol monomethyl ether acetate | 24.4 g |
| Example 28 | Poly(p-1-methoxyethoxystyrene/p-hydroxystyrene) [Mw = 18,000; Mw/Mn = 1.89; polymer of Preparation Example 9] | 4.5 g |
| | Poly(p-1-ethoxyethoxystyrene/p-hydroxystyrene/p-tert-butoxystyrene) [Mw = 9,200; Mw/Mn = 1.30; polymer of Preparation Example 22] | 1.5 g |
| | Bis(cyclohexylsulfonyl)diazomethane | 0.3 g |
| | Bis(p-toluenesulfonyl)diazomethane | 0.1 g |
| | N,N-dimethylacetamide | 0.3 g |
| | Propylene glycol monomethyl ether acetate | 24.3 g |

TABLE 14

| | | |
|---|---|---|
| Example 29 | Poly(p-1-ethoxyethoxystyrene/p-hydroxystyrene/p-tert-butoxycarbonyloxystyrene) [Mw = 20,000; Mw/Mn = 1.90; polymer of Preparation Example 6] | 4.8 g |
| | Poly(p-1-ethoxyethoxystyrene/p-hydroxystyrene/p-isopropoxycarbonyloxystyrene) [Mw = 8,300; Mw/Mn = 1.60; polymer of Preparation Example 23] | 1.5 g |
| | P-cresol/m-cresol/formaldehyde polycondensate [Mw = 880; Mw/Mn = 2.07; polycondensate of Preparation Example 19] | 0.5 g |
| | Bis(cyclohexylsulfonyl)diazomethane | 0.3 g |
| | Triphenylsulfonium trifluoromethane-sulfonate | 0.1 g |
| | Saccharine | 0.1 g |
| | Fluorine-containing nonionic surfactant [commercial product] | 0.1 g |
| | Propylene glycol monomethyl ether acetate | 24.0 g |
| Example 30 | Poly(p-1-ethoxyethoxystyrene/p-hydroxystyrene) [Mw = 18,500; Mw/Mn = 1.88] | 4.5 g |
| | Poly(p-isopropoxycarbonyloxystyrene/p-hydroxystyrene) [Mw = 9,000; Mw/Mn = 1.64; polymer of Preparation Example 19] | 1.5 g |
| | Bis(1,1-dimethylethylsulfonyl)diazomethane | 0.3 g |
| | Bis(2,4-dimethylbenzenesulfonyl)diazomethane | 0.1 g |
| | Salicylic acid | 0.1 g |
| | Polyoxyethylene ethyl ether [commercial product] | 0.2 g |
| | Propylene glycol monomethyl ether acetate | 24.6 g |

TABLE 15

| | | |
|---|---|---|
| Example 31 | Poly(p-1-ethoxyethoxystyrene/p-hydroxystyrene/p-tert-butoxycarbonyloxystyrene) [Mw = 20,000; Mw/Mn = 1.90] | 4.5 g |
| | Poly (p-isopropoxycarbonyloxystyrene/p-hydroxystyrene) [Mw = 9,000; Mw/Mn = 1.64] | 1.5 g |
| | Bis(cyclohexylsulfonyl)diazomethane | 0.3 g |
| | 2,6-di-n-butanesulfonyloxyacetophenone | 0.1 g |
| | 9-Diazofluorene | 0.4 g |
| | Polypropylene glycol | 0.2 g |
| | Propylene glycol monomethyl ether acetate | 24.0 g |
| Example 32 | Poly(p-1-ethoxyethoxystyrene/p-hydroxystyrene/p-tert-butoxystyrene) [Mw = 18,000; Mw/Mn = 1.90; polymer of Preparation Example 3] | 4.8 g |
| | Poly(p-1-ethoxyethoxystyrene/p-hydroxystyrene/p-tert-butoxystyrene) [Mw = 9,200; Mw/Mn = 1.30; polymer of Preparation Example 22] | 1.2 g |
| | Bis(cyclohexylsulfonyl)diazomethane | 0.3 g |
| | 1,2,3-tris-perfluorooctanesulfonyloxybenzene | 0.1 g |
| | Salicylic acid | 0.2 g |
| | 2,2',4,4'-Tetrahydroxybenzophenone | 0.2 g |
| | Polyethylene glycol | 0.2 g |
| | N,N-dimethylacetamide | 3.5 g |
| | Propylene glycol monomethyl ether acetate | 20.0 g |

TABLE 16

| | | |
|---|---|---|
| Example 33 | Poly(p-1-ethoxyethoxystyrene/p-hydroxystyrene) [Mw = 18,500; Mw/Mn = 1.88] | 4.6 g |
| | Poly (p-1-ethoxyethoxystyrene/p-hydroxystyrene/p-isopropoxycarbonyloxystlyrene) [Mw = 8,300; Mw/Mn = 1.60; polymer of Preparation Example 26] | 1.4 g |
| | α,α,α'-Tris(4-hydroxyphenyl)-1-ethyl-4-isopropylbenzene [commercial product] | 0.2 g |
| | Bis(1,1-dimethylethylsulfonyl)diazomethane | 0.3 g |
| | 2,6-Di-trifluoromethanesulfonyloxyacetophenone | 0.1 g |
| | Polyoxyethylene lauryl ether | 0.2 g |
| | N,N-dimethylacetamide | 3.5 g |
| | Propylene glycol monomethyl ether acetate | 20.0 g |

Using the resist materials of the above compositions, patterns were formed according to the procedure of Example 1. The results of evaluations of these resist materials on the $Ti_3N_4$ substrate are shown in Tables 17 and 18 and those on the $SiO_2$ substrate are shown in Tables 19 and 20.

TABLE 17

| | | Time from exposure till heat treatment and resolution | | | |
|---|---|---|---|---|---|
| Example | Exposure dose (mJ/cm$^2$) | Immediately after exposure | 30 minutes | 4 hours | Mask linearity |
| 2 | 38 | 0.24 μm L/S | 0.24 μm L/S | 0.24 μm L/S | Good |
| 3 | 28 | 0.24 μm L/S | 0.24 μm L/S | 0.24 μm L/S | Good |
| 4 | 28 | 0.24 μm L/S | 0.24 μm L/S | 0.24 μm L/S | Good |
| 5 | 25 | 0.24 μm L/S | 0.24 μm L/S | 0.24 μm L/S | Good |
| 6 | 26 | 0.24 μm L/S | 0.24 μm L/S | 0.24 μm L/S | Good |
| 7 | 33 | 0.24 μm L/S | 0.24 μm L/S | 0.24 μm L/S | Good |
| 8 | 35 | 0.24 μm L/S | 0.24 μm L/S | 0.24 μm L/S | Good |
| 9 | 28 | 0.24 μm L/S | 0.24 μm L/S | 0.24 μm L/S | Good |
| 10 | 25 | 0.24 μm L/S | 0.24 μm L/S | 0.24 μm L/S | Good |
| 11 | 33 | 0.24 μm L/S | 0.24 μm L/S | 0.24 μm L/S | Good |
| 12 | 30 | 0.24 μm L/S | 0.24 μm L/S | 0.24 μm L/S | Good |
| 13 | 28 | 0.24 μm L/S | 0.24 μm L/S | 0.24 μm L/S | Good |
| 14 | 25 | 0.24 μm L/S | 0.24 μm L/S | 0.24 μm L/S | Good |
| 15 | 25 | 0.24 μm L/S | 0.24 μm L/S | 0.24 μm L/S | Good |

TABLE 18

Time from exposure till heat treatment and resolution

| Example | Exposure dose (mJ/cm$^2$) | Immediately after exposure | 30 minutes | 4 hours | Mask linearity |
|---|---|---|---|---|---|
| 16 | 26 | 0.24 μm L/S | 0.24 μm L/S | 0.24 μm L/S | Good |
| 17 | 35 | 0.24 μm L/S | 0.24 μm L/S | 0.24 μm L/S | Good |
| 18 | 26 | 0.24 μm L/S | 0.24 μm L/S | 0.24 μm L/S | Good |
| 19 | 28 | 0.24 μm L/S | 0.24 μm L/S | 0.24 μm L/S | Good |
| 20 | 28 | 0.24 μm L/S | 0.24 μm L/S | 0.24 μm L/S | Good |
| 21 | 34 | 0.24 μm L/S | 0.24 μm L/S | 0.24 μm L/S | Good |
| 22 | 34 | 0.24 μm L/S | 0.24 μm L/S | 0.24 μm L/S | Good |
| 23 | 28 | 0.24 μm L/S | 0.24 μm L/S | 0.24 μm L/S | Good |
| 24 | 34 | 0.24 μm L/S | 0.24 μm L/S | 0.24 μm L/S | Good |
| 25 | 30 | 0.24 μm L/S | 0.24 μm L/S | 0.24 μm L/S | Good |
| 26 | 28 | 0.24 μm L/S | 0.24 μm L/S | 0.24 μm L/S | Good |
| 27 | 28 | 0.24 μm L/S | 0.24 μm L/S | 0.24 μm L/S | Good |
| 28 | 26 | 0.24 μm L/S | 0.24 μm L/S | 0.24 μm L/S | Good |
| 29 | 28 | 0.24 μm L/S | 0.24 μm L/S | 0.24 μm L/S | Good |
| 30 | 28 | 0.24 μm L/S | 0.24 μm L/S | 0.24 μm L/S | Good |
| 31 | 34 | 0.24 μm L/S | 0.24 μm L/S | 0.24 μm L/S | Good |
| 32 | 30 | 0.24 μm L/S | 0.24 μm L/S | 0.24 μm L/S | Good |
| 33 | 30 | 0.24 μm L/S | 0.24 μm L/S | 0.24 μm L/S | Good |

TABLE 19

| Example | Exposure dose (mJ/cm$^2$) | Resolution (SiO$_2$:1 μm thick) | Resist film heat resistance | Storage stability |
|---|---|---|---|---|
| 2 | 20 | 0.22 μm L/S | Good | Good |
| 3 | 18 | 0.22 μm L/S | Good | Good |
| 4 | 18 | 0.22 μm L/S | Good | Good |
| 5 | 16 | 0.22 μm L/S | Good | Good |
| 6 | 16 | 0.22 μm L/S | Good | Good |
| 7 | 20 | 0.22 μm L/S | Good | Good |
| 8 | 22 | 0.22 μm L/S | Good | Good |
| 9 | 18 | 0.22 μm L/S | Good | Good |
| 10 | 16 | 0.22 μm L/S | Good | Good |
| 11 | 20 | 0.22 μm L/S | Good | Good |
| 12 | 20 | 0.22 μm L/S | Good | Good |
| 13 | 18 | 0.22 μm L/S | Good | Good |
| 14 | 16 | 0.22 μm L/S | Good | Good |
| 15 | 16 | 0.22 μm L/S | Good | Good |

TABLE 20

| Example | Exposure dose (mJ/cm$^2$) | Resolution (SiO$_2$:1 μm thick) | Resist film heat resistance | Storage stability |
|---|---|---|---|---|
| 16 | 16 | 0.20 μm L/S | Good | Good |
| 17 | 22 | 0.20 μm L/S | Good | Good |
| 18 | 16 | 0.20 μm L/S | Good | Good |
| 19 | 18 | 0.18 μm L/S | Good | Good |
| 20 | 18 | 0.18 μm L/S | Good | Good |
| 21 | 22 | 0.18 μm L/S | Good | Good |
| 22 | 22 | 0.22 μm L/S | Good | Good |
| 23 | 18 | 0.18 μm L/S | Good | Good |
| 24 | 22 | 0.20 μm L/S | Good | Good |
| 25 | 22 | 0.20 μm L/S | Good | Good |
| 26 | 18 | 0.20 μm L/S | Good | Good |
| 27 | 26 | 0.20 μm L/S | Good | Good |
| 28 | 25 | 0.18 μm L/S | Good | Good |
| 29 | 26 | 0.20 μm L/S | Good | Good |
| 30 | 18 | 0.18 μm L/S | Good | Good |
| 31 | 22 | 0.22 μm L/S | Good | Good |
| 32 | 22 | 0.18 μm L/S | Good | Good |
| 33 | 22 | 0.18 μm L/S | Good | Good |

As is clear from the results shown in Tables 17–20, the same positive type patterns as in Example 1 were formed in Examples 2 to 33, and the 0.24 μm L/S was resolved without any problem even after 4 hours of period from exposure to light on the TiN$_4$ to heat treatment (post baking) as in Example 1. Further, there was obtained the focus margin of ±0.7 μm or more against the 0.30 μm L/S. Further, the resist material in any of Examples 2–23 showed good resolution on the SiO$_2$ and other substrates and had no substrate dependency. Moreover, all of the resist materials of Examples 2–33 showed good storage stability.

Comparing Example 10 and Examples 19–21, it was found that in the case of the polymers represented by the formula [2], there can be obtained generally a better resolution on a SiO$_2$ substrate by using a polymer having an ethoxycarbonyl group or an iso-propoxycarbonyloxy group which is hard to eliminate than when using a polymer having a tert-butoxycarbonyloxy group which is considered easily eliminatable by the action of an acid. This corroborates that the polymers represented by the formula [2] play substantially no part in chemical amplification reaction.

Comparative Example 1

A resist material of the following composition was prepared:

Poly(p-tert-butoxycarbonyloxystyrene/p-hydroxystyrene) [Mw=10,000; Mw/Mn=1.65; polymer of Preparation Example 11 6.0 g Biscyclohexylsulfonyldiazomethane 0.2 g Bis(p-toluenesulfonyl)diazomethane 0.1 g Propylene glycol monomethyl ether acetate 22.7 g Using the resist material of the above composition, a pattern was formed in the same manner as in Example 1. It was impossible to resolve 0.30 μm L/S pattern even at an exposure dose of 80 mJ/cm$^2$.

Comparative Examples 2–21

By way of comparison, photo-resist materials of the compositions shown in the following Tables 21–27 were prepared.

TABLE 21

| Comparative Example 2 | Poly(p-tetrahydropyranyloxystyrene/p-hydroxystyrene [Mw = 10,000; Mw/Mn = 1.60; polymer of Preparation Example 10] | 6.0 g |
|---|---|---|
| | Bis(1-methylethylsulfonyl)diazomethane | 0.2 g |
| | Bisbenzenesulfonyldiazomethane | 0.1 g |
| | Propylene glycol monomethyl ether acetate | 22.7 g |
| Comparative Example 3 | Poly(p-tert-butoxystyrene/p-hydroxystyrene) [Mw = 8,500; Mw/Mn = 1.65; polymer of Preparation Example 12] | 6.0 g |
| | Bis(1,1-dimethylethylsulfonyl)diazomethane | 0.2 g |
| | Benzoylcyclohexylsulfonyldiazomethane | 0.1 g |
| | Propylene glycol monomethyl ether acetate | 22.7 g |
| Comparative Example 4 | Poly(p-1-ethoxyethxystyrene/p-hydroxystyrene/p-tert-butoxycarbonyloxystyrene) [Mw = 20,000; Mw/Mn = 1.90; polymer of Preparation Example 6] | 6.0 g |
| | Biscyclohexylsulfonyldiazomethane | 0.2 g |
| | Bisbenzenesulfonyldiazomethane | 0.1 g |
| | Propylene glycol monomethyl ether acetate | 22.7 g |

TABLE 22

| | | |
|---|---|---|
| Comparative Example 5 | Poly(p-1-ethoxyethoxystyrne/p-hydroxystyrene) [Mw = 18,500; Mw/Mn = 1.88; polymer of Preparation of Example 8] | 6.0 g |
| | Biscyclohexylsulfonyldiazomethane | 0.2 g |
| | Bis(2,4-dimethylbenzenesulfonyl)-diazomethane | 0.1 g |
| | Propylne glycol monomethyl ether acetate | 22.7 g |
| Comparative Example 6 | Poly(p-1-ethoxyethoxystyrene/p-hydroxystyrene/styrene [Mw = 18,000; Mw/Mn = 1.85; polymer of Preparation Example 2] | 6.0 g |
| | Diphenyliodonium hexafluorophosphate [commerical product] | 0.3 g |
| | Diethylene glycol dimethyl ether | 22.7 g |
| Comparative Example 7 | Poly(p-1-ethoxyethoxystyrene/p-hydroxystyrene/p-methylstyrene [Mw = 18,000; Mw/Mn = 1.86; polymer of Preparation Exmaple 1] | 6.0 g |
| | Triphenylsulfonium trifluoromethane-sulfonate | 0.3 g |
| | Propylene glycol monomethyl ether acetate | 22.7 g |
| Comparative Example 8 | Poly(p-1-ethoxyethoxystyrene/p-hydroxystyrene/styrene {Mw = 18,000; Mw/Mn = 1.85; polymer of Preparation Example 2] | 6.0 g |
| | 1-Diazo-1-cyclohexylsulfonyl-3,3-dimethyl-2-butanone | 0.2 g |
| | Bis(p-chlorobenzenesulfonyl)diazomethane | 0.1 g |
| | Propylene glycol monomethyl ether acetate | 22.7 g |

TABLE 23

| | | |
|---|---|---|
| Comparative Example 9 | Poly(p-1-ethoxyethoxystyrene/p-hydroxystyrene) [Mw = 18,500; Mw/Mn = 1.88; polymer of Preparation Example 8] | 6.0 g |
| | Tris(trichloromethyl)-s-triazine | 1.1 g |
| | Triethanolamine | 0.1 g |
| | Propylene glycol monomethyl ether acetate | 22.8 g |
| Comparative Example 10 | Poly(p-tert-butyl vinylphenoxyacetate/p-hydroxystyrene) [Mw = 11,000; Mw/Mn = 1.65; polymer of Preparation Example 14] | 6.0 g |
| | Biscyclohexylsulfonyldiazomethane | 0.2 g |
| | Bis(p-toluenesulfonyl)diazomethane | 0.1 g |
| | Methyl 3-methoxypropionate | 24.7 g |
| Comparative Example 11 | Poly(p-1-ethoxyethoxystyrene/p-hydroxystyrene/p-tert-butoxystyrene) [Mw = 18,000; Mw/Mn = 1.90; polymer of Preparation Example 3] | 6.0 g |
| | Bis(1,1-dimethylethylsulfonyl)-diazomethane | 0.2 g |
| | Bis(p-toluenesulfonyl)diazomethane | 0.1 g |
| | Propylene glycol monomethyl ether acetate | 22.7 g |
| Comparative Example 12 | Poly(p-1-ethoxyethoxystyrene/p-hydroxystyrene/p-methylstyrene) [Mw = 18,000; Mw/Mn = 1.86; polymer of Preparation of Example 1] | 6.0 g |
| | Bis(1-methylethylsulfonyl)diazomethane | 0.2 g |
| | Bisbenzenesulfonyldiazomethane | 0.1 g |
| | Propylene glycol monomethyl ether acetate | 22.7 g |

TABLE 24

| | | |
|---|---|---|
| Comparative Example 13 | Poly(p-1-ethoxyethoxystyrene/p-hydroxystyrene/fumaronitrile) [Mw = 20,000; Mw/Mn = 1.85; polymer of Preparation Example 15] | 6.0 g |
| | Bis(1,1-dimethylethylsulfonyl)-diazomethane | 0.2 g |
| | 1-diazo-1-methylsulfonyl-4-phenylbutane-2-one | 0.1 g |
| | Propylene glycol monomethyl ether acetate | 22.7 g |
| Comparative Example 14 | Poly(p-1-ethoxyethoxystyrene/p-hydroxystyrene/p-tetrahydropiranyloxystyrene) [Mw = 16,000; Mw/Mn = 1.78; polymer of Preparation Example 5] | 6.0 g |
| | Biscyclohexylsulfonyldiazomethane | 0.2 g |
| | Bis(1-methylethylsulfonyl)diazomethane | 0.1 g |
| | Propylene glycol monomethyl ether acetate | 14.7 g |
| Comparative Example 15 | Poly(p-1-methoxyethoxystyrene/p-hydroxystyrene) [Mw = 18,000; Mw/Mn = 1.89; polymer of Preparation Example 9] | 6.0 g |
| | Biscyclohexylsulfonyldiazomethane | 0.2 g |
| | Bis(p-toluenesulfonyl)diazomethane | 0.1 g |
| | Propylene glycol monomethyl ether acetate | 22.7 g |

TABLE 25

| | | |
|---|---|---|
| Comparative Example 16 | Poly(p-1-methoxyethoxystyrene/p-hydroxystyrene/p-tert-butyl vinylphenoxyacetate) [Mw = 19,500; Mw/Mn = 1.88; polymer of Preparation Example 7] | 6.0 g |
| | 1-Acetyl-1-(1-methylethylsulfonyl)-diazomethane | 0.2 g |
| | Bis(p-toluenesulfonyl)diazomethane | 0.1 g |
| | Ethyl lactate | 24.7 g |
| Comparative Example 17 | Poly(p-tert-butoxycarbonyloxystyrene/p-hydroxystyrene) [Mw = 4,000; Mw/Mn = 1.60; polymer of Preparation of Example 13] | 6.0 g |
| | Biscyclohexylsulfonyldiazomethane | 0.2 g |
| | Bis(2,4-dimethylbenzenesulfonyl)-diazomethane | 0.1 g |
| | Propylene glycol monomethyl ether acetate | 22.7 g |
| Comparative Example 18 | Poly(p-1-ethoxyethoxystyrene/p-hydroxystyrene) [Mw = 18,500; Mw/Mn = 1.88; polymer of Preparation Example 8] | 4.5 g |
| | Poly (p-tert-butoxycarbonyloxystyrene/p-hydroxystyrene) [Mw = 19,000; Mw/Mn = 1.85; polymer of Preparation Example 20] | 1.5 g |
| | Biscyclohexylsulfonyldiazomethane | 0.3 g |
| | Bis(2,4-dimethylbenzenesulfonyl)-diazomethane | 0.1 g |
| | Propylene glycol monomethyl ether acetate | 24.6 g |

TABLE 26

| | | |
|---|---|---|
| Comparative Example 19 | Poly(p-1-ethoxyethoxystyrene/p-hydroxystyrene) [Mw = 9,500; Mw/Mn = 1.65; polymer of Preparation Example 21] | 4.5 g |
| | Poly(p-tert-butoxycarbonyloxystyrene/p-hydroxystyrene) [Mw = 19,000; Mw/Mn = 1.85; polymer of Preparation Example 20] | 1.5 g |
| | Biscyclohexylsulfonyldiazomethane | 0.3 g |
| | Bis(2,4-dimethylbenzenesulfonyl)-diazomethane | 0.1 g |
| | Propylene glycol monomethyl ether acetate | 24.6 g |
| Comparative Example 20 | Poly(p-1-ethoxyethoxystyrene/p-hydroxystyrene) [Mw = 9,500; Mw/Mn = 1.65; polymer of Preparation Example 21: | 4.5 g |
| | Poly(p-tert-butoxycarbonyloxystyrene/p-hydroxystyrene) [Mw = 10,000; Mw/Mn = 1.65; polymer of Preparation Example 11] | 1.5 g |
| | Biscyclohexylsulfonyldiazomethane | 0.3 g |
| | Bis(2,4-dimethylbenzenesulfonyl)-diazomethane | 0.1 g |
| | Propylene glycol monomethyl ether acetate | 24.6 g |

TABLE 27

| | | |
|---|---|---|
| Comparative Example 21 | Poly(p-1-ethoxyethoxystyene/p-hydroxystyene) [Mw = 1,850; Mw/Mn = 1.88; polymer of Preparation Example 8] | 2.0 g |
| | Poly(p-tert-utoxycarbonyloxystyrene/p-hydroxystyrene) [Mw 10,000; Mw/Mn = 1.65; polymer or Preparation Example 11] | 4.0 g |
| | Biscyclohexylsulfonyldiazomethane | 0.3 g |
| | Bis(2,4-dimethylbenzenesulfonyl)-diazomethane | 0.1 g |
| | Popylene glycol monomethyl ether acetate | 24.6 g |

Using the resist materials of the above compositions, patterns were formed in the same way as in Example 1. Results are shown in Table 28.

TABLE 28

| Comparative Example | Exposure dose (mJ/cm$^2$) | Resolution 0.30 μm L/S | Resolution 0.24 μm L/S | Resist film heat resistance |
|---|---|---|---|---|
| 2 | 65 | Unable to resolve | — | — |
| 3 | 65 | " | — | — |
| 4 | 50 | Unsatisfactory pattern form | — | — |
| 5 | 40 | Defective form | Unable to resolve | Bad |
| 6 | 50 | " | " | Bad |
| 7 | 50 | " | " | Bad |
| 8 | 50 | " | " | Bad |
| 9 | 50 | " | " | Bad |
| 10 | 65 | Unable to resolve | — | — |
| 11 | 50 | Unsatisfactory pattern form | — | — |
| 12 | 40 | Defective form | Unable to resolve | Bad |
| 13 | 50 | Unsatisfactory pattern form | — | — |
| 14 | 50 | Unsatisfactory pattern form | — | — |
| 15 | 40 | Defective form | Unable to resolve | Bad |
| 16 | 50 | Unsatisfactory pattern form | — | — |
| 17 | 65 | Unable to resolve | — | — |
| 18 | 34 | Defective form | Unsatisfactory pattern form | Good |
| 19 | 44 | " | Unale to resolve | Bad |
| 20 | 32 | " | " | Bad |
| 21 | 50 | Unsatisfactoy pattern form | — | Good |

Figure 3:
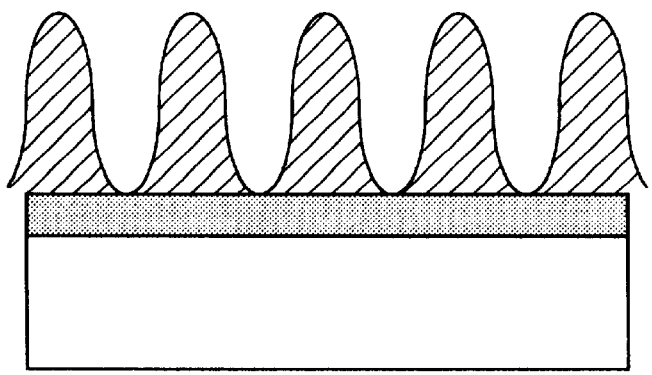
FIG. 3 is a sectional illustration of a defective 0.30 µm L/S pattern form observed in Comparative Examples 4, 11, 13–14, 16 and 21.
Figure 4:
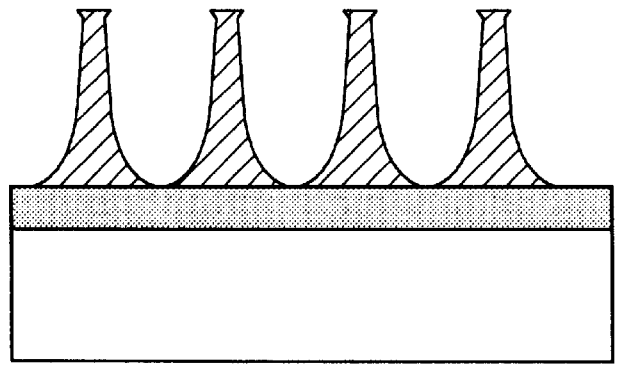
FIG. 4 is a sectional illustration of a defective 0.30 µm L/S pattern form observed in Comparative Examples 6–7 and 9.
Figure 5:
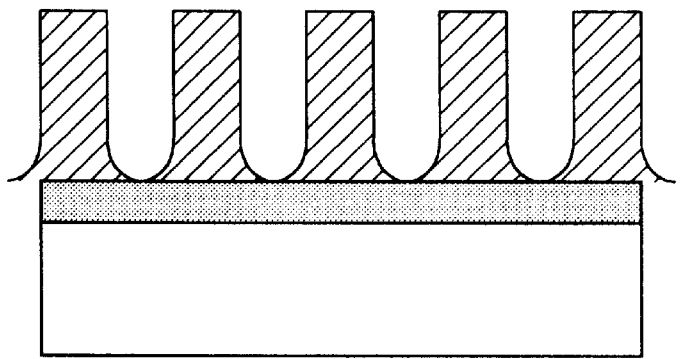
FIG. 5 is a sectional illustration of a defective 0.30 µm L/S pattern form observed in Comparative Examples 5, 8, 12, 15, 18 and 20.
Figure 6:
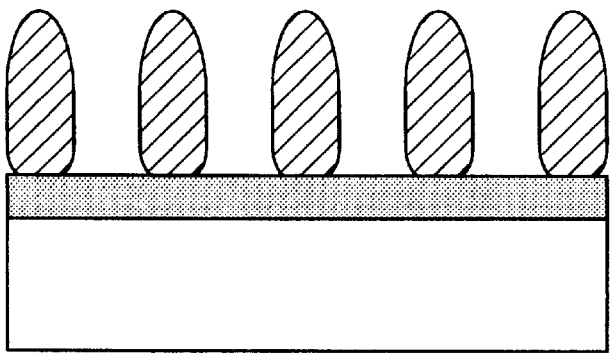
FIG. 6 is a sectional illustration of a co pattern form with unsatisfactory heat resistance after 150-second baking and development observed in Comparative Examples 5, 8, 12 and 15.

The unresolvable 30 μm L/S pattern form in Comparative Examples 1, 2, 3, 10 and 17 is shown in FIG. 2, the pattern form (defective 0.30 μm pattern form) in Comparative Examples 14, 16 and 21 is shown in FIG. 3, the pattern form (defective 0.30 μm pattern form) in Comparative Examples 6, 7 and 9 is shown in FIG. 4, the pattern form (defective 0.30 μm pattern form) in Comparative Examples 5, 8, 12, 15, 18, 19 and 20 is shown in FIG. 5, and the pattern form with unsatisfactory heat resistance in Comparative Examples 5, 8, 12 and 15 is shown in FIG. 6.

As is apparent from Table 28 and FIGS. 2–5, any of the resist materials of these Comparative Examples is inferior to the resist material of the present invention in resolution. Also, as is seen from FIG. 6, these resist materials are poor in heat resistance although capable of resolving 0.30 μm L/S. Further, as is apparent from Example 10 and Comparative Examples 18–21, it is the essential conditions for achieving the purpose of the present invention that the weight-average molecular weight (Mw) of the polymer of the formula [2] should be smaller than that of the polymer of he formula [1], and that even in case Mw of the polymer of the formula [2] is smaller than that of the polymer of the formula [1], the amount of the polymer of the formula [2] should be less than that of the polymer of the formula [1].

Comparative Example 22

A resist material of the following composition was prepared:

| | |
|---|---|
| Poly(p-1-methoxyethoxystyrene/p-hydroxystyrene) [Mw = 18,000; Mw/Mn = 1.89; polymer of Preparation Example 9] | 1.5 g |
| Poly(p-1-ethoxyethoxystyrene/p-hydroxystyrene/p-tert-butoxystyrene) [Mw = 9,200; Mw/Mn] = 1.30; polymer of Preparation Example 22] | 4.5 g |
| Biscyclohexylsulfonyldiazomethane | 0.3 g |
| Bis(p-toluenesulfonyl)diazomethane | 0.1 g |
| N,N-dimethylacetamide | 0.3 g |
| Propylene glycol monomethyl ether acetate | 24.3 g |

Using the resist material of the above composition, a pattern was formed in the same manner as in Example 1. Although 0.24 μm L/S pattern could be resolved at an exposure dose of 32 mJ/cm$^2$, the pattern form was defective as shown in FIG. 4. When heat treatment was conducted after the lapse of 4 hours from exposure, there took place a dimensional change to 0.35 μm.

From the results of Example 28 and Comparative Example 22, it is obvious that use of a smaller amount of the polymer of the formula [2] than the polymer of the formula [1] is one of the conditions for achieving the purpose the present invention.

As is apparent from the foregoing description, when the resist material produced by using the polymer composition of the present invention as polymer component is used as resist material for exposure with a light source of less than 300 nm such as deep ultraviolet light or KrF excimer laser beams on a Ti$_3$N$_4$ substrate, there can be obtained a practical fine pattern of quater-micron order which has a good shape, shows an extremely high resolution as compared with the conventional resist materials, exhibits good mask linearity and is capable of maintaining stabilized pattern dimensions through the period from exposure till heat treatment (postbaking) with a large allowance for the depth of focus. It has also been confirmed that the resist material according to the present invention shows excellent performance when used on other substrates as well and involves no problem of substrate dependency which has been seen in use of the conventional resist materials. Therefore, the present invention is of great utility in forming ultrafine patterns in the semiconductor devices.

The resist material according to the present invention is particularly useful for pattern formation making use of deep ultraviolet light or KrF excimer laser beams, but it can as well be applied to pattern formation utilizing i-line light, electron beams, soft X-rays or the like.

What is claimed is:

1. A polymer composition comprising
   (i) a polymer (a) containing as its structural constituent a monomer unit having a functional group A which becomes alkali-soluble by heating in the presence of an acid, and
   (ii) a polymer (b) containing as its structural constituent a monomer unit having a functional group B which becomes alkali-soluble, but less easily than the functional group A, by heating in the presence of an acid; said polymer (a) and said polymer (b) having a degree of dispersion (Mw/Mn) of 1.0 to 2.0.

2. A polymer composition according to claim 1, wherein each of the polymer (a) and the polymer (b) contains as its structural constituent an additional monomer unit which is able to impart heat resistance and adhesiveness to a substrate.

3. A polymer composition according to claim 2, wherein at least one of the polymer (a) and the polymer (b) contains as its structural constituent a third monomer unit.

4. A polymer composition according to claim 1, wherein the monomer unit having the functional group A is represented by the formula:

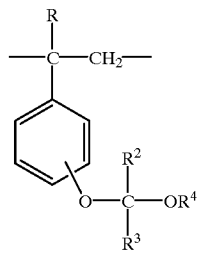

[4]

wherein R is a hydrogen atom or a lower alkyl group; $R^2$ and $R^3$ are independently a hydrogen atom, an alkyl group which may be substituted with one or more halogen atoms, or an allyl group, or $R^2$ and $R^3$ can form an alkylene ring together with the interposing carbon atom, provided that $R^2$ and $R^3$ cannot be hydrogen atoms at the same time; $R^4$ is an alkyl group which may be substituted with one or more halogen atoms or an aralkyl group.

5. A polymer composition according to claim 1, wherein the monomer unit having the functional group B is represented by the formula:

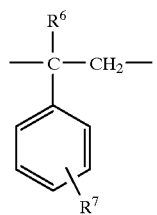

[7]

wherein $R^6$ is a hydrogen atom or a lower alkyl group; $R^7$ is a hydrogen atom, a lower alkyl group, a lower alkoxy group, an acyloxy group, a saturated heterocyclic oxy group, or $R^8O$—CO—$(CH_2)_z$—O—; $R^8$ is an alkyl group; and z is 0 or an integer of 1 or more.

6. A polymer composition according to claim 1, wherein the polymer (b) has a smaller weight-average molecular weight than that of the polymer (a).

7. A polymer composition according to claim 2, wherein the additional monomer is represented by the formula:

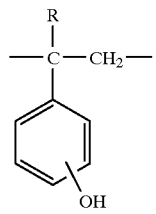

[5]

wherein R is a hydrogen atom or a lower alkyl group.

8. A polymer composition according to claim 2 or 3, wherein the polymer (a) has repeating units of the formula:

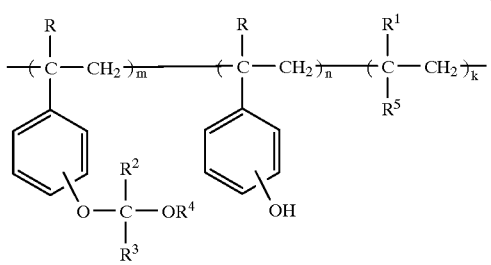

[1]

wherein R is a hydrogen atom or a lower alkyl group; $R^2$ and $R^3$ are independently a hydrogen atom, an alkyl group which may be substituted with one or more halogen atoms, or an allyl group, or $R^2$ and $R^3$ can form an alkylene ring together with the interposing carbon atom, provided that $R^2$ and $R^3$ cannot be hydrogen atoms at the same time; $R^4$ is an alkyl group which may be substituted with one or more halogen atoms or an aralkyl group; $R^1$ is a hydrogen atom or a lower alkyl group; $R^5$ is a cyano group, a carboxyl group which may be esterified, or a phenyl group which may have one or more substituents; m and n are independently an integer of 1 or more; and k is zero or an integer of 1 or more, and m>k, and the polymer (b) has repeating units of the formula:

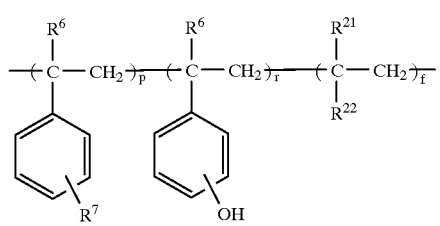

[2]

wherein $R^6$ is a hydrogen atom or a lower alkyl group; $R^7$ is a hydrogen atom, a lower alkyl group, a lower alkoxy group, an acyloxy group, a saturated heterocyclic oxy group, or $R^8O$—CO—$(CH_2)_z$—O—; $R^8$ is an alkyl group; Z is 0 or an integer of 1 or more; $R^{21}$ is a hydrogen atom or a lower alkyl group; $R^{22}$ is a cyano group, a carboxyl group which may be esterified, or a phenyl group which may have one or more substituents; p and r are independently an integer of 1 or more; and f is zero or an integer of 1 or more, and p>f.

9. A polymer composition according to claim 8, wherein the polymer (a) has a weight-average molecular weight of 5,000 to 50,000 and the polymer (b) has a weight-average molecular weight of 1,000 to 25,000.

10. A polymer composition according to claim 8, wherein m, n, k, p, r and f are in the ranges as defined below:

$0.1 \leq (m+k)/(m+n+k) \leq 0.9$, $0 \leq k/(m+n+k) \leq 0.25$, and $m > k$, and $0.1 \leq p/(p+r+f) \leq 0.5$, $0 \leq f/(p+r+f) \leq 0.20$ and $p > f$.

11. A polymer composition comprising
   (i) a polymer (a) containing as its structural constituent a monomer unit having a functional group A which becomes alkali-soluble by heating in the presence of an acid,
   (ii) a polymer (b) containing as its structural constituent a monomer unit having a functional group B which becomes alkali-soluble, but less easily than the functional group A, by heating in the presence of an acid, and
   (iii) a phenolic compound having a weight-average molecular weight of 300 to 15,000;
      said polymer (a) and said polymer (b) having a degree of dispersion (Mw/Mn) of 1.0 to 2.0.

12. A polymer composition according to claim 11, wherein each of the polymer (a) and the polymer (b) contains as its structural constutuent an additional monomer unit, which is able to impart heat resistance and adhesiveness to a substrate.

13. A polymer composition according to claim 12, wherein at least one of the polymer (a) and the polymer (b) contains as its structural constituent a third monomer unit.

14. A polymer composition according to claim 11, wherein the monomer unit having the functional group A is represented by the formula:

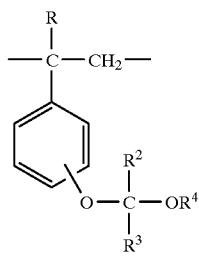

[4]

wherein R is a hydrogen atom or a lower alkyl group; $R^2$ and $R^3$ are independently a hydrogen atom, an alkyl group which may be substituted with one or more halogen atoms, or an allyl group, or $R^2$ and $R^3$ can form an alkylene ring together with the interposing carbon atom, provided that $R^2$ and $R^3$ cannot be hydrogen atoms at the same time; $R^4$ is an alkyl group which may be substituted with one or more halogen atoms or an aralkyl group.

15. A polymer composition according to claim 11, wherein the monomer unit having the functional group B is represented by the formula:

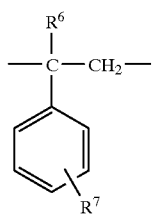

[7]

wherein $R^6$ is a hydrogen atom or a lower alkyl group; $R^7$ is a hydrogen atom, a lower alkyl group, a lower alkoxy group, an acyloxy group, a saturated heterocyclic oxy group, or $R^8O$—CO—$(CH_2)_z$—O—; $R^8$ is an alkyl group; and z is 0 or an integer of 1 or more.

16. A polymer composition according to claim 11, wherein the polymer (b) has a smaller weight average molecular weight than that of the polymer (a).

17. A polymer composition according to claim 12, wherein the additional monomer unit is represented by the formula:

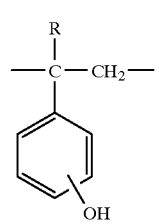

[5]

wherein R is a hydrogen atom or a lower alkyl group.

18. A polymer composition according to claim 12, or 13, wherein the polymer (a) has repeating units of the formula:

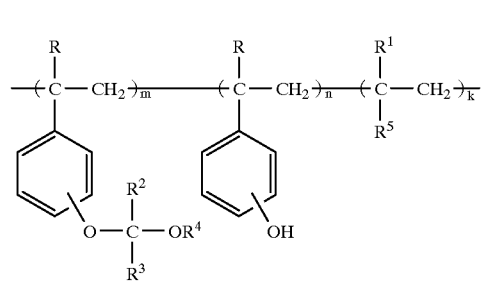

[1]

wherein R is a hydrogen atom or a lower alkyl group; $R^2$ and $R^3$ are independently a hydrogen atom, an alkyl group which may be substituted with one or more halogen atoms, or an allyl group, or $R^2$ and $R^3$ can form an alkylene ring together with the interposing carbon atom, provided that $R^2$ and $R^3$ cannot be hydrogen atoms at the same time; $R^4$ is an alkyl group which may be substituted with one or more halogen atoms or an alkyl group; $R^1$ is a hydrogen atom or a lower alkyl group; $R^5$ is a cyano group, a carboxyl group which may be esterified, or a phenyl group which may have one or more substituents; m and n are independently an integer of 1 or more; and k is zero or an integer of 1 or more, and $m > k$, and the polymer (b) has repeating units of the formula:

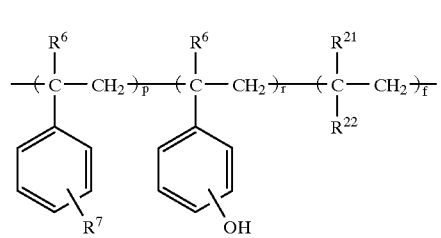

[2]

wherein $R^6$ is a hydrogen atom or a lower alkyl group; $R^7$ is a hydrogen atom, a lower alkyl group, a lower alkoxy group, an acyloxy group, a saturated heterocyclic oxy group, or $R^8O$—CO—$(CH_2)_z$—O—; $R^8$ is an alkyl group; z is 0 or an integer of 1 or more; $R^{21}$ is a hydrogen atom or a lower alkyl group; $R^{22}$ is a cyano group, a carboxyl group which may be esterified, or a phenyl group which may have one or more substituents; p and r are independently an integer of 1 or more; and f is zero or an integer of 1 or more, and $p > f$.

19. A polymer composition according to claim 18, wherein the polymer (a) has a weight-average molecular weight of 5,000 to 50,000 and the polymer (b) has a weight-average molecular weight of 1,000 to 25,000.

20. A polymer composition according to claim 18, wherein m, n, k, p, r, and f are in the ranges as defined below: $0.1 \leq (m+k)/(m+n+k) \leq 0.9$, $0 \leq k/(m+n+k) \leq 0.25$, and $m>k$, $0.1 \leq p/(p+r+f) \leq 0.5$, $0 \leq f/(p+r+f) \leq 0.20$ and $p>f$.

21. A polymer composition according to claim 8, which further comprises a substance which generates an acid when exposed to actinic radiation, and if necessary a ultraviolet absorbent.

22. A polymer composition according to claim 18, which further comprises a substance which generates an acid when exposed to actinic radiation, and if necessary a ultraviolet absorbent.

23. A resist material comprising the polymer composition of claim 21.

24. A resist material comprising the polymer composition of claim 22.

25. A process for forming a pattern which comprises
coating the resist material of claim 23 on a semiconductor substrate,
heating the resist material,
exposing the resist material to actinic radiation via a mask, if necessary, followed by heating, and
developing the resulting resist material.

26. A process for forming a pattern which comprises
coating the resist material of claim 24 on a semiconductor substrate,
heating the resist material,
exposing the resist material to actinic radiation via a mask, if necessary, followed by heating, and
developing the resulting resist material.

27. A process for forming a pattern which comprises
coating the resist material of claim 25 on a semiconductor substrate,
heating the resist material,
exposing the resist material to actinic radiation via a mask, if necessary, followed by heating, and
developing the resulting resist material.

28. A polymer composition according to claim 21, wherein the polymer (a) has repeating units of the formula:

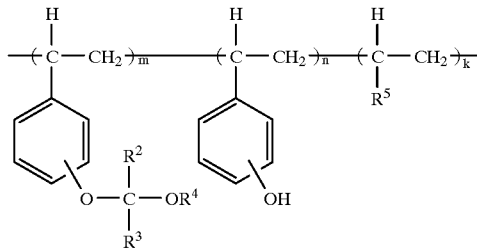

wherein $R^2$ and $R^3$ are independently a hydrogen atom, a straight or branched alkyl group having 1 to 4 carbon atoms, provided that $R^2$ and $R^3$ cannot be hydrogen atoms at the same time; $R^4$ is a straight or branched alkyl group having 1 to 4 carbon atoms; $R^5$ is a unsubstituted or substituted phenyl group; m, n and k are independently an integer of 1 or more; and $m>k$, and the polymer (b) has repeating units of the formula:

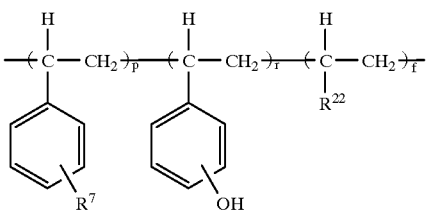

wherein $R^7$ is a hydrogen atom, a straight or branched alkyl group having 1 to 4 carbon atoms, or a group of the formula: $R^8$—OCO(CH$_2$)$_z$O—; $R^8$ is a straight or branched alkyl group having 1 to 4 carbon atoms; z is zero or an integer of 1; $R^{22}$ is an unsubstituted or substituted phenyl group; p, r and f are independently an integer of 1 or more, and $p>f$.

29. A polymer composition according to claim 22, wherein the polymer (a) has repeating units of the formula:

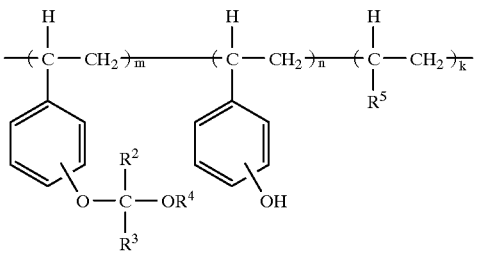

wherein $R^2$ and $R^3$ are independently a hydrogen atom, a straight or branched alkyl group having 1 to 4 carbon atoms, provided that $R^2$ and $R^3$ cannot be hydrogen atoms at the same time; $R^4$ is a straight or branched alkyl group having 1 to 4 carbon atoms; $R^5$ is a unsubstituted or substituted phenyl group; m, n and k are independently an integer of 1 or more, and $m>k$, and the polymer (b) has repeating units of the formula:

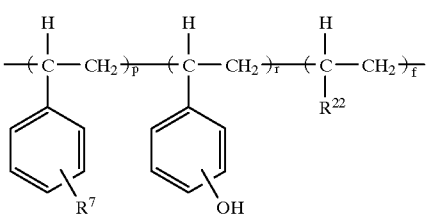

wherein $R^7$ is a hydrogen atom, a straight or branched alkyl group having 1 to 4 carbon atoms, or a group of the formula: $R^8$—OCO(CH$_2$)$_z$O—; $R^8$ is a straight or branched alkyl group having 1 to 4 carbon atoms; z is zero or an integer of 1; $R^{22}$ is an unsubstituted or substituted phenyl group; p, r, and f are independently an integer of 1 or more, and $p>f$.

30. A polymer composition according to claim 8, wherein the polymer (1) has a weight-average molecular weight about 10% or more greater than that of the polymer (2).

31. A polymer composition according to claim 30, wherein the polymer (1) has a weight-average molecular weight of 5,000 to 50,000 and the polymer (2) has a weight-average molecular weight of 1,000 to 25,000.

* * * * *